(12) United States Patent
Tanaka et al.

(10) Patent No.: US 8,821,963 B2
(45) Date of Patent: Sep. 2, 2014

(54) DEPOSITION METHOD AND METHOD FOR MANUFACTURING LIGHT-EMITTING DEVICE

(75) Inventors: Koichiro Tanaka, Kanagawa (JP); Takahiro Ibe, Kanagawa (JP); Kohei Yokoyama, Kanagawa (JP); Hisao Ikeda, Kanagawa (JP); Norifumi Takesue, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 759 days.

(21) Appl. No.: 12/362,105

(22) Filed: Jan. 29, 2009

(65) Prior Publication Data

US 2009/0197017 A1    Aug. 6, 2009

(30) Foreign Application Priority Data

Feb. 4, 2008 (JP) ................................ 2008-024606

(51) Int. Cl.
| | | |
|---|---|---|
| H01L 51/00 | (2006.01) | |
| B41M 5/382 | (2006.01) | |
| B41M 5/40 | (2006.01) | |
| B05D 5/12 | (2006.01) | |

(52) U.S. Cl.
CPC .............. *H01L 51/0013* (2013.01); *B05D 5/12* (2013.01); *B41M 5/38214* (2013.01)
USPC .......... 427/66; 427/555; 427/407.1; 430/200; 428/32.6

(58) Field of Classification Search
USPC .............. 427/553, 554, 596, 64, 66, 108, 109
See application file for complete search history.

(56) References Cited

U.S. PATENT DOCUMENTS

| | | | |
|---|---|---|---|
| 5,851,709 A * | 12/1998 | Grande et al. ................. 430/7 |
| 5,937,272 A | 8/1999 | Tang | |
| 6,165,543 A | 12/2000 | Otsuki et al. | |
| 6,283,060 B1 | 9/2001 | Yamazaki et al. | |
| 6,566,032 B1 | 5/2003 | Boroson et al. | |
| 6,610,455 B1 | 8/2003 | Burberry et al. | |
| 6,677,971 B2 | 1/2004 | Sasaki | |
| 6,689,492 B1 | 2/2004 | Yamazaki et al. | |
| 6,695,029 B2 | 2/2004 | Phillips et al. | |
| 6,703,179 B2 | 3/2004 | Tyan | |
| 6,776,847 B2 | 8/2004 | Yamazaki et al. | |
| 6,811,938 B2 | 11/2004 | Tutt et al. | |
| 6,873,347 B2 | 3/2005 | Sasaki | |
| 7,316,983 B2 | 1/2008 | Yamazaki et al. | |
| 7,485,337 B2 * | 2/2009 | Nguyen et al. ................. 427/66 |
| 7,553,602 B2 | 6/2009 | Matsuda et al. | |
| 7,674,749 B2 | 3/2010 | Kang et al. | |
| 8,080,811 B2 | 12/2011 | Yokoyama et al. | |
| 2002/0197401 A1 * | 12/2002 | Auyeung et al. ........... 427/248.1 |
| 2004/0065902 A1 | 4/2004 | Yamazaki et al. | |
| 2004/0191564 A1 | 9/2004 | Kim et al. | |
| 2005/0005848 A1 | 1/2005 | Yamazaki et al. | |
| 2005/0145326 A1 | 7/2005 | Hatwar | |
| 2006/0243377 A1 | 11/2006 | Matsuo et al. | |
| 2006/0246240 A1 * | 11/2006 | Matsuda et al. ........... 428/32.39 |
| 2008/0050851 A1 | 2/2008 | Tanaka et al. | |
| 2008/0050895 A1 | 2/2008 | Miyairi et al. | |
| 2008/0057632 A1 | 3/2008 | Arai et al. | |
| 2008/0081115 A1 | 4/2008 | Yamazaki et al. | |
| 2008/0113292 A1 | 5/2008 | Matsuo | |
| 2008/0124850 A1 | 5/2008 | Takayama et al. | |
| 2008/0182349 A1 | 7/2008 | Yamazaki et al. | |
| 2008/0227232 A1 | 9/2008 | Yamazaki et al. | |
| 2008/0299496 A1 | 12/2008 | Hirakata et al. | |
| 2009/0075214 A1 * | 3/2009 | Hirakata et al. ............... 430/319 |
| 2009/0104403 A1 | 4/2009 | Aoyama et al. | |
| 2009/0104721 A1 | 4/2009 | Hirakata et al. | |
| 2009/0104835 A1 | 4/2009 | Aoyama et al. | |
| 2009/0142510 A1 | 6/2009 | Takahashi et al. | |
| 2009/0169809 A1 | 7/2009 | Yokoyama et al. | |

(Continued)

FOREIGN PATENT DOCUMENTS

| | | |
|---|---|---|
| EP | 0 883 190 A2 | 12/1998 |
| EP | 0 913 870 A2 | 5/1999 |

(Continued)

OTHER PUBLICATIONS

Davies et al. "Picosecond high-repetition-rate pulsed laser ablation of dielectrics: the effect of energy accumulation between pulses". Optical Engineering vol. 44 No. 5, pp. 051102-1-051102-8. May 2005.*

(Continued)

*Primary Examiner* — Dah-Wei D Yuan
*Assistant Examiner* — Jose Hernandez-Diaz
(74) *Attorney, Agent, or Firm* — Husch Blackwell LLP

(57) ABSTRACT

A first substrate which includes a reflective layer having an opening, a light-absorbing layer, and a material layer formed in contact with the light-absorbing layer over one of surfaces is provided; the surface of the first substrate over which the material layer is formed and a deposition target surface of the second substrate are disposed to face each other; and irradiation with laser light whose repetition rate is greater than or equal to 10 MHz and pulse width is greater than or equal to 100 fs and less than or equal to 10 ns is performed from the other surface side of the first substrate to selectively heat a part of the material layer at a position overlapping with the opening of the reflective layer and deposit the part of the material layer over the deposition target surface of the second substrate.

45 Claims, 34 Drawing Sheets

(56) References Cited

U.S. PATENT DOCUMENTS

| | | |
|---|---|---|
| 2009/0220706 A1 | 9/2009 | Yamazaki et al. |
| 2009/0221107 A1 | 9/2009 | Yamazaki et al. |
| 2009/0233006 A1 | 9/2009 | Yamazaki et al. |
| 2009/0258167 A1 | 10/2009 | Tanaka |

FOREIGN PATENT DOCUMENTS

| | | |
|---|---|---|
| EP | 1 176 642 A2 | 1/2002 |
| EP | 1 335 637 A1 | 8/2003 |
| EP | 1 650 046 A1 | 4/2006 |
| EP | 1 787 822 A2 | 5/2007 |
| JP | 61-054983 A | 3/1986 |
| JP | 7-89235 | 4/1995 |
| JP | 11-54275 | 2/1999 |
| JP | 11-237504 | 8/1999 |
| JP | 2000-256877 | 9/2000 |
| JP | 2002-211018 | 7/2002 |
| JP | 2002-359075 | 12/2002 |
| JP | 2004-34552 | 2/2004 |
| JP | 2004-103406 | 4/2004 |
| JP | 2006-123546 | 5/2006 |
| JP | 2006-228649 | 8/2006 |
| JP | 2006-309995 | 11/2006 |
| JP | 2007-141702 | 6/2007 |
| JP | 2007-173145 | 7/2007 |
| JP | 2008-500698 | 1/2008 |
| JP | 2008-66147 | 3/2008 |
| WO | WO 2005/119804 A2 | 12/2005 |

OTHER PUBLICATIONS

Tolbert et al. ("Laser Ablation Transfer Imaging Using Picosecond Optical Pulses: Ultra-high Speed, Lower Threshold and High Resolution"). Journal of Imaging Science and Technology, vol. 37, No. 5 1993.*

Urabe, T. et al, "13.1: Invited Paper: Technological Evolution for Large Screen Size Active Matrix OLED Display," SID '07 Digest: SID International Symposium Digest of Technical Papers, vol. 38, 2007, pp. 161-164.

International Search Report re application No. PCT/JP2009/051520, dated Apr. 28, 2009.

Written Opinion re application No. PCT/JP2009/051520, dated Apr. 28, 2009.

* cited by examiner laser scanning direction laser scanning direction laser scanning direction laser scanning direction

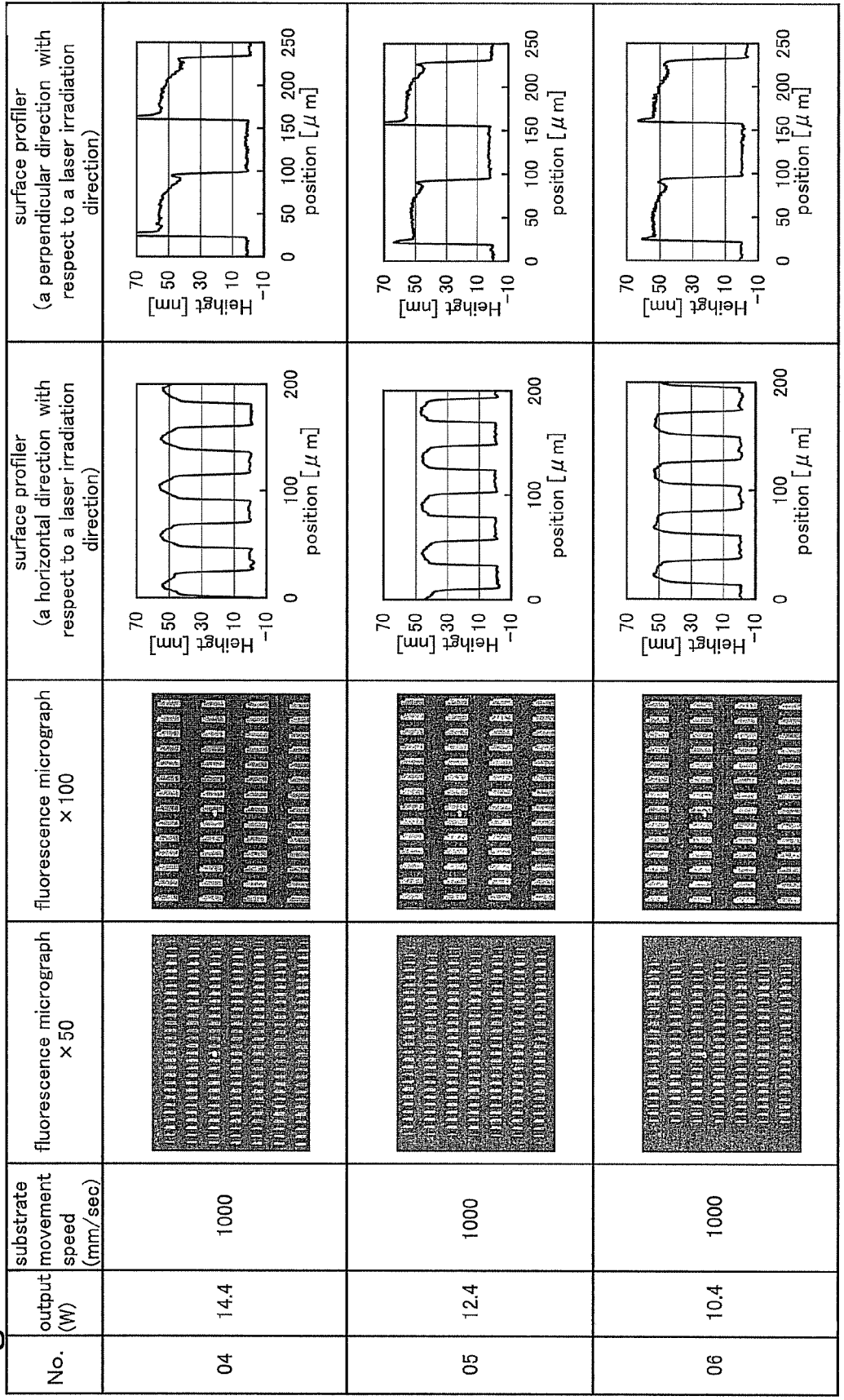

Fig. 20

| No. | output (W) | substrate movement speed (mm/sec.) | fluorescence micrograph ×50 | fluorescence micrograph ×100 | surface profiler (a horizontal direction with respect to a laser irradiation direction) | surface profiler (a perpendicular direction with respect to a laser irradiation direction) |
|---|---|---|---|---|---|---|
| 11 | 8.4 | 500 | | | | |
| 12 | 6.4 | 500 | | | | |
| 15 | 6.4 | 200 | | | | |

Fig. 28
| No. | output (W) | substrate movement speed (mm/sec) | irradiation time (μ sec) | fluorescence micrograph ×50 | surface profiler (a horizontal direction with respect to a laser irradiation direction) | surface profiler (a perpendicular direction with respect to a laser irradiation direction) |
|---|---|---|---|---|---|---|
| 1 | 10 | 100 | 100~200 | 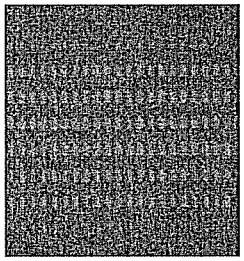 | – | – |
| 2 | 10 | 50 | 200~400 μ sec | 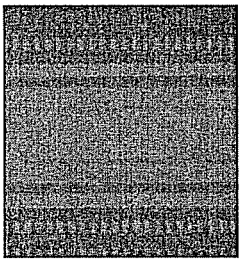 | – | – |
| 3 | 10 | 500 | 20~40 μ sec | – | – | – |
| 4 | 5 | 50 | 200~400 μ sec | – | – | – |
| 5 | 8 | 50 | 200~400 μ sec | 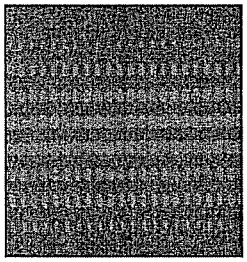 | – | – |

Fig. 29
| No. | output (W) | substrate movement speed (mm/sec) | irradiation time (μsec) | fluorescence micrograph ×50 | surface profiler (a horizontal direction with respect to a laser irradiation direction) | surface profiler (a perpendicular direction with respect to a laser irradiation direction) |
|---|---|---|---|---|---|---|
| 6 | 8 | 10 | 1000~2000 μsec | 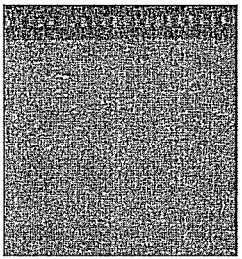 | — | — |
| 7 | 5 | 10 | 1000~2000 μsec | 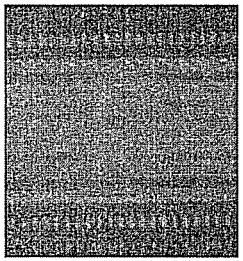 | — | — |
| 8 | 3 | 10 | 1000~2000 μsec | — | — | — |
| 9 | 1 | 10 | 1000~2000 μsec | — | — | — |
| 10 | 4 | 10 | 1000~2000 μsec | 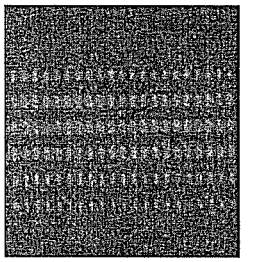 | 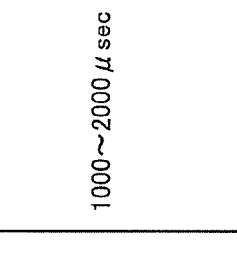 | 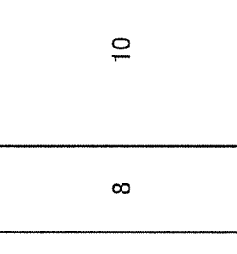 |
| 11 | 3 | 25 | 400~800 μsec | — | — | — |
| 12 | 2 | 10 | 1000~2000 μsec | — | — | — |

DEPOSITION METHOD AND METHOD FOR MANUFACTURING LIGHT-EMITTING DEVICE

TECHNICAL FIELD

The present invention relates to a deposition method and a method for manufacturing a light-emitting device using the deposition method.

BACKGROUND ART

A light-emitting element using an organic compound as a luminous body, which has features such as thinness, lightness, high-speed response, and DC drive at low voltage, is expected to be applied to a next-generation flat panel display. In particular, a display device in which light-emitting elements are arranged in matrix is considered to have advantages in a wide viewing angle and excellent visibility over a conventional liquid crystal display device.

It is said that, as for a light-emitting mechanism of a light-emitting element, an EL layer is interposed between a pair of electrodes and voltage is applied to the EL layer, so that electrons injected from a cathode and holes injected from an anode are recombined in an emission center of the EL layer to form molecular excitons, and the molecular excitons release energy when returning to a ground state; thus, light is emitted. Singlet excitation and triplet excitation are known as excitation states, and it is considered that light can be emitted through either of the two excitation states.

An EL layer included in a light-emitting element includes at least a light-emitting layer. In addition, the EL layer can have a stacked-layer structure including a hole-injecting layer, a hole-transporting layer, an electron-transporting layer, an electron-injecting layer, and/or the like, in addition to the light-emitting layer.

EL materials for forming an EL layer are broadly classified into a low molecular (monomer) material and a high molecular (polymer) material. In general, a low molecular material is often deposited by an evaporation method and a high molecular material is often deposited by an inkjet method or the like.

An evaporation apparatus which is used for an evaporation method has a substrate holder to which a substrate is mounted; a crucible (or an evaporation boat) containing an EL material, that is, an evaporation material; a heater for heating the EL material in the crucible; and a shutter for preventing the EL material from being scattered during sublimation. The EL material which is heated by the heater is sublimed and deposited onto the substrate.

DISCLOSURE OF INVENTION

Note that in order to deposit a film uniformly, actually, a deposition target substrate needs to be rotated and the substrate and the crucible need to be separated from each other by at least a certain distance. In addition, when films of different colors are separately formed using a plurality of EL materials through a mask such as a metal mask, it is necessary that the distance between pixels be designed to be large and that the width of a partition wall (a bank) formed using an insulator provided between the pixels be large. Such demands are major objects in promoting improvement in definition (increase in the number of pixels) of a light-emitting device including a light-emitting element and miniaturization of display pixel pitches along with reduction in size of the light-emitting device including a light-emitting element.

Therefore, as for flat panel displays, in order to achieve improvement in definition and increase in reliability, increase in productivity and reduction in cost are required as well as achievement of those objects.

Thus, a method for forming an EL layer of a light-emitting element through laser thermal transfer has been proposed (see Patent Document 1: Japanese Published Patent Application No. 2006-309995). Patent Document 1 discloses a transfer substrate which has a photothermal conversion layer including a low-reflective layer and a high-reflective layer and a transfer layer over a supporting substrate. Irradiation of such a transfer substrate with laser light allows the transfer layer to be transferred to an element-forming substrate.

However, the high-reflective layer and the low-reflective layer of the transfer substrate of Patent Document 1 are stacked on one side of the substrate. Therefore, even with the use of the high-reflective layer, a certain degree of heat absorption is conceivable. Thus, when the energy power of laser light is large, not only a portion of the transfer layer over the low-reflective layer but also a portion of the transfer layer over the high-reflective layer might be transferred.

Further, in the structure illustrated in FIG. 3 of Patent Document 1, as described in [0041], a gap should not be generated between the low-reflective layer and the high-reflective layer, and thus high-accuracy patterning is needed.

Further, in the structure illustrated in FIG. 7 of Patent Document 1, the low-reflective layer is patterned, the high-reflective layer is then formed over the entire surface, and the transfer layer is then formed. In this structure, heat from the low-reflective layer which is heated by absorption of laser light is transferred to the transfer layer through the high-reflective layer. Thus, not only a desired portion of the transfer layer but also the transfer layer around the desired portion might be transferred.

Thus, it is an object of the present invention to enable deposition of only a material in a desired region and to enable formation of a minute pattern.

It is another object of the present invention to reduce manufacturing cost by increase in material use efficiency.

It is another object of the present invention to improve productivity by reduction in time taken for deposition.

One feature of the present invention is a deposition method including steps of providing a first substrate which includes, over one of surfaces, a reflective layer having an opening, a light-absorbing layer, and a material layer formed in contact with the light-absorbing layer; disposing the surface of the first substrate over which the material layer is formed and a deposition target surface of a second substrate to face each other; and performing irradiation with laser light whose repetition rate is greater than or equal to 10 MHz and pulse width is greater than or equal to 100 fs and less than or equal to 10 ns from the other surface side of the first substrate to selectively heat a part of the material layer at a position overlapping with at least the opening of the reflective layer and deposit the part of the material layer over the deposition target surface of the second substrate.

Another feature of the present invention is a deposition method including steps of providing a first substrate which includes, over one of surfaces, a reflective layer having an opening, a heat-insulating layer having a light-transmitting property formed in contact with the reflective layer, a light-absorbing layer formed in contact with the heat-insulating layer, and a material layer formed in contact with the light-absorbing layer; disposing the surface of the first substrate over which the material layer is formed and a deposition target surface of a second substrate to face each other; and performing irradiation with laser light whose repetition rate is greater than or equal to 10 MHz and pulse width is greater than or equal to 100 fs and less than or equal to 10 ns from the other surface side of the first substrate to selectively heat a part of the material layer at a position overlapping with at least the opening of the reflective layer and deposit the part of the material layer over the deposition target surface of the second substrate.

Another feature of the present invention is a deposition method including steps of providing a first substrate which includes, over one of surfaces, a reflective layer having a plurality of openings, a heat-insulating layer having a light-transmitting property formed in contact with the reflective layer, a light-absorbing layer formed in contact with the heat-insulating layer, and a material layer formed in contact with the light-absorbing layer; disposing the surface of the first substrate over which the material layer is formed and a deposition target surface of a second substrate to face each other; and performing irradiation with laser light whose repetition rate is greater than or equal to 10 MHz and pulse width is greater than or equal to 100 fs and less than or equal to 10 ns from the other surface side of the first substrate so that there is a difference in the timing at which the adjacent openings are irradiated with the laser light to selectively heat a part of the material layer at a position overlapping with at least the opening of the reflective layer and deposit the part of the material layer over the deposition target surface of the second substrate.

Another feature of the present invention is a deposition method including steps of providing a first substrate which includes, over one of surfaces, a reflective layer having a plurality of openings, a heat-insulating layer having a light-transmitting property formed in contact with the reflective layer, a light-absorbing layer formed in contact with the heat-insulating layer, and a material layer formed in contact with the light-absorbing layer; disposing the surface of the first substrate over which the material layer is formed and a deposition target surface of a second substrate to face each other; performing irradiation with laser light whose repetition rate is greater than or equal to 10 MHz and pulse width is greater than or equal to 100 fs and less than or equal to 10 ns from the other surface side of the first substrate so that a plurality of laser spots are arranged in a zigzag manner on an irradiation surface; and scanning the laser light in a direction perpendicular to the direction in which the laser spots are arranged in a zigzag manner to selectively heat a part of the material layer at a position overlapping with at least the opening of the reflective layer and deposit the part of the material layer over the deposition target surface of the second substrate.

Furthermore, another feature of the present invention is a method for a manufacturing a light-emitting device using the above-describe deposition method. Thus, another feature of the present invention is a method for manufacturing a light-emitting device including steps of providing a first substrate which includes, over one of surfaces, a reflective layer having an opening, a heat-insulating layer having a light-transmitting property formed in contact with the reflective layer, a light-absorbing layer formed in contact with the heat-insulating layer, and a material layer formed in contact with the light-absorbing layer; disposing the surface of the first substrate over which the material layer is formed and one of surfaces of a second substrate over which a first electrode is formed to face each other; and performing irradiation with light whose repetition rate is greater than or equal to 10 MHz and pulse width is greater than or equal to 100 fs and less than or equal to 10 ns from the other surface side of the first substrate to selectively heat a part of the material layer at a position overlapping with at least the opening of the reflective layer and deposit the part of the material layer over the first electrode of the second substrate.

Another feature of the present invention is a method for manufacturing a light-emitting device including steps of providing a first substrate which includes, over one of surfaces, a reflective layer having a plurality of openings, a heat-insulating layer having a light-transmitting property formed in contact with the reflective layer, a light-absorbing layer formed in contact with the heat-insulating layer, and a material layer formed in contact with the light-absorbing layer; disposing the surface of the first substrate over which the material layer is formed and one of surfaces of a second substrate over which a first electrode is formed to face each other; and performing irradiation with laser light whose repetition rate is greater than or equal to 10 MHz and pulse width is greater than or equal to 100 fs and less than or equal to 10 ns from the other surface side of the first substrate so that there is a difference in the timing at which the adjacent openings are irradiated with the laser light to selectively heat a part of the material layer at a position overlapping with at least the opening of the reflective layer and deposit the part of the material layer over the first electrode of the second substrate.

Another feature of the present invention is a method for manufacturing a light-emitting device including steps of providing a first substrate which includes, over one of surfaces, a reflective layer having a plurality of openings, a heat-insulating layer having a light-transmitting property formed in contact with the reflective layer, a light-absorbing layer formed in contact with the heat-insulating layer, and a material layer formed in contact with the light-absorbing layer; disposing the surface of the first substrate over which the material layer is formed and one of surfaces of a second substrate over which a first electrode is formed to face each other; performing irradiation with laser light whose repetition rate is greater than or equal to 10 MHz and pulse width is greater than or equal to 100 fs and less than or equal to 10 ns from the other surface side of the first substrate so that a plurality of laser spots are arranged in a zigzag manner on an irradiation surface; and scanning the laser light in a direction perpendicular to the direction in which the laser spots are arranged in a zigzag manner to selectively heat a part of the material layer at a position overlapping with at least the opening of the reflective layer and deposit the part of the material layer over the first electrode of the second substrate.

In the above-described structures, the transmittance of the heat-insulating layer is greater than or equal to 60% and the thermal conductivity of a material used for the heat-insulating layer is lower than that of materials used for the reflective layer and the light-absorbing layer. In addition, the thickness of the heat-insulating layer is greater than or equal to 10 nm and less than or equal to 2 μm. Further, the heat-insulating layer contains any of titanium oxide, silicon oxide, silicon nitride oxide, zirconium oxide, or silicon carbide.

Moreover, in the above-described structures, the reflective layer has a reflectance of greater than or equal to 85% with respect to laser light. Further, the thickness of the reflective layer is preferably greater than or equal to 100 nm. Further, the reflective layer contains any of aluminum, silver, gold, platinum, copper, an alloy containing aluminum, an alloy containing silver, and indium tin oxide.

Moreover, in the above-described structures, the light-absorbing layer has a reflectance of less than or equal to 70% with respect to light. Note that the thickness of the light-absorbing layer is greater than or equal to 10 μm and less than or equal to 600 nm. Further, the light-absorbing layer contains any of metal nitride, metal, and carbon.

Note that, in the above-described structures, the light-absorbing layer is formed into an island shape at a position overlapping with the opening of the reflective layer. Alternatively, the light-absorbing layer is formed in stripes.

Furthermore, in the above-described structures, the material layer is preferably formed using an organic compound. Note that a case where the material layer contains either one or both of a light-emitting material and a carrier-transporting material is also included in the present invention. Further, the material layer is preferably formed by a wet process.

Furthermore, in the above-described structures, the laser light is preferably shaped into linear laser light.

Further, the present invention includes, in its category, an electronic device including a light-emitting device as well as a light-emitting device including a light-emitting element. Therefore, a light-emitting device in this specification refers to an image display device, a light-emitting device, and a light source (including an illumination device in its category). Further, the light-emitting device includes any of the following modules in its category: a module in which a connector such as a flexible printed circuit (FPC), tape automated bonding (TAB) tape, or a tape carrier package (TCP) is attached to a light-emitting device; a module having TAB tape or a TCP provided with a printed wiring board at the end thereof; and a module having an integrated circuit (IC) directly mounted on a light-emitting element by a chip on glass (COG) method.

When the present invention is applied, a film which is flat and has no unevenness can be formed. In addition, deposition over only a desired region is possible, and thus a minute pattern can be formed, which can lead to manufacture of a high-definition light-emitting device.

In addition, when the present invention is applied, material use efficiency can be increased, and thus manufacturing cost can be reduced.

Moreover, application of the present invention makes it easy to form a film into a desired shape with high accuracy, and thus productivity can be increased.

Furthermore, in the present invention, laser light having a high output can be used as a light source, and thus deposition over a large area can be performed at a time. Accordingly, time taken for deposition can be reduced, which can lead to increase in productivity.

By application of the present invention, the thickness of a material layer formed over a deposition substrate is controlled, so that the thickness of a film deposited over a deposition target substrate at the time of deposition can be controlled; thus, adjustment of deposition rate with use of a thickness monitor by a user is not needed and a deposition process can be fully automated. Accordingly, productivity can be increased.

BRIEF DESCRIPTION OF DRAWINGS

FIG. 18 is a view showing measurement results of Embodiment;

FIG. 20 is a view showing measurement results of Embodiment;

FIG. 28 is a view showing measurement results of Embodiment;

FIG. 29 is a view showing measurement results of Embodiment;

BEST MODE FOR CARRYING OUT THE INVENTION

Figure 1A:
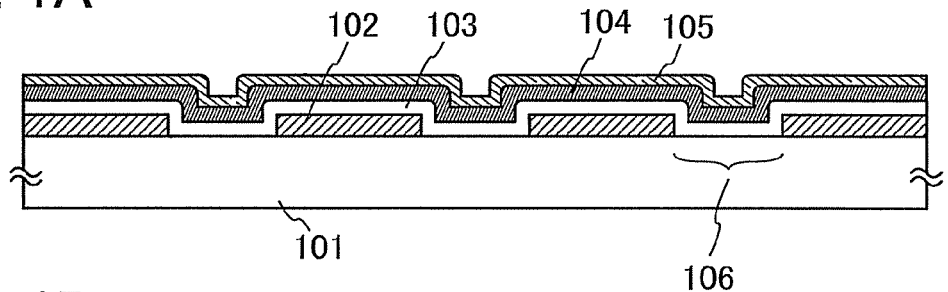
FIGS. 1A to 1D are views illustrating a deposition substrate and a deposition method of the present invention.

Embodiment Modes and Embodiment of the present invention will be hereinafter described in detail with reference to the accompanying drawings. Note that the present invention is not limited to the description below and the modes and details of the present invention can be modified in various ways without departing from the purpose and scope of the present invention. Therefore, the present invention should not be interpreted as being limited to the description below of Embodiment Modes and Embodiment. In the structure of the present invention hereinafter described, reference numerals indicating the same portions are used in common in different drawings.

Embodiment Mode 1

In this embodiment mode, a deposition substrate of the present invention and a deposition method using the deposition substrate will be described. Note that a case where an EL layer of a light-emitting element is formed using a deposition substrate will be described in this embodiment mode. In this specification, a substrate in which a material that is desired to be deposited is provided and which is used for deposition over a deposition target substrate is denoted as a "deposition substrate".

FIG. 1A illustrates an example of a deposition substrate. As illustrated in FIG. 1A, a reflective layer 102 is formed over a first substrate 101 which is a supporting substrate. Note that the reflective layer 102 has an opening 106. Further, a heat-insulating layer 103 is formed over the reflective layer 102. Note that, in FIG. 1A, part of the heat-insulating layer 103 is formed so as to fill the opening 106 of the reflective layer 102. Further, a light-absorbing layer 104 is formed over the heat-insulating layer 103.

Furthermore, a material layer 105 containing a material which is to be deposited over a deposition target substrate is formed over the light-absorbing layer 104. In FIG. 1A, the heat-insulating layer 103, the light-absorbing layer 104, and the material layer 105 are formed over the entire surface of the first substrate 101.

Note that, in the present invention, since light which is emitted to the first substrate 101 at the time of deposition of the material contained in the material layer 105 should be transmitted through the first substrate 101, the first substrate 101 preferably has a high light transmittance. That is, in the case of using laser light as the irradiation light, a substrate through which laser light is transmitted is preferably used as the first substrate 101. In addition, the first substrate 101 is preferably formed using a material having low thermal conductivity. With the first substrate 101 having low thermal conductivity, heat obtained from the irradiation light can be efficiently used for deposition. As the first substrate 101, for example, a glass substrate, a quartz substrate, a plastic substrate containing an inorganic material, or the like can be used.

Further, in order that a part of the light-absorbing layer 104 is selectively irradiated with light at the time of deposition, the reflective layer 102 serves as a layer for reflecting light emitted to the other part of the light-absorbing layer 104 than the part of the light-absorbing layer 104. Therefore, the reflective layer 102 is preferably formed using a material having a high reflectance with respect to irradiation light. Specifically, the reflective layer 102 preferably has a reflectance of greater than or equal to 85%, more preferably, a reflectance of greater than or equal to 90% with respect to the irradiation light.

As a material for the reflective layer 102, for example, silver, gold, platinum, copper, an alloy containing aluminum, an alloy containing silver, indium tin oxide, or the like can be used.

Note that, since a kind of material which is suitable for the reflective layer 102 varies depending on the wavelength of the irradiation light, the material of the reflective layer 102 needs to be selected as appropriate.

Note that the reflective layer 102 can be formed by any of a variety of kinds of methods. For example, the reflective layer 102 can be formed by a sputtering method, an electron beam evaporation method, a vacuum evaporation method, or the like. It is preferable that the thickness of the reflective layer 102 be greater than or equal to 100 nm although it depends on a material. With a thickness of greater than or equal to 100 mm, transmission of the irradiation light through the reflective layer 102 can be suppressed.

Although any of a variety of methods can be used for forming the opening 106 in the reflective layer 102, dry etching is preferably used. By use of dry etching, a minute pattern can be formed.

The heat-insulating layer 103 is a layer for preventing heat from being conducted to the light-absorbing layer 104 and the material layer 105, which are formed in later steps, if the irradiation light at the time of deposition which is reflected by the reflective layer 102 partially remains as heat in the reflective layer 102. Therefore, the heat-insulating layer 103 should be formed using a material which has lower thermal conductivity than materials for forming the reflective layer 102 and the light-absorbing layer 104. Further, in the case where the light transmitted through the opening 106 of the reflective layer 102 is made to pass through the heat-insulating layer 103, and the light-absorbing layer 104 is irradiated with the light as illustrated in FIGS. 1A to 1D, the heat-insulating layer 103 should have a light-transmitting property. In that case, the heat-insulating layer 103 of the present invention should be formed using a material which has high light transmittance as well as low thermal conductivity. Specifically, the heat-insulating layer 103 is preferably formed using a material which has a transmittance of greater than or equal to 60% with respect to light.

As a material used for the heat-insulating layer 103, for example, titanium oxide, silicon oxide, silicon nitride oxide, zirconium oxide, silicon carbide, or the like can be used.

Note that the heat-insulating layer 103 can be formed by any of a variety of methods. The heat-insulating layer 103 can be formed by, for example, a sputtering method, an electron beam evaporation method, a vacuum evaporation method, a CVD method, or the like. It is preferable that the thickness of the heat-insulating layer 103 be greater than or equal to 10 nm or less than or equal to 2 μm although it depends on a material. The thickness of the heat-insulating layer 103 is more preferably greater than or equal to 100 nm and less than or equal to 600 nm. With a thickness of greater than or equal to 10 nm and less than or equal to 2 μm, the heat-insulating layer 103 can block conduction of heat in the reflective layer 102 to the light-absorbing layer 104 and the material layer 105 as well as transmit the irradiation light which is transmitted through the opening 106 of the reflective layer 102. Note that, although the heat-insulating layer 103 covers the reflective layer 102 and the opening 106 of the reflective layer 102 in FIGS. 1A to 1D, the heat-insulating layer 103 may be formed only at a position overlapping with the reflective layer 102.

The light-absorbing layer 104 absorbs light which is emitted at the time of deposition. Therefore, it is preferable that the light-absorbing layer 104 be formed using a material which has low reflectance and high absorbance with respect to irradiation light. Specifically, it is preferable that the light-absorbing layer 104 have a reflectance of less than or equal to 70% with respect to irradiation light.

Any of a variety of kinds of materials can be used for the light-absorbing layer 104. For example, metal nitride such as titanium nitride, tantalum nitride, molybdenum nitride, or tungsten nitride; metal such as titanium, molybdenum, or tungsten; carbon; or the like can be used. Note that, since a kind of material which is suitable for the light-absorbing layer 104 varies depending on the wavelength of the irradiation light, the material of the light-absorbing layer 104 should be selected as appropriate. For example, for light having a wavelength of 800 nm, molybdenum, tantalum nitride, titanium, tungsten, or the like is preferably used. In addition, for light having a wavelength of 1300 nm, tantalum nitride, titanium, or the like is preferably used. Note that the light-absorbing layer 104 is not limited to a single layer and may include a plurality of layers. For example, a stacked-layer structure of metal and metal nitride may be employed.

The light-absorbing layer 104 can be formed by any of a variety of kinds of methods. For example, the light-absorbing layer 104 can be formed by a sputtering method, an electron beam evaporation method, a vacuum evaporation method, or the like.

It is preferable that the light-absorbing layer 104 have such a thickness that the irradiation light cannot be transmitted although it depends on a material. Specifically, the light-absorbing layer 104 preferably has a thickness of greater than or equal to 10 nm and less than or equal to 2 μm. Further, the thinner the thickness of the light-absorbing layer 104 is, the smaller the energy of laser light used for deposition is; thus, the light-absorbing layer 104 more preferably has a thickness of greater than or equal to 10 nm and less than or equal to 600 nm. For example, in the case of performing irradiation with light having a wavelength of 532 nm, with the thickness of the light-absorbing layer 104 of greater than or equal to 50 nm and less than or equal to 200 nm, the irradiation light can be efficiently absorbed to generate heat. In addition, with the thickness of the light-absorbing layer 104 of greater than or equal to 50 nm and less than or equal to 200 nm, deposition over a deposition target substrate can be performed with high accuracy.

The light-absorbing layer 104 may partially transmit irradiation light as long as a material contained in the material layer 105 can be heated up to the temperature at which the material can be deposited (the temperature at which at least part of the material contained in the material layer 105 is deposited over the deposition target substrate). Note that when the light-absorbing layer 104 partially transmits the irradiation light, it is preferable that a material which is not decomposed by light be used as the material contained in the material layer 105.

Furthermore, the bigger the difference in reflectance between the reflective layer 102 and the light-absorbing layer 104 is, the more preferable it is. Specifically, the difference in the reflectance with respect to the wavelength of the irradiation light is preferably greater than or equal to 25%, more preferably greater than or equal to 30%.

The material layer 105 contains a material which is deposited over the deposition target substrate. When the deposition substrate is irradiated with light, the material contained in the material layer 105 is heated, so that at least part of the material contained in the material layer 105 is deposited over the deposition target substrate. It is considered that when the material layer 105 is heated, at least part of the material contained in the material layer 105 is evaporated, or at least part of the material layer 105 is deformed due to heat, and accordingly a film comes off due to change in stress to be deposited over the deposition target substrate.

Note that, any material which can be deposited can be used as the material contained in the material layer 105 regardless of whether they are organic compounds or inorganic compounds. In the case of forming an EL layer of a light-emitting element as described in this embodiment mode, a material which can be deposited to form an EL layer is used. For example, an organic compound such as a light-emitting material or a carrier-transporting material which forms an EL layer, or an inorganic compound which is used for an electrode of a light-emitting element, such as metal oxide, metal nitride, metal halide, or an elementary substance of metal, as well as a carrier-transporting layer or a carrier-injecting layer included in an EL layer, can be used. Note that details of the materials which can be deposited to form an EL layer are given not here but in Embodiment Mode 4; therefore, Embodiment Mode 4 is referred to for the details, and description is omitted in this embodiment mode.

The material layer 105 may contain a plurality of materials. In addition, the material layer 105 may be a single layer or a stack of a plurality of layers. Accordingly, stacking a plurality of layers each containing a material enables co-evaporation. Note that in the case where the material layer 105 has a stacked-layer structure, it is preferable that the layers be stacked so that a material which can be deposited at a low temperature be contained in a layer on the first substrate 101 side. Such a structure makes it possible to efficiently perform evaporation using the material layer 105 which has a stacked-layer structure.

The material layer 105 is formed by any of a variety of kinds of methods. For example, a wet process such as a spin coating method, a spray coating method, an ink-jet method, a dip coating method, a casting method, a die coating method, a roll coating method, a blade coating method, a bar coating method, a gravure coating method, or a printing method can be used. Alternatively, a dry process such as a vacuum evaporation method or a sputtering method can be used.

When the material layer 105 is formed by a wet process, a predetermined material may be dissolved or dispersed in a solvent, and a solution or a dispersion liquid may be adjusted. There is no particular limitation on the solvent as long as it can dissolve or disperse the material and it does not react with the material. For example, as the solvent, any of the following can be used: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, and xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; and the like. A mixture of plural kinds of these solvents may also be used. By use of a wet process, it is possible to increase material use efficiency, which leads to reduction in manufacturing cost.

Note that in the case where the thickness and uniformity of a film which is formed over the deposition target substrate with the material layer 105 are controlled, the thickness and uniformity of the material layer 105 should be controlled. However, the material layer 105 does not need to be a uniform layer as long as the thickness and uniformity of a film which is formed over the deposition target substrate is not affected. For example, the material layer 105 may be formed in a minute island shape or may have unevenness.

Figure 1B:
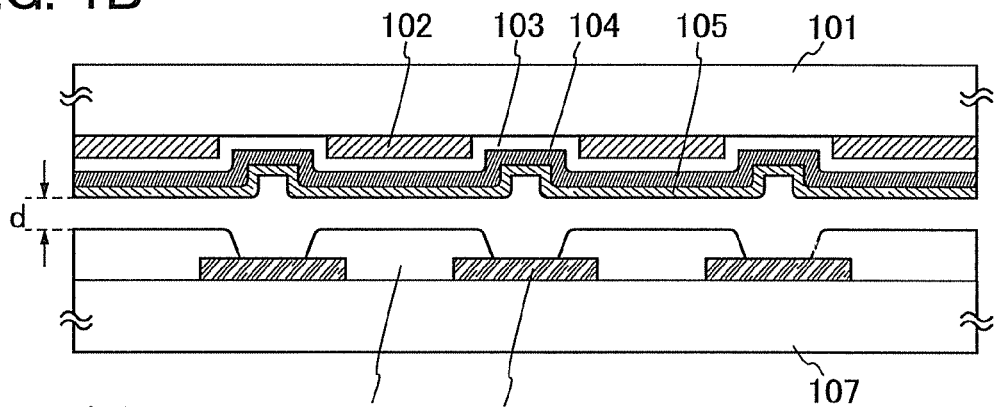

Next, as illustrated in FIG. 1B, a second substrate 107 which is a deposition target substrate is placed at a position facing a surface which is one of surfaces of the first substrate 101 and on which the reflective layer 102, the heat-insulating layer 103, the light-absorbing layer 104, and the material layer 105 are formed. The second substrate 107 is a deposition target substrate over which a desired layer is formed through a deposition process. Note that, since a case where an EL layer of a light-emitting element is formed using the deposition substrate is described here, a first electrode 108 which serves as one of electrodes of the light-emitting element and an insulator 109 are formed over the second substrate 107. Then, the first substrate 101 and the second substrate 107 are made to face each other in proximity: specifically, they are brought close to face each other so that the distance d between the surface of the material layer 105 on the first substrate 101 and the surface of the second substrate 107 is greater than or equal to 0 mm and less than or equal to 2 mm, preferably greater than or equal to 0 mm and less than or equal to 0.05 mm, or more preferably greater than or equal to 0 mm and less than or equal to 0.03 mm.

Note that the distance d is defined as the distance between the surface of the material layer 105 on the first substrate 101 and the surface of the second substrate 107. Therefore, in the case where some layer (e.g., a conductive layer which functions as an electrode or an insulator which functions as a partition wall) is formed over the second substrate 107, the distance d is defined as the distance between the surface of the material layer 105 on the first substrate 101 and the outermost surface of the layer formed over the second substrate 107. Note that, if the surface of the material layer 105 on the first substrate 101 or the outermost surface of the layer formed over the second substrate 107 has projections and depressions, the distance d is defined as the shortest distance between the surface of the material layer 105 on the first substrate 101 and the outermost surface of the layer formed over the second substrate 107.

Figure 1C:
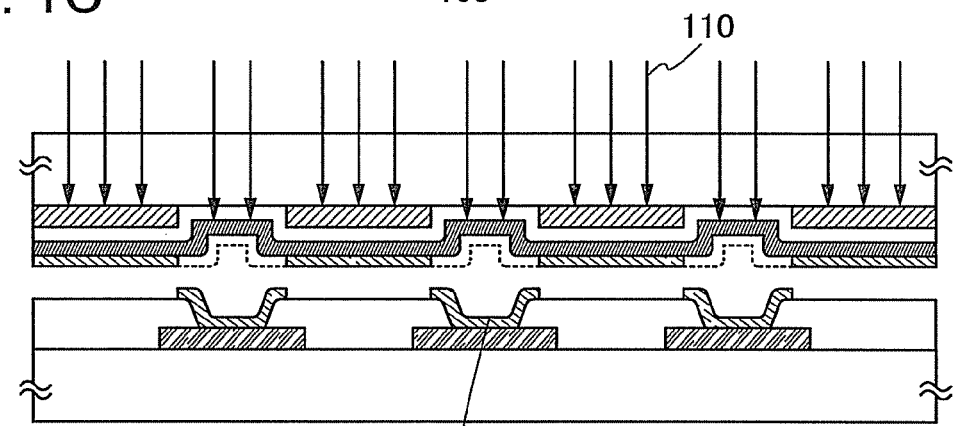

Next, as illustrated in FIG. 1C, irradiation with light 110 is performed from a rear surface (a surface over which the reflective layer 102, the heat-insulating layer 103, the light-absorbing layer 104, and the material layer 105 are not formed) side of the first substrate 101. At this time, the light emitted to the reflective layer 102 which is formed on the first substrate 101 is reflected, whereas light emitted to the opening 106 of the reflective layer 102 is transmitted through the heat-insulating layer 103 to be absorbed by the light-absorbing layer 104. Then, the light-absorbing layer 104 gives the heat obtained from the absorbed light to the material contained in the material layer 105, so that at least part of the material contained in the material layer 105 is deposited over the first electrode 108 formed over the second substrate 107. Accordingly, an EL layer 111 of a light-emitting element is formed over the second substrate 107.

As the irradiation light, laser light whose repetition rate is greater than or equal to 10 MHz and pulse width is greater than or equal to 100 fs and less than or equal to 10 ns is used. With use of such laser light whose repetition rate is very high and pulse width is very small, thermal conversion in the light-absorbing layer 104 is efficiently performed, and thus the material can be efficiently heated.

Further, the wavelength of the laser light is not particularly limited and laser light having a variety of wavelengths can be used. For example, laser light having a wavelength of 355 nm, 515 nm, 532 nm, 1030 nm, 1064 nm, or the like can be used.

As the laser light, it is possible to use light oscillated from one or more of a gas laser such as an Ar laser, a Kr laser, or an excimer laser; or a solid-state laser such as a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic, a third harmonic, or higher harmonics oscillated from the above-described solid-state laser can be used. Note that, when a solid-state laser whose laser medium is solid is used, there are advantages that a maintenance-free condition can be maintained for a long time and output is relatively stable.

The shape of a laser spot is preferably linear or rectangular. With a linear or rectangular laser spot, a substrate to be processed can be efficiently scanned with laser light. Thus, time taken for deposition (takt time) is shortened, which leads to increase in productivity.

In the present invention, the material layer 105 is not heated with radiation heat from the irradiation light from a light source but the irradiation light from a light source is absorbed by the light-absorbing layer 104 and the light-absorbing layer 104 gives heat to the material layer 105. Therefore, it is preferable to set irradiation time of light to be short so that an area of the material layer 105 which is heated is not enlarged due to conduction of heat in a plane direction from a part of the light-absorbing layer 104 which is irradiated with the light to a part of the light-absorbing layer 104 which is not irradiated with light.

It is preferable that deposition by light irradiation be performed in a reduced-pressure atmosphere. Accordingly, it is preferable that the deposition chamber have a pressure of less than or equal to $5 \times 10^{-3}$ Pa, more preferably greater than or equal to $10^{-6}$ Pa and less than or equal to $10^{-4}$ Pa.

Since the laser light whose repetition rate is greater than or equal to 10 MHz and pulse width is greater than or equal to 100 fs and less than or equal to 10 ns is capable of short-time irradiation, diffusion of heat can be suppressed, and thus a minute pattern can be deposited. In addition, since the laser light whose repetition rate is greater than or equal to 10 MHz and pulse width is greater than or equal to 100 fs and less than or equal to 10 ns is capable of a high output, a large area can be processed at a time, and thus time taken for deposition can be shortened. Accordingly, productivity can be increased.

Figure 1D:
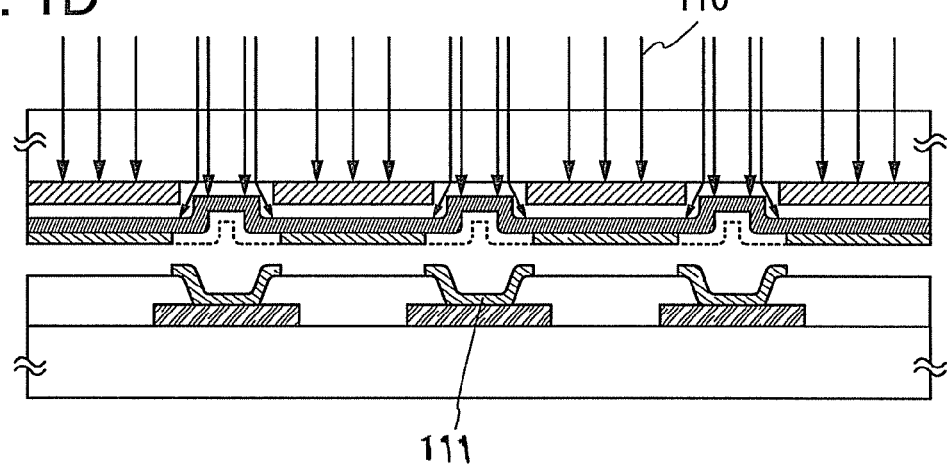

In the case where there is a possibility that light transmitted through the opening 106 of the reflective layer 102 spreads, in consideration of the spread of irradiation light, a structure illustrated in FIG. 1D, in which the opening 106 of the reflective layer 102 is made small, is effective. In the case of the structure illustrated in FIG. 1D, light transmitted through the opening 106 of the reflective layer 102 spreads to the light-absorbing layer 104 so as to be irradiated with the light, and thus a larger area of the material layer 105 than a region corresponding to the opening 106 of the reflective layer 102 is heated to be evaporated over the second substrate 107.

Figure 2A:
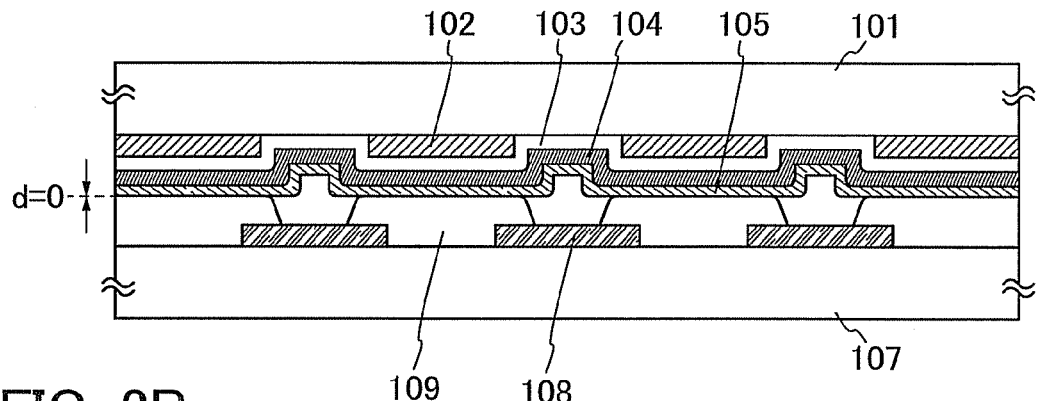
FIGS. 2A to 2D are views illustrating a deposition substrate and a deposition method of the present invention.
Figure 2B:
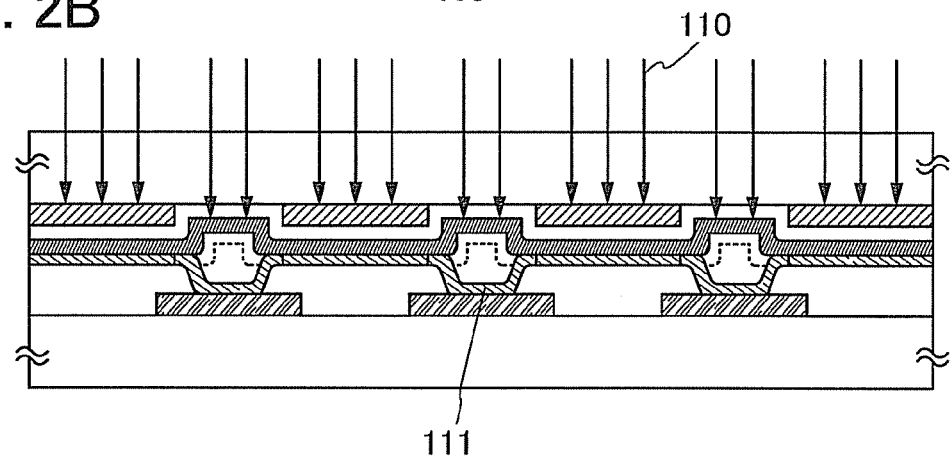

Further, FIG. 2A illustrates a case where the distance d between the first substrate 101 and the second substrate 107 is 0 mm. That is, the case is described where the material layer 105 which is formed on the first substrate 101 and the insulator 109 which is the outermost layer of the layers formed over the second substrate 107 are in contact with each other. By reduction in the distance d as described above, at the time of the irradiation with light as illustrated in FIG. 2B, the shape of a film which is deposited over the second substrate 107 can be formed with high accuracy. Note that, in the case where the surface of the second substrate 107 does not have projections and depressions, it is preferable that the material layer 105 on the first substrate 101 be not in contact with a deposition target surface of the second substrate 107.

Figure 2C:
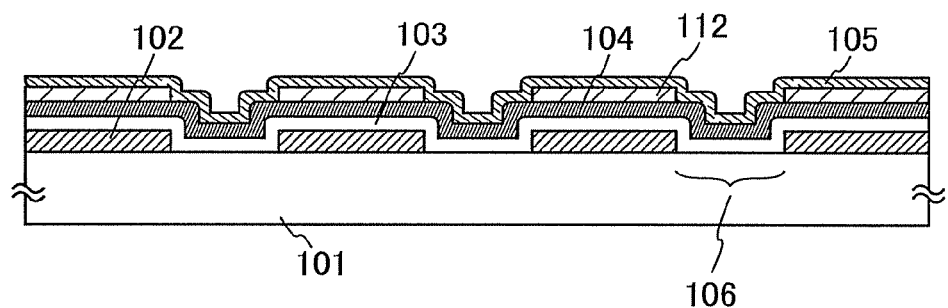

Further, the deposition substrate may have a structure illustrated in FIG. 2C as an alternative to the structure illustrated in FIG. 1A. In the structure illustrated in FIG. 2C, a second heat-insulating layer 112 is formed over the reflective layer 102, the heat-insulating layer 103, and the light-absorbing layer 104 which are sequentially formed over the first substrate 101 and also at a position overlapping with the reflective layer 102; and the material layer 105 is formed over the light-absorbing layer 104 and the second heat-insulating layer 112. When such a structure is employed, the number of manufacturing steps of a deposition substrate is increased compared to the case of employing the structure illustrated in FIG. 1A; however, deformation of a deposition pattern can be prevented more. That is, even if conduction of heat in the light-absorbing layer 104 formed at a position overlapping with the opening 106 to the light-absorbing layer 104 formed at a position overlapping with the reflective layer 102 (conduction of heat in a plane direction of the light-absorbing layer 104) occurs at the time of light irradiation for deposition, conduction of the heat to the material layer 105 can be prevented because the second heat-insulating layer 112 is provided. Thus, deformation of a deposition pattern over a deposition target surface which occurs due to heating of the material layer 105 formed at a position overlapping with the reflective layer 102 can be prevented. In addition, provision of the second heat-insulating layer 112 makes it possible to place a distance between the light-absorbing layer 104 which serves as a heat source and the deposition target substrate; thus, a deposition defect due to heating of the second substrate 107 by heat from the light-absorbing layer 104 can be prevented. Furthermore, since a deposition direction of a material which is deposited over the deposition target substrate from the material layer 105 can be controlled, deformation of a deposition pattern over the deposition target surface can be prevented. Note that, although a material and a deposition method used for the second heat-insulating layer 112 can be similar to those used for the heat-insulating layer 103, the transmittance of the material is not particularly limited unlike the case of the heat-insulating layer 103.

Figure 2D:
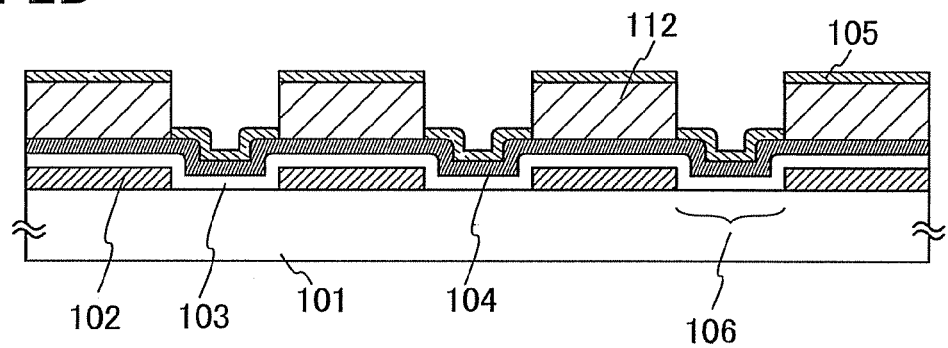

The thickness of the second heat-insulating layer 112 is preferably larger than that of the heat-insulating layer 103. Specifically, the thickness of the second heat-insulating layer 112 is preferably 1 μm to 10 μm. When the thickness of the second heat-insulating layer 112 is increased, the above-described effects of providing the second heat-insulating layer 112 become more significant. In addition, as illustrated in FIG. 2D, by increase in the thickness of the second heat-insulating layer 112, the material layer 105 becomes discontinuous; thus, conduction of heat in a plane direction of the material layer 105 can be prevented, and deformation of a deposition pattern can be further prevented.

Figure 3A:
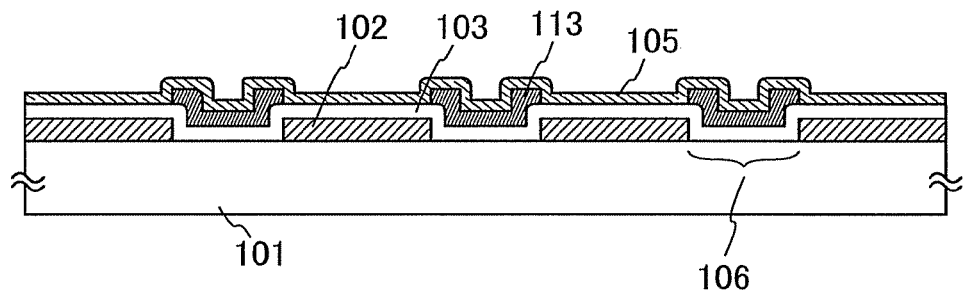
FIGS. 3A to 3D are views illustrating a deposition substrate and a deposition method of the present invention.
Figure 3B:
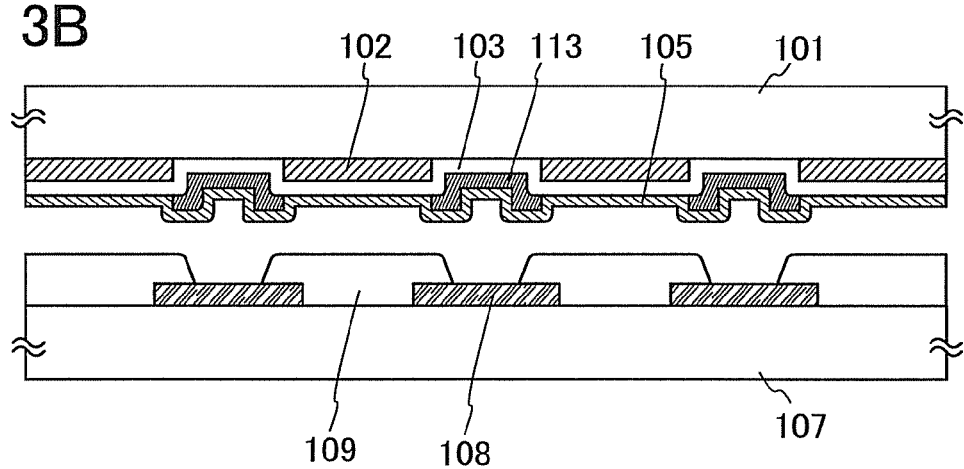

Note that, although the case where the light-absorbing layer 104 is formed over the entire surface of the first substrate 101 is illustrated in FIGS. 1A to 1D, a light-absorbing layer 113 may be patterned into an island shape as illustrated in FIG. 3A. In this manner, by patterning of the light-absorbing layer 113 into an island shape, it is possible to prevent misalignment or deformation of a deposition pattern over a deposition target surface, which occurs due to heating of the material layer 105 formed at a position overlapping with the reflective layer 102 by conduction of heat in the light-absorbing layer 113 in a plane direction of the light-absorbing layer 113, at the time of light irradiation for deposition.

Note that the case of the deposition substrate illustrated in FIG. 3A is similar to the case of the deposition substrate described using FIGS. 1A to 1D, the second substrate 107 which is a deposition target substrate is placed at a position facing a surface which is one of surfaces of the first substrate 101 and on which the reflective layer 102, the heat-insulating layer 103, the light-absorbing layer 113, and the material layer 105 are formed.

Figure 3C:
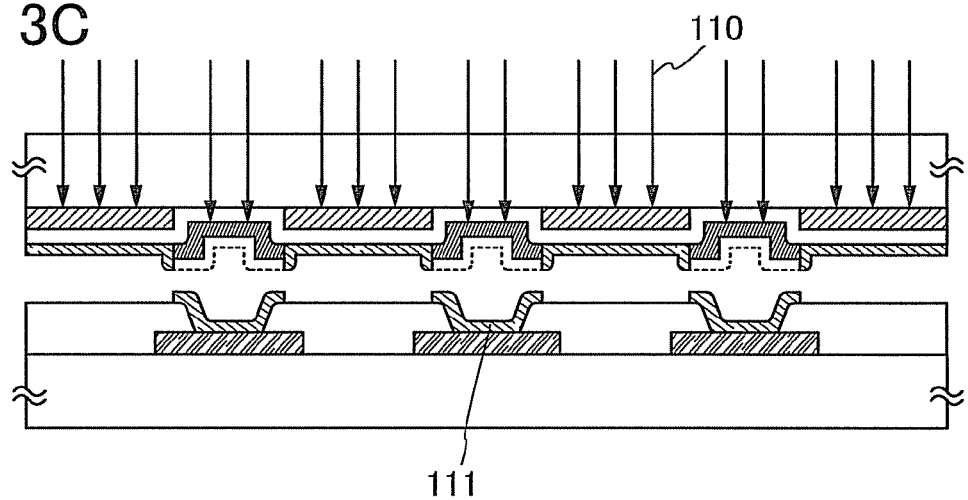

Then, as illustrated in FIG. 3C, irradiation with light is performed from a rear surface (a surface over which the reflective layer 102, the heat-insulating layer 103, the light-absorbing layer 113, and the material layer 105 are not formed) side of the first substrate 101. At this time, the light emitted to the reflective layer 102 formed on the first substrate 101 is reflected, while the light emitted to the opening 106 of the reflective layer 102 is transmitted through the heat-insulating layer 103 to be absorbed by the light-absorbing layer 113. Then, the light-absorbing layer 113 gives the heat obtained from the absorbed light to a material contained in the material layer 105, so that at least part of the material contained in the material layer 105 is deposited over the first electrode 108 formed over the second substrate 107. Accordingly, an EL layer 111 of a light-emitting element is formed over the second substrate 107. Note that, although FIG. 3C illustrates the case where the edges of the reflective layer 102 are aligned with the edges of the light-absorbing layer 113, the reflective layer 102 and the light-absorbing layer 113 may partially overlap with each other so that the deposition target substrate is not irradiated with light.

Figure 3D:
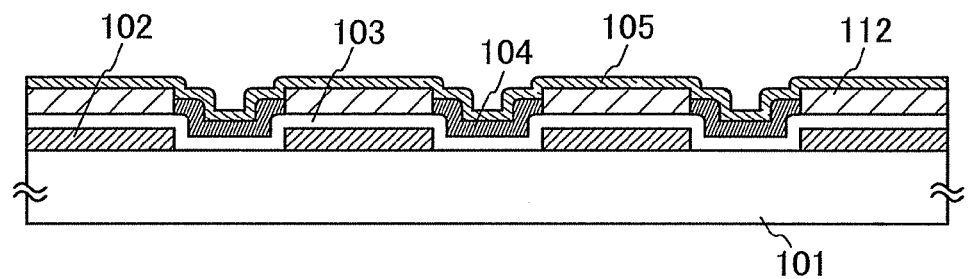

Further, a structure illustrated in FIG. 3D may be employed as an alternative to the structure illustrated in FIG. 3A. In the structure illustrated in FIG. 3D, the reflective layer 102, the heat-insulating layer 103, and the light-absorbing layer 104 are sequentially formed over the first substrate 101, the second heat-insulating layer 112 is formed at a position overlapping with the reflective layer 102, and the material layer 105 is formed over the light-absorbing layer 104 and the second heat-insulating layer 112. When such a structure is employed, the number of manufacturing steps of the deposition substrate is increased compared to the case of employing the structure illustrated in FIG. 1A; however, the provision of the second heat-insulating layer 112 makes it possible to control a deposition direction of a material which is deposited over the deposition target substrate from the material layer 105, and thus deformation of a deposition pattern over a deposition target surface can be prevented. Note that, although a material and a deposition method used for the second heat-insulating layer 112 can be similar to those used for the heat-insulating layer 103, the transmittance of the material is not particularly limited unlike the case of the heat-insulating layer 103. The thickness of the second heat-insulating layer 112 is preferably 1 μm to 10 μm. Further, in the case where the thickness of the second heat-insulating layer 112 is increased so as to be thick enough to make the material layer 105 discontinuous, conduction of heat in a plane direction of the material layer 105 can be prevented, and thus deformation of a deposition pattern can be further prevented.

Figure 4A:
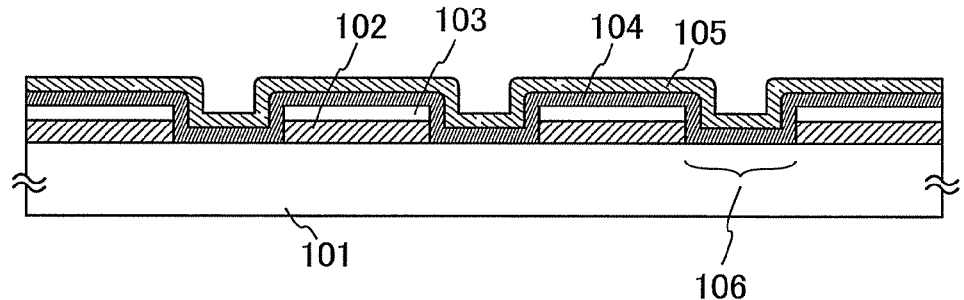
FIGS. 4A to 4D are views illustrating a deposition substrate and a deposition method of the present invention.
Figure 4B:
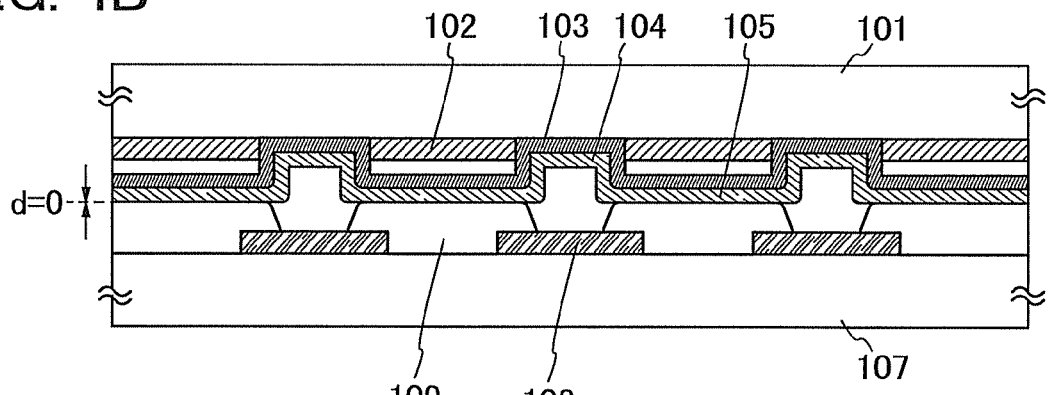
Figure 4C:
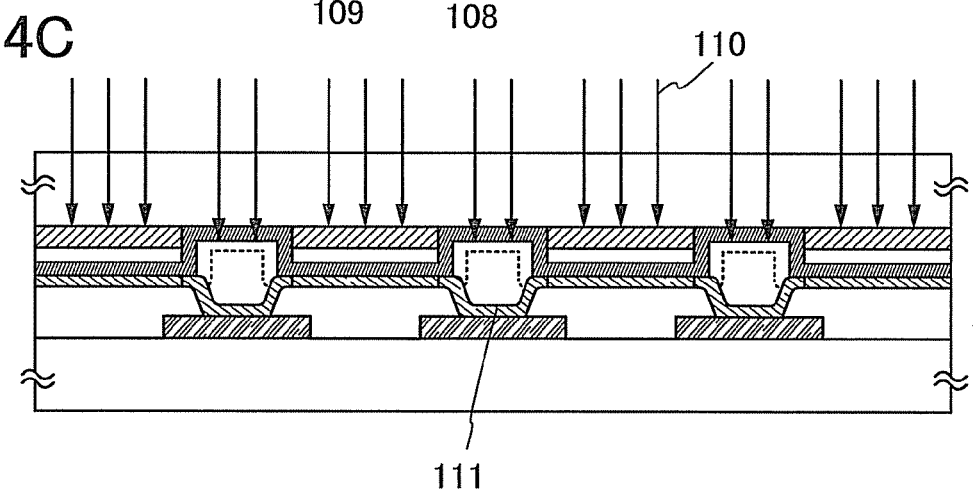
Figure 4D:
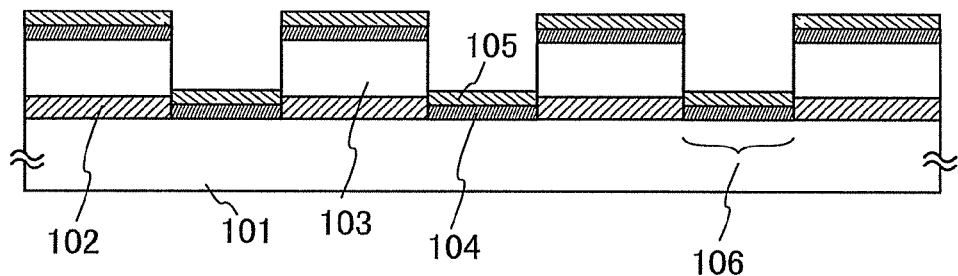

Further, as illustrated in FIGS. 4A to 4D, the heat-insulating layer 103 may be patterned into an island shape. At this time, the heat-insulating layer 103 is formed so as to overlap with the reflective layer 102 and not to be formed in the opening 106. Even when the heat-insulating layer 103 is formed into an island shape in this manner, similarly to FIGS. 1A to 1D, deformation of a deposition pattern can be prevented. In addition, by patterning of the heat-insulating layer 103 into an island shape in this manner, the thickness of the heat-insulating layer 103 can be increased more than in the case where the heat-insulating layer 103 is also formed in the opening 106. For example, as illustrated in FIG. 4D, the thickness of the heat-insulating layer 103 can be increased so that the light-absorbing layer 104 and the material layer 105 are discontinuous. In that case, conduction of heat in a plane direction of the light-absorbing layer 104 can be prevented. Thus, deformation of a deposition pattern can be further prevented. Note that in the case where the heat-insulating layer 103 is formed so as to overlap with the reflective layer 102 and not to be formed in the opening 106, the light transmittance of the heat-insulating layer 103 is not particularly limited.

Figure 5A:
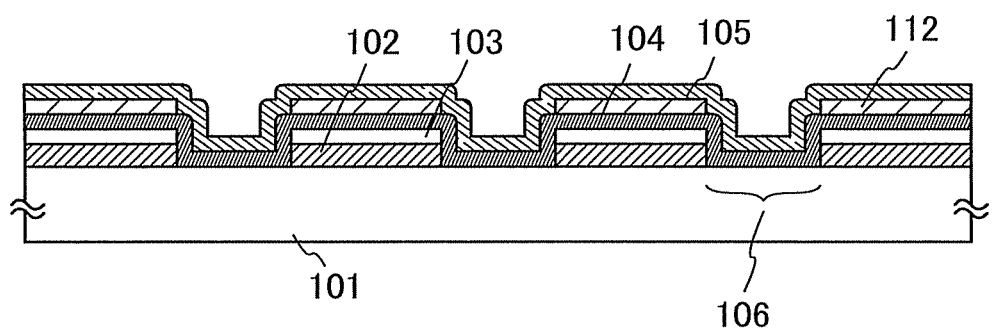
FIGS. 5A and 5B are views illustrating a deposition substrate and a deposition method of the present invention.
Figure 5B:
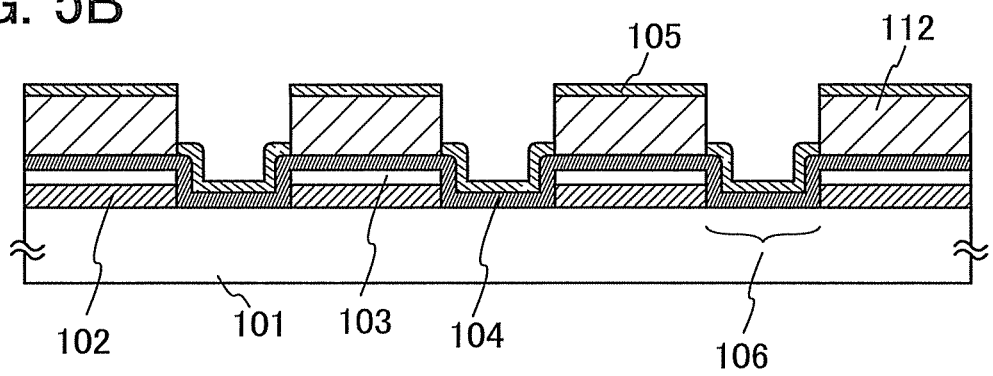

Further, as illustrated in FIGS. 5A and 5B, the heat-insulating layer 112 can be additionally provided in the structure illustrated in FIGS. 4A to 4D. In the structure illustrated in FIG. 5A, the second heat-insulating layer 112 is formed over the reflective layer 102, the heat-insulating layer 103, and the light-absorbing layer 104 which are sequentially formed over the first substrate 101 and also at a position overlapping with the reflective layer 102; and the material layer 105 is formed over the light-absorbing layer 104 and the second heat-insulating layer 112. Such a structure makes it possible to further prevent deformation of a deposition pattern. That is, even if conduction of heat in the light-absorbing layer 104 formed at a position overlapping with the opening 106 to the light-absorbing layer 104 formed at a position overlapping with the reflective layer 102 (conduction of heat in a plane direction of the light-absorbing layer 104) occurs at the time of light irradiation for deposition, conduction of the heat to the material layer 105 can be prevented because the second heat-insulating layer 112 is provided. Thus, deformation of a deposition pattern over a deposition target surface which occurs due to heating of the material layer 105 formed at a position overlapping with the reflective layer 102 can be prevented. In addition, provision of the second heat-insulating layer 112 makes it possible to place a distance between the light-absorbing layer 104 which serves as a heat source and the deposition target substrate; thus, a deposition defect due to heating of the second substrate 107 by heat from the light-absorbing layer 104 can be prevented. Furthermore, since a deposition direction of a material which is deposited over the deposition target substrate from the material layer 105 can be controlled, deformation of a deposition pattern over the deposition target surface can be prevented. Note that, although a material and a deposition method used for the second heat-insulating layer 112 can be similar to those used for the heat-insulating layer 103, the transmittance of the material is not particularly limited unlike the case of the heat-insulating layer 103.

The thickness of the second heat-insulating layer 112 is preferably larger than that of the heat-insulating layer 103. Specifically, the thickness of the second insulating layer 112 is preferably 1 μm to 10 μm. When the thickness of the second insulating layer 112 is increased, the above-described effects of providing the second heat-insulating layer 112 become more significant. In addition, as illustrated in FIG. 5B, by increase in the thickness of the second heat-insulating layer 112, the material layer 105 becomes discontinuous; thus, conduction of heat in a plane direction of the material layer 105 can be prevented, and deformation of a deposition pattern can be further prevented.

Although the case where the second substrate 107 is positioned below the first substrate 101 is described in this embodiment mode, the present invention is not limited thereto. The position of the substrate to be placed can be determined as appropriate.

Further, in this embodiment mode, the case where the first electrode 108 is formed over the second substrate 107 which is a deposition target substrate and a film is deposited over the first electrode 108 is described. The present invention can also be applied to a case where part of an EL layer is already formed over the first electrode 108. For example, a light-emitting layer can be formed using the second substrate 107 in which part of an EL layer (e.g., a hole-injecting layer or a hole-transporting layer) is formed over the first electrode 108, by application of the deposition method of the present invention. In the case of manufacturing a full color display, light-emitting layers of three colors should be separately formed, and use of the deposition method of the present invention makes it possible to separately form the light-emitting layers easily. In addition, the light-emitting layers can be separately formed with high accuracy.

When the present invention is applied, by control of the thickness of the material layer formed over the first substrate, the thickness of a film which is to be deposited over the second substrate which is a deposition target substrate can be controlled. In other words, the thickness of the material layer formed over the first substrate is controlled in advance so that a film which is formed over the second substrate can have a desired thickness when all materials contained in the material layer formed over the first substrate is deposited; thus, a thickness monitor is not needed in deposition over the second substrate. Therefore, a user does not have to adjust the deposition rate with a thickness monitor, and the deposition process can be fully automated. Accordingly, productivity can be increased.

Further, when the present invention is applied, a material contained in the material layer 105 formed over the first substrate 101 can be uniformly deposited. Moreover, even in the case where the material layer 105 contains a plurality of materials, a film containing the same materials at substantially the same weight ratios as those of the material layer 105 can be deposited over the second substrate 107 which is a deposition target substrate. Therefore, as for the deposition method according to the present invention, even in the case where deposition is performed using plural kinds of materials having different deposition temperatures, unlike co-evaporation, the evaporation rate of each material does not have to be controlled. Thus, without complicated control of the evaporation rate or the like, a layer containing desired different kinds of materials can be deposited easily with high accuracy.

Further, by the deposition method of the present invention, a desired material can be deposited over the deposition target substrate without being wasted. Thus, material use efficiency is increased, which can lead to reduction in manufacturing cost. Moreover, a material can be prevented from being attached to an inner wall of a deposition chamber, and thus maintenance of a deposition apparatus can be facilitated.

Further, when the present invention is applied, a film which is flat and has no unevenness can be formed. In addition, deposition over only a desired region is possible, and thus a minute pattern can be formed, which can lead to manufacture of a high-definition light-emitting device.

Further, since the application of the present invention enables selective deposition over a desired region at the time of deposition using laser light, material use efficiency can be increased and formation of a film of a desired shape with high accuracy is easily performed; thus, productivity can be increased. Moreover, in the present invention, laser light having a high output can be used as a light source, and thus deposition over a large area can be performed at a time. Thus, time taken for deposition (takt time) can be shortened, which can lead to increase in productivity.

Embodiment Mode 2

In this embodiment mode, a method for manufacturing a light-emitting device which is capable of full color display by formation of an EL layer of a light-emitting element with use of a plurality of deposition substrates described in Embodiment Mode 1 will be described.

Although the case where EL layers formed using the same material are formed over the plurality of electrodes formed over a second substrate, which is a deposition target substrate, through one deposition process is described in Embodiment Mode 1, the case where any of EL layers of three different emission colors are formed over the plurality of electrodes formed over the second substrate will be described in this embodiment mode.

First, for example, three deposition substrates each of which is the deposition substrate illustrated in FIG. 1A in Embodiment Mode 1 are prepared. Material layers for forming EL layers which emit different colors are provided for the three respective deposition substrates. Specifically, a first deposition substrate having a material layer (R) containing a material for forming an EL layer which emits red light (an EL layer (R)), a second deposition substrate having a material layer (G) containing a material for forming an EL layer which emits green light (an EL layer (G)), and a third deposition substrate having a material layer (B) containing a material for forming an EL layer which emits blue light (an EL layer (B)) are prepared.

In addition, one deposition target substrate having a plurality of first electrodes illustrated in FIG. 1B in Embodiment Mode 1 is prepared. Note that since edges of the plurality of first electrodes over the deposition target substrate are covered with an insulator, a light-emitting region corresponds to a part of the first electrode, which is exposed without overlapping with the insulator.

First, for a first deposition process, the deposition target substrate and the first deposition substrate are superimposed on each other and aligned with each other in a similar manner to FIG. 1B. It is preferable that the deposition target substrate be provided with an alignment marker. It is preferable that the first deposition substrate be also provided with an alignment marker. Note that, since the first deposition substrate is provided with the light-absorbing layer, a portion of the light-absorbing layer which is near the alignment marker is preferably removed in advance. In addition, since the first deposition substrate is provided with the material layer (R), a portion of the material layer (R) which is near the alignment marker is also preferably removed in advance.

Then, irradiation with light is performed from a rear surface (a surface over which the reflective layer 102, the heat-insulating layer 103, the light-absorbing layer 104, and the material layer 105, which are illustrated in FIGS. 1A to 1D, are not formed) side of the first deposition substrate. The light-absorbing layer absorbs the irradiation light and gives heat to the material layer (R) to heat the material contained in the material layer (R), so that an EL layer (R) is formed over some of the first electrodes over the deposition target substrate. After the first deposition is completed, the first deposition substrate is moved away from the deposition target substrate.

Next, for a second deposition process, the deposition target substrate and the second deposition substrate are superimposed on each other and aligned with each other. The second deposition substrate is provided with openings of the reflective layer each at a position which is shifted by one pixel from that of the opening of the first deposition substrate used in the first deposition.

Then, irradiation with light is performed from a rear surface (a surface over which the reflective layer 102, the heat-insulating layer 103, the light-absorbing layer 104, and the material layer 105, which are illustrated in FIGS. 1A to 1D, are not formed) side of the second deposition substrate. The light-absorbing layer absorbs the irradiation light and gives heat to the material layer (G) to heat the material contained in the material layer (G), so that an EL layer (G) is formed over some of the first electrodes over the deposition target substrate, which are next to the first electrodes over which the EL layer (R) is formed in the first deposition. After the second deposition is completed, the second deposition substrate is moved away from the deposition target substrate.

Next, for a third deposition process, the deposition target substrate and the third deposition substrate are superimposed on each other and aligned with each other. The third deposition substrate is provided with openings of the reflective layer each at a position which is shifted by two pixels from that of the opening of the first deposition substrate used in the first deposition.

Figure 6A:
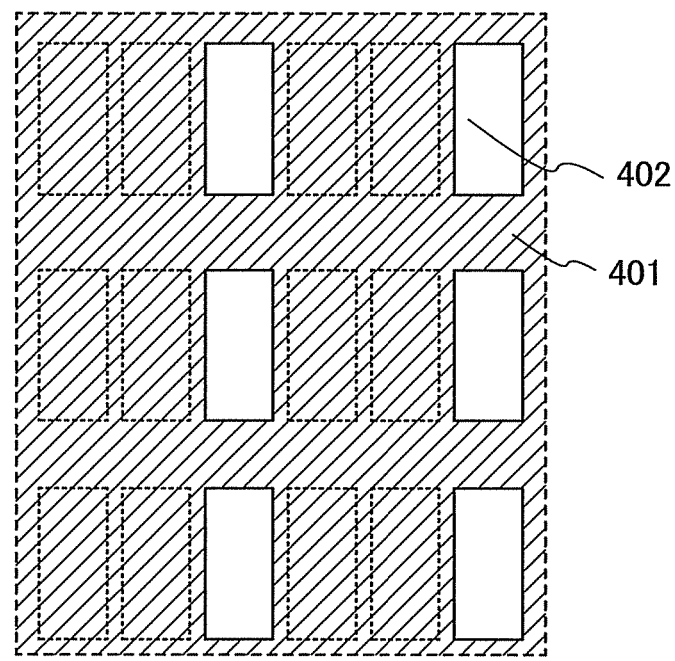
FIGS. 6A and 6B are views illustrating a deposition method of the present invention.

Then, irradiation with light is performed from a rear surface (a surface over which the reflective layer 102, the heat-insulating layer 103, the light-absorbing layer 104, and the material layer 105, which are illustrated in FIGS. 1A to 1D, are not formed) side of the third deposition substrate. A state right before the third deposition is performed corresponds to the top view of FIG. 6A. In FIG. 6A, a reflective layer 401 has openings 402. Accordingly, light which is transmitted through the openings 402 of the reflective layer 401 of the third deposition substrate is transmitted through the heat-insulating layer and is absorbed by the light-absorbing layer. In addition, first electrodes are formed in regions of the deposition target substrate, which overlap with the openings 402 of the third deposition substrate. Note that the EL layer (R) 411 formed through the first deposition and the EL layer (G) 412 formed through the second deposition are located under regions indicated by dotted lines in FIG. 6A.

Then, the EL layer (B) 413 is formed through the third deposition. The light-absorbing layer absorbs the irradiation light and provides heat to the material layer (B) to heat the material contained in the material layer (B), so that the EL layer (B) 413 is formed over some of the first electrodes over the deposition target substrate, which are next to the first electrodes over which the EL layer (G) 412 is formed in the second deposition. After the third deposition is completed, the third deposition substrate is moved away from the deposition target substrate.

In this manner, the EL layer (R) 411, the EL layer (G) 412, and the EL layer (B) 413 can be formed at regular intervals over one deposition target substrate. Then, second electrodes are formed over these layers, and thus light-emitting elements can be formed.

Through the above-described steps, the light-emitting elements which emit different colors are formed over one substrate, whereby a light-emitting device which is capable of full color display can be manufactured.

Figure 6B:
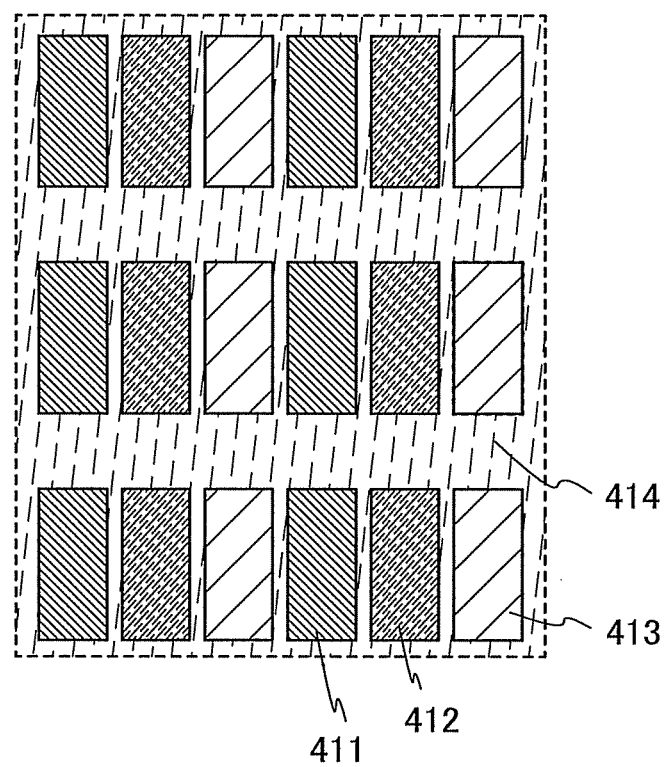

FIGS. 6A and 6B illustrate the example in which the openings 402 of the reflective layer formed over the deposition substrate each have a rectangular shape. However, the present invention is not particularly limited to this example and stripe openings may be employed. In the case where the stripe openings are employed, although deposition is also performed between light-emitting regions for emitting light of the same color, a film is formed over the insulator 414, and thus a portion overlapping with the insulator 414 does not serve as a light-emitting region.

Figure 7A:
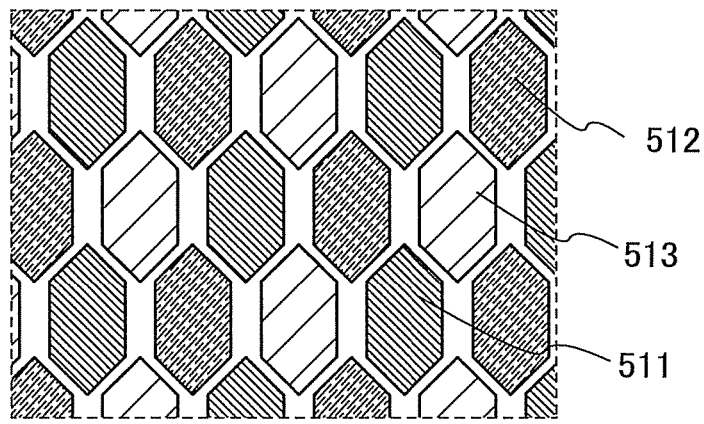
FIGS. 7A and 7B are views illustrating a deposition method of the present invention.
Figure 7B:
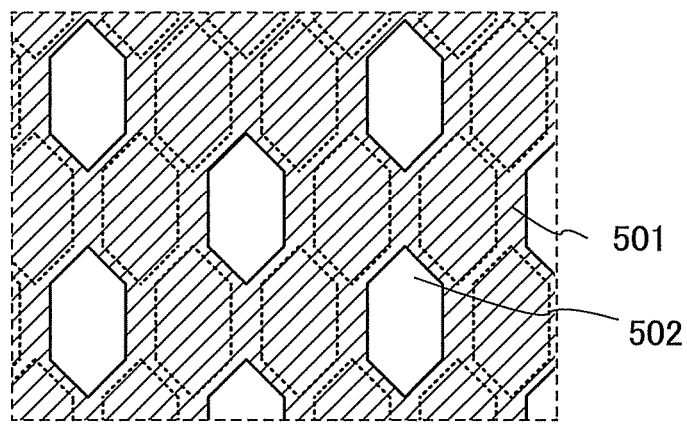

In addition, there is no particular limitation on the arrangement of pixels. The shape of each pixel may be a polygon, for example, a hexagon as illustrated in FIG. 7A, and a full color light-emitting device may be realized by arrangement of an EL layer (R) 511, an EL layer (G) 512, and an EL layer (B) 513. In order to form polygonal pixels illustrated in FIG. 7A, deposition may be performed using a deposition substrate which includes a reflective layer 501 having polygonal openings 502 illustrated in FIG. 7B.

In the manufacture of the light-emitting device which is capable of full color display described in this embodiment mode, by control of the thickness of the material layer formed over the deposition substrate, the thickness of a film which is to be deposited over the deposition target substrate can be controlled. In other words, the thickness of the material layer is controlled in advance so that a film which is to be formed over the deposition target substrate can have a desired thickness when all materials contained in the material layer formed over the deposition substrate is deposited; thus, a thickness monitor is not needed in deposition over the deposition target substrate. Therefore, a user does not have to adjust the deposition rate with a thickness monitor, and the deposition process can be fully automated. Accordingly, productivity can be increased.

Further, in the manufacture of the light-emitting device which is capable of full color display described in this embodiment mode, by application of the present invention, a material contained in the material layer formed over the deposition substrate can be uniformly deposited. Moreover, even in the case where the material layer contains a plurality of materials, a film containing the same materials at substantially the same weight ratios as those of the material layer can be deposited over the deposition target substrate. Therefore, as for the deposition method according to the present invention, even in the case where deposition is performed using plural kinds of materials having different deposition temperatures, a layer containing desired different kinds of materials can be deposited easily with high accuracy without complicated control of the evaporation rate or the like.

Further, in the manufacture of the light-emitting device which is capable of full color display described in this embodiment mode, by application of the present invention, a desired material can be deposited over the deposition target substrate without being wasted. Thus, material use efficiency is increased, which can lead to reduction in manufacturing cost. Moreover, a material can be prevented from being attached to an inner wall of a deposition chamber, and thus maintenance of a deposition apparatus can be facilitated.

Further, in the manufacture of the light-emitting device which is capable of full color display described in this embodiment mode, by application of the present invention, a film which is flat and has no unevenness can be formed. In addition, since a minute pattern can be formed, a high-definition light-emitting device can be obtained.

Further, since the application of the present invention enables selective deposition over a desired region at the time of deposition using laser light, material use efficiency can be increased and formation of a film of a desired shape with high accuracy is easily performed; thus, productivity of the light-emitting device can be increased. Moreover, in the present invention, laser light having a high output can be used as a light source, and thus deposition over a large area can be performed at a time. Thus, time taken for deposition (talct time) can be shortened, which can lead to increase in productivity.

Note that the structure described in this embodiment mode can be combined with the structure described in Embodiment Mode 1 as appropriate.

Embodiment Mode 3

In this embodiment mode, an example of a deposition apparatus which performs deposition by irradiating a deposition substrate with laser light (also referred to as a laser beam) and a laser irradiation method will be described.

Figure 8:
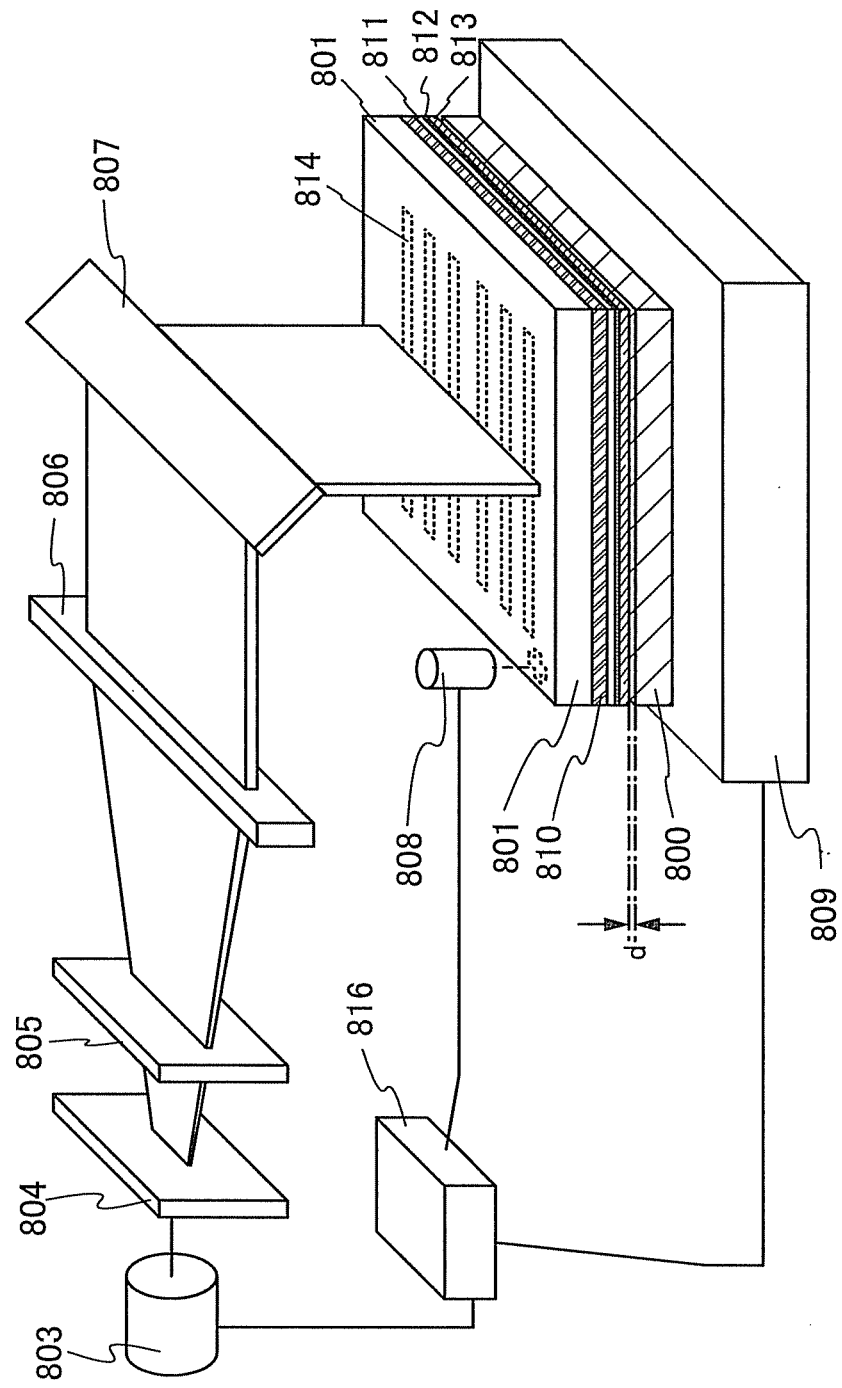
FIG. 8 is a diagram illustrating a deposition apparatus.

FIG. 8 is a perspective view illustrating an example of a deposition apparatus using a laser. Laser light is outputted from a laser device 803 (a YAG laser device or the like) and is transmitted through a first optical system 804 for changing a beam shape into a rectangular shape, a second optical system 805 for shaping the laser light, and a third optical system 806 for collimating a beam; and an optical path is bent to a direction perpendicular to a deposition substrate 801 with use of a reflecting mirror 807. Then, the deposition substrate is irradiated with the laser beam.

Note that a structure of the deposition substrate described in this embodiment mode is similar to that described in Embodiment Mode 1. In other words, the deposition substrate has a structure in which a reflective layer 810, a heat-insulating layer 811, a light-absorbing layer 812, a material layer 813, and the like are formed over the first substrate. In addition, the reflective layer 810 has openings 814. Note that, although FIG. 8 illustrates the case of the openings 814 in stripes, the shape of the openings 814 is not limited thereto and the openings 814 can be formed into a desired shape.

As laser light which serves as a light source, laser light whose repetition rate is greater than or equal to 10 MHz and pulse width is greater than or equal to 100 fs and less than or equal to 10 ns is used. With use of such laser light whose repetition rate is very high and pulse width is very small, thermal conversion in the light-absorbing layer 812 is efficiently performed. Thus, a material contained in the material layer 813 can be efficiently heated.

Further, the wavelength of the laser light is not particularly limited and laser light having a variety of wavelengths can be used. For example, laser light having a wavelength of 355 nm, 515 nm, 532 nm, 1030 nm, 1064 nm, or the like can be used.

As the laser light, it is possible to use light oscillated from one or more of a gas laser such as an Ar laser, a Kr laser, or an excimer laser; or a solid-state laser such as a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic or a third harmonic oscillated from the above-described solid-state laser can be used.

The shape of a laser spot with which the deposition substrate 801 is irradiated is preferably a rectangular or linear shape. For example, the shape may be a rectangle having a short side of 1 μm to 100 μm and a long side of 100 μm to 5 mm. In addition, in the case of using a large-sized substrate, the long side of the laser spot is preferably as long as possible in order to shorten processing time. Moreover, a plurality of laser devices and optical systems illustrated in FIG. 8 may be provided to process a large-area substrate in a short time. Specifically, a laser beam may be emitted from each of the plurality of laser oscillators so that the area to be processed of one substrate is divided by the laser beams.

Note that FIG. 8 illustrates an example, and there is no particular limitation on the positional relationship between each optical system and electro-optical element placed in the path of laser light. For example, the reflective mirror 807 is not always needed if the laser device 803 is placed above the deposition substrate 801 so that laser light is emitted from the laser device 803 in a direction perpendicular to a principle plane of the deposition substrate 801. Further, each optical system may employ a condenser lens, a beam expander, a homogenizer, a polarizer, or the like, and these may be combined. Alternatively, as each optical system, a slit may be used in combination.

A region to be irradiated is two-dimensionally scanned with a laser beam as appropriate, whereby a large area of the substrate is irradiated with the laser beam. For the scan, the region to be irradiated with a laser beam and the substrate are relatively moved. Here, the scan is performed with a moving means (not illustrated) which moves a substrate stage 809 holding the substrate in the X-Y direction.

Further, a control device 816 is preferably interlocked such that it can also control the moving means which moves the substrate stage 809 in the X-Y direction. Moreover, the control device 816 is preferably interlocked such that it can also control the laser device 803. Furthermore, the control device 816 is preferably interlocked with a position alignment mechanism which has an image pickup element 808 for recognizing a position marker.

The position alignment mechanism aligns the positions of the deposition substrate 801 and a deposition target substrate 800.

Further, the distance d, which is the distance between the deposition substrate 801 and the deposition target substrate 800, is defined as the distance between a surface of the material layer formed on the deposition substrate 801 and a surface of the deposition target substrate 800. In addition, in the case where some layer (e.g., a conductive layer which functions as an electrode or an insulating layer which functions as a partition wall) is formed over the deposition target substrate 800, the distance d is defined as the distance between the surface of the material layer on the deposition substrate 801 and the surface of the layer formed over the deposition target substrate 800. Note that in the case where the surface of the material layer formed on the deposition substrate 801, the surface of the deposition target substrate 800, or the surface of the layer formed over the deposition target substrate 800 has projections and depressions, the distance d is defined as the shortest distance between the surface of the material layer on the deposition substrate 801 and the outermost surface of the deposition target substrate 800 or the layer formed over the deposition target substrate 800. Note that the deposition substrate 801 and the deposition target substrate 800 are disposed to be close to each other to face each other so that the distance d is greater than or equal to 0 mm and less than or equal to 2 mm, preferably greater than or equal to 0 mm and less than or equal to 0.05 mm, more preferably greater than or equal to 0 mm and less than or equal to 0.03 mm. In addition, in the case where the deposition target substrate 800 is provided with an insulator which serves as a partition wall, the insulator and the material layer 815 may be placed in contact with each other.

When deposition is performed with use of the deposition apparatus illustrated in FIG. 8, at least the deposition substrate 801 and the deposition target substrate 800 are set in a vacuum chamber. Alternatively, all the components illustrated in FIG. 8 may be placed in a vacuum chamber.

Although FIG. 8 illustrates an example of the deposition apparatus employing a so-called face-up system in which a surface of the deposition target substrate 800 faces upward, a deposition apparatus employing a face-down system may be used. When the deposition target substrate 800 is a large-area substrate, a so-called vertical placement apparatus may also be employed in which a main plane of the deposition target substrate 800 is perpendicular to a horizontal plane in order to suppress distortion of the center of the substrate due to its own weight.

By provision of a cooling means which cools the deposition target substrate 800, a flexible substrate such as a plastic substrate can be used as the deposition target substrate 800.

Further, when a plurality of deposition apparatuses described in this embodiment mode are provided, a multi-chamber deposition apparatus can be obtained. Needless to say, a deposition apparatus of another deposition method can be combined therewith. Furthermore, a plurality of deposition apparatuses described in this embodiment mode can be arranged in series, whereby an in-line deposition apparatus can be obtained.

Figure 15A:
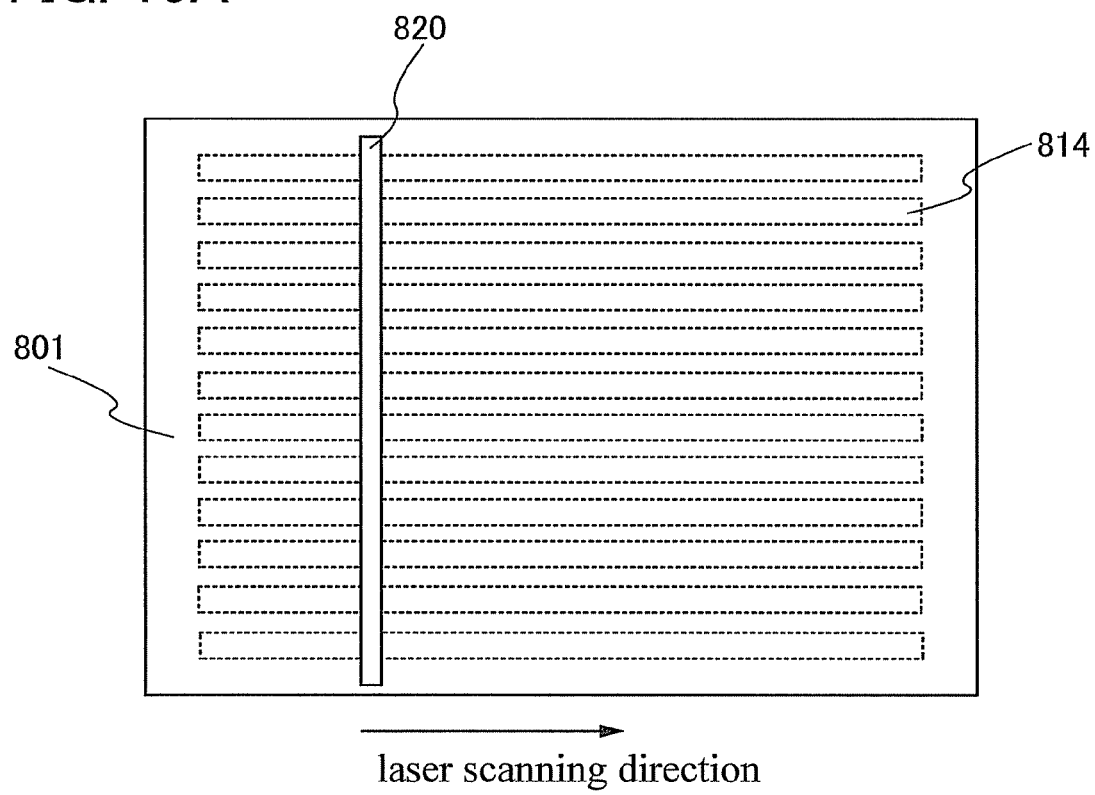
FIGS. 15A and 15B are views illustrating a deposition method of the present invention.

FIG. 15A is a top view of the deposition substrate and the deposition target substrate of FIG. 8. In FIG. 15A, laser light is shaped into a linear (or rectangular) laser spot 820 which has substantially the same length as one side of the deposition substrate so that the entire surface of the deposition substrate can be scanned with the laser light at a time.

Figure 15B:
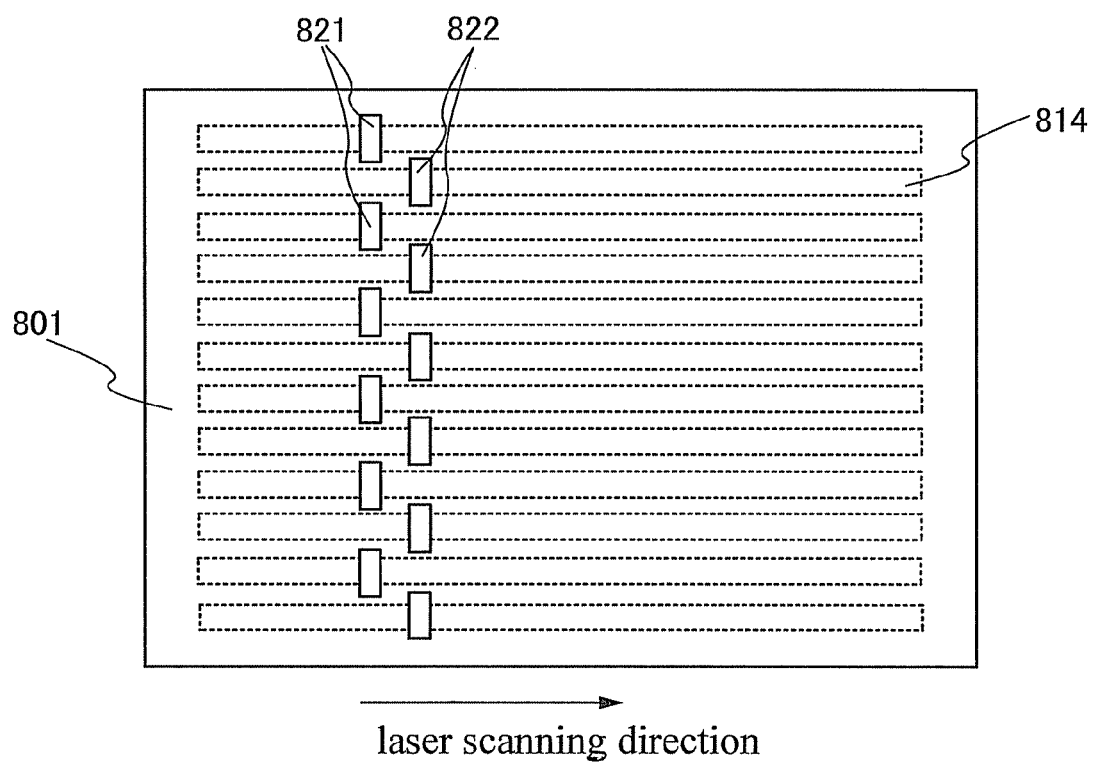

Alternatively, the laser light may be shaped into a short linear (or rectangular) shape instead of a long linear (or rectangular) shape, and a plurality of the short linear (or rectangular) laser beams may be used. For example, a laser spot which is shaped into linear or rectangular (hereinafter, referred to as a "linear laser") may have a repeating unit on an irradiation surface. FIG. 15B illustrates an example in which linear lasers are arranged in a zigzag manner on an irradiation surface. More specifically, linear lasers 821 are arranged so that every other stripe opening 814 can be irradiated with the linear laser 821. Similarly, linear lasers 822 are also arranged so that every other stripe opening 814 can be irradiated with the liner laser 822. Further, the linear lasers 821 and the linear lasers 822 are arranged so that each opening is irradiated with either the linear laser 821 or the linear laser 822. The linear lasers 821 are arranged substantially in a straight line. Similarly, the linear lasers 822 are also arranged substantially in a straight line. Then, scanning with laser light is performed in a direction which is perpendicular to the straight lines.

When laser light which is to be used for irradiation is shaped into such a shape and a region to be irradiated with laser light on an irradiation surface is scanned with the shaped laser light, there is a difference in the timing at which the adjacent openings are irradiated with the laser light. Therefore, heat in a portion which is irradiated with the laser light is diffused to a portion which is not irradiated with the laser light, so that heat discharge is possible. Accordingly, a region other than a desired region can be prevented from being excessively heated and a material can be prevented from reaching its evaporation temperature. That is, deformation of a deposition pattern can be suppressed.

Figure 16A:
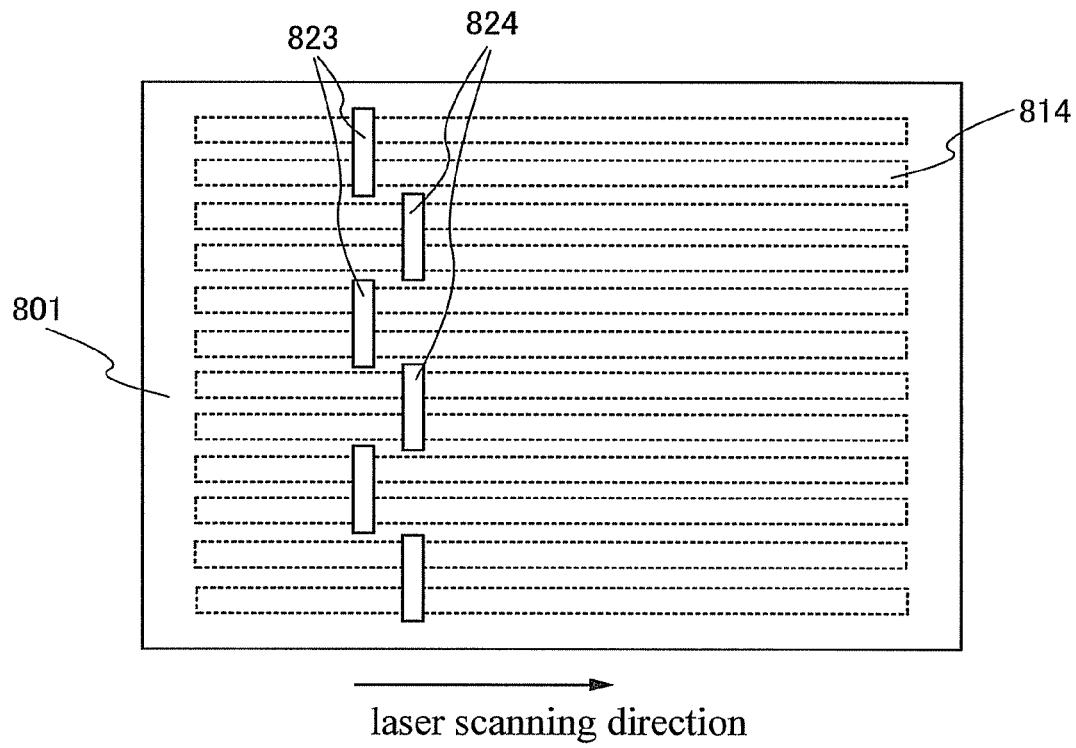
FIGS. 16A and 16B are views illustrating a deposition method of the present invention.

Note that the shape of the shaped laser light is not limited to these examples. As illustrated in FIG. 16A, the linear laser may be longer so that one linear laser can process a plurality of openings. In FIG. 16A, a linear laser 823 is shaped so that two openings can be irradiated with the linear laser 823. Similarly, a linear laser 824 is also shaped so that two openings can be irradiated with the linear laser 824.

Figure 16B:
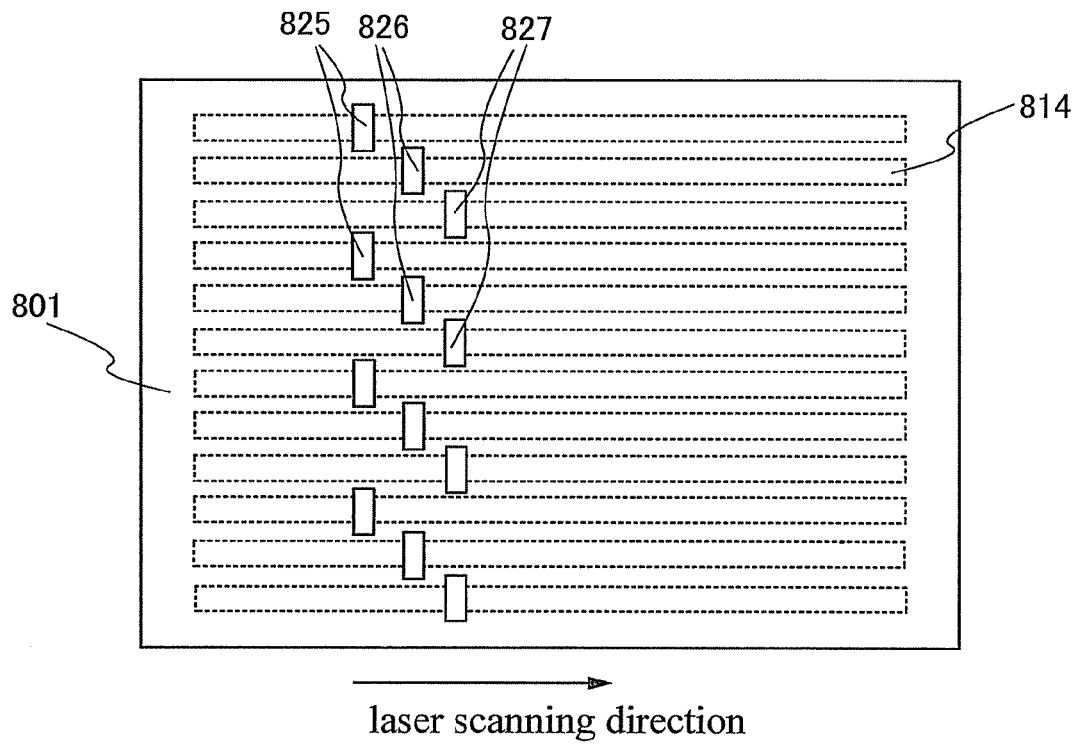

The linear lasers of the repeating unit are not limited to two, and may be three or more. For example, linear lasers may be arranged so that every third opening can be irradiated with the linear laser. In FIG. 16B, linear lasers 825 are arranged so that every third opening 814 can be irradiated with the linear laser 825. Similarly, linear lasers 826 are also arranged so that every third opening 814 can be irradiated with the linear laser 826. Further, similarly, linear lasers 827 are also arranged so that every third opening 814 can be irradiated with the linear laser 827. Further, the linear lasers 825, the linear lasers 826, and the linear lasers 827 are arranged so that each opening is irradiated with any one of the linear lasers 825, 826, and 827. Note that in the case where three or more linear lasers are arranged, a repeating unit may be determined as appropriate, other than the case illustrated in FIG. 16B.

Note that, in FIGS. 15A and 15B and FIGS. 16A and 16B, the laser scanning direction shown as an arrow means a direction in which a region to be irradiated with a laser beam on an irradiation surface moves, and the region to be irradiated with the laser beam and the substrate may be moved relatively.

A light-emitting device can be manufactured with use of such a deposition apparatus. In the present invention, when a wet process is used, a material layer over a deposition substrate can be easily prepared. In addition, the material layer over the deposition substrate may be deposited as it is, and thus a thickness monitor is not needed. Thus, a deposition process can be fully automated, which can lead to increase in throughput. Moreover, a material can be prevented from being attached to an inner wall of a deposition chamber, and thus maintenance of the deposition apparatus can be facilitated.

Further, in the case where a light-emitting device is manufactured using the deposition apparatus described in this embodiment mode, application of the present invention makes it possible to selectively deposit a film over a desired region at the time of deposition using laser light. Thus, material use efficiency can be increased and a film which is flat and has no unevenness can be deposited. Moreover, a minute pattern can be formed. Therefore, application of the present invention makes it possible to obtain a light-emitting device having excellent characteristics as well as to reduce manufacturing cost of the light-emitting device.

Note that the structure described in this embodiment mode can be combined with any structure described in Embodiment Modes 1 and 2 as appropriate.

Embodiment Mode 4

In this embodiment mode, a method for manufacturing a light-emitting element and a light-emitting device by application of the present invention will be described.

Figure 9A:
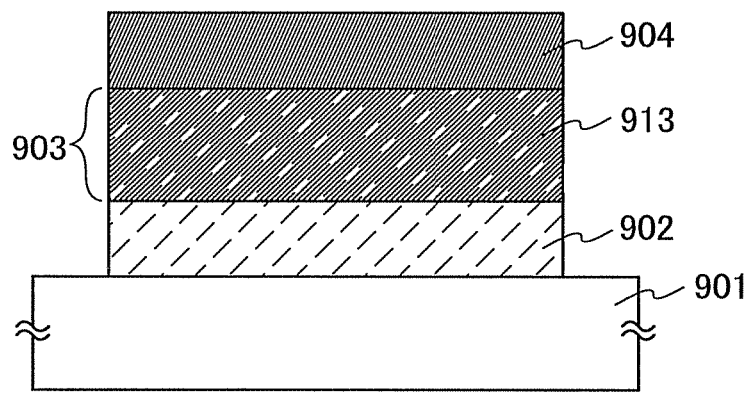
FIGS. 9A and 9B are views illustrating a light-emitting element.
Figure 9B:
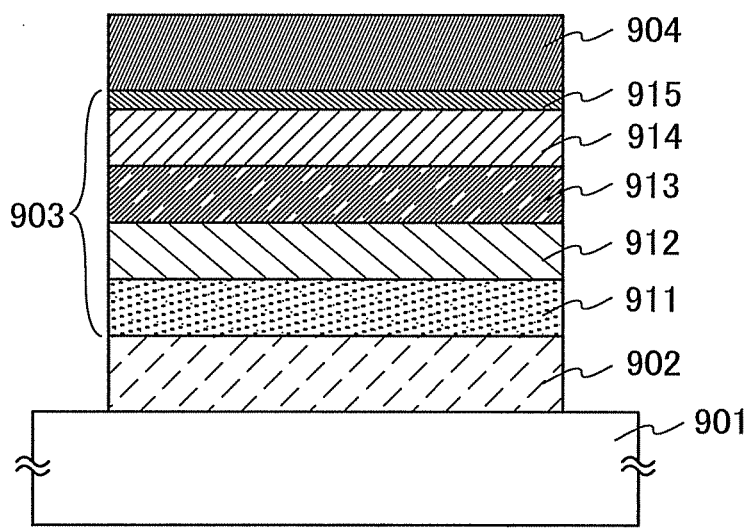

For example, light-emitting elements illustrated in FIGS. 9A and 9B can be manufactured. In the light-emitting element illustrated in FIG. 9A, a first electrode 902, an EL layer 903 which includes only a light-emitting layer 913, and a second electrode 904 are stacked in this order over a substrate 901. One of the first electrode 902 and the second electrode 904 functions as an anode, and the other functions as a cathode. Holes injected from an anode and electrons injected from a cathode are recombined in the EL layer 903, whereby light can be emitted. In this embodiment mode, the first electrode 902 functions as an anode and the second electrode 904 functions as a cathode.

In the light-emitting element illustrated in FIG. 9B, the EL layer 903 of FIG. 9A has a structure in which a plurality of layers are stacked. Specifically, a hole-injecting layer 911, a hole-transporting layer 912, the light-emitting layer 913, an electron-transporting layer 914, and an electron-injecting layer 915 are provided in this order from the first electrode 902 side. Note that the EL layer 903 functions by including at least the light-emitting layer 913 as illustrated in FIG. 9A; thus, not all the above-described layers are needed and the layer to be provided may be selected as appropriate.

As the substrate 901 illustrated in FIGS. 9A and 9B, a substrate having an insulating surface or an insulating substrate is employed. Specifically, any of a variety of glass substrates used in the electronics industry, such as an aluminosilicate glass substrate, an aluminoborosilicate glass substrate, or a barium borosilicate glass substrate; a quartz substrate; a ceramic substrate; a sapphire substrate; and the like can be used.

For the first electrode 902 and the second electrode 904, any of a variety of types of metals, alloys, electrically-conductive compounds, a mixture thereof, and the like can be used. Specifically, indium tin oxide (ITO), indium tin oxide containing silicon or silicon oxide, indium zinc oxide (IZO), indium oxide containing tungsten oxide and zinc oxide, and the like can be given, for example. Besides, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), and the like can be given.

These materials are generally formed by a sputtering method. For example, indium zinc oxide can be formed by a sputtering method using a target in which zinc oxide is added to indium oxide at 1 wt % to 20 wt %. Indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively. Alternatively, by application of a sol-gel method or the like, an inkjet method, a spin coating method, or the like may be used for the formation.

Alternatively, aluminum (Al), silver (Ag), an alloy containing aluminum, or the like can be used. Alternatively, an element belonging to Group 1 or Group 2 of the periodic table, which has a low work function, that is, an alkali metal such as lithium (Li) or cesium (Cs), an alkaline earth metal such as magnesium (Mg), calcium (Ca), or strontium (Sr), and an alloy thereof (an alloy of aluminum, magnesium, and silver, and an alloy of aluminum and lithium); a rare earth metal such as europium (Eu) or ytterbium (Yb), and an alloy thereof, and the like.

A film of an alkali metal, an alkaline earth metal, or an alloy containing the metal can be formed by a vacuum evaporation method. Alternatively, a film of an alloy containing an alkali metal or an alkaline earth metal can be formed by a sputtering method. Further alternatively, a film can be formed using a silver paste or the like by an ink-jet method or the like. Each of the first electrode 902 and the second electrode 904 is not limited to a single-layer film and can be formed as a stacked-layer film.

Note that in order to extract light emitted from the EL layer 903 to the outside, one or both of the first electrode 902 and the second electrode 904 is/are formed so as to transmit light. For example, one or both of the first electrode 802 and the second electrode 904 is/are formed using a conductive material having a light-transmitting property, such as indium tin oxide, or formed using silver, aluminum, or the like to a thickness of several nanometers to several tens of nanometers. Alternatively, the first electrode 902 or the second electrode 904 can have a stacked-layer structure including a thin film of a metal such as silver or aluminum and a thin film of a conductive material having a light-transmitting property, such as ITO.

Note that the EL layer 903 (the hole-injecting layer 911, the hole-transporting layer 912, the light-emitting layer 913, the electron-transporting layer 914, or the electron-injecting layer 915) of the light-emitting element described in this embodiment mode can be formed by application of the deposition method described in Embodiment Mode 1. In addition, the electrode can also be formed by application of the deposition method described in Embodiment Mode 1.

For example, in the case where the light-emitting element illustrated in FIG. 9A is formed, a material layer of the deposition substrate described in Embodiment Mode 1 is formed using a material which forms the EL layer 903, and the EL layer 903 is formed over the first electrode 902 over the substrate 901 using the deposition substrate. Then, the second electrode 904 is formed over the EL layer 903, whereby the light-emitting element illustrated in FIG. 9A can be obtained.

Any of a variety of materials can be used for the light-emitting layer 913. For example, a fluorescent compound which emits fluorescence or a phosphorescent compound which emits phosphorescence can be used.

As a phosphorescent compound which can be used for the light-emitting layer 913, the following light-emitting material can be given. For example, as a light-emitting material for blue emission, there are bis[2-(4',6'-difluorophenyl)pyridinato-N,$C^{2'}$]iridium(III)tetrakis(1-pyrazolyl)borate (FIr6), bis[2-(4',6'-difluorophenyl)pyridinato-N,$C^{2'}$]iridium(III)picolinate (FIrpic), bis[2-(3',5'-bistrifluoromethylphenyl)pyridinato-N,$C^{2'}$]iridium(III)picolinate (Ir(CF$_3$ppy)$_2$(pic)), bis([2-(4',6'-difluorophenyl)pyridinato-N,$C^{2'}$]iridium(III) acetylacetonate (FIracac), and the like. As a light-emitting material for green emission, there are tris(2-phenylpyridinato-N,$C^{2'}$)iridium(III) (Ir(Ppy)$_3$), bis(2-phenylpyridinato-N,$C^{2'}$)iridium(III) acetylacetonate (Ir(ppy)$_2$(acac)), bis(1,2-diphenyl-1H-benzimidazolato)iridium(III) acetylacetonate (Ir(pbi)$_2$(acac)), bis(benzo[h]quinolinato)iridium(III) acetylacetonate (Ir(bzq)$_2$(acac)), and the like. As a light-emitting material for yellow emission, there are bis(2,4-diphenyl-1,3-oxazolato-N,$C^{2'}$)iridium(III) acetylacetonate (Ir(dpo)$_2$(acac)), bis[2-(4'-(perfluorophenylphenyl)pyridinato]iridium(III) acetylacetonate (Ir(p-PF-ph)$_2$(acac)), bis(2-phenylbenzothiazolato-N,$C^{2'}$)iridium(III) acetylacetonate (Ir(bt)$_2$(acac)), and the like. As a light-emitting material for orange emission, there are tris(2-phenylquinolinato-N,$C^{2'}$)iridium(III) (Ir(pq)$_3$), bis(2-phenylquinolinato-N,$C^{2'}$)iridium(III) acetylacetonate (Ir(pq)$_2$(acac)), and the like. As a light-emitting material for red emission, there are organic metal complexes such as bis[2-(2'-benzo[4,5-α]thienyl)pyridinato-N,$C^{3'}$]iridium(III) acetylacetonate (Ir(btp)$_2$(acac)), bis(1-phenylisoquinolinato-N,$C^{2'}$)iridium(III) acetylacetonate (Ir(piq)$_2$(acac), (acetylacetonato)bis[2,3-bis(4-fluorophenyl)quinoxalinato]iridium(III) (Ir(Fdpq)$_2$(acac)), and 2,3,7,8,12,13,17,18-octaethyl-21H,23H-porphine platinum(II) (PtOEP). In addition, rare earth metal complexes such as tris(acetylacetonato)(monophenanthroline)terbium(III) (Tb(acac)$_3$(Phen)), tris(1,3-diphenyl-1,3-propanedionato)(monophenanthroline)europium(III) (Eu(DBM)$_3$(Phen)), and tris[1-(2-thenoyl)-3,3,3-trifluoroacetonato](monophenanthroline)europium(III) (Eu(TTA)$_3$(Phen)) perform light emission from a rare earth metal ion (electron transition between different multiplicities); therefore, such rare earth metal complexes can be used as phosphorescent compounds.

As a fluorescent compound which can be used for the light-emitting layer 913, the following light-emitting material can be given. For example, as a light-emitting material for blue emission, there are N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), and the like. As a light-emitting material for green emission, there are N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), N-(9,10-diphenyl-2-anthryl)-N,N',N'-triphenyl-1,4-phenylenediamine 2DPAPA), N-[9,10-bis(1,1'-biphenyl-2-yl)-2-anthryl]-N,N',N'-triphenyl-1,4-phenylenediamine (2DPABPhA), 9,10-bis(1,1'-biphenyl-2-yl)]-N-[4-(9H-carbazol-9-yl)phenyl]-N-phenylanthracen-2-amine (2YGABPhA), N,N,9-triphenylanthracen-9-amine (DPhAPhA), and the like. As a light-emitting material for yellow emission, there are rubrene, 5,12-bis(1,1'-biphenyl-4-yl)-6,11-diphenyltetracene (BPT), and the like. As a light-emitting material for red emission, there are N,N,N',N'-tetrakis(4-methylphenyl)tetracene-5,11-diamine (p-mPhTD), 7,13-diphenyl-N,N,N',N'-tetrakis(4-methylphenyl)acenaphtho[1,2-a]fluoranthene-3,10-diamine (p-mPhAFD), and the like.

Alternatively, the light-emitting layer 913 can have a structure in which a substance having a high light-emitting property (a dopant material) is dispersed in another substance (a host material). The use of the structure in which a substance having a high light-emitting property (a dopant material) is dispersed in another substance (a host material) makes it possible to suppress crystallization of the light-emitting layer. Moreover, concentration quenching due to high concentration of a substance having a high light-emitting property can be suppressed.

As the substance in which a substance having a high light-emitting property is dispersed, in the case where the substance having a high light-emitting property is a fluorescent compound, a substance having singlet excitation energy (the energy difference between a ground state and a singlet excited state) which is higher than the fluorescent compound is preferably used. In addition, in the case where the substance having a high light-emitting property is a phosphorescent compound, a substance having triplet excitation energy (the energy difference between a ground state and a triplet excited state) which is higher than the phosphorescent compound is preferably used.

As the host material used for the light-emitting layer 913, for example, there are 4,4'-di(9-carbazolyl)biphenyl (CBP), 2-tert-butyl-9,10-di(2-naphthyl)anthracene (t-BuDNA), 9-[4-(9-carbazolyl)phenyl]-10-phenylanthracene (CzPA), and the like as well as 4,4'-bis[N-(1-naphthyl)-N-phenylamino]biphenyl (NPB), tris(8-quinolinolato)aluminum(III) (Alq), 4,4'-bis[N-(9,9-dimethylfluoren-2-yl)-N-phenylamino]biphenyl (DFLDPBi), bis(2-methyl-8-quinolinolato)(4-phenylphenolato)aluminum(III) (BAlq), and the like.

As the dopant material, any of the above-described phosphorescent compounds or fluorescent compounds can be used.

In the case where the light-emitting layer 913 has a structure in which a substance having a high light-emitting property (a dopant material) is dispersed in another substance (a host material), a mixed layer of a host material and a guest material is formed as the material layer over the deposition substrate. Alternatively, the material layer over the deposition substrate may have a structure in which a layer containing a host material and a layer containing a dopant material are stacked. Formation of the light-emitting layer 913 by use of a deposition substrate with the material layer having such a structure, the light-emitting layer 913 contains a substance in which a light-emitting material is dispersed (a host material) and a substance having a high light-emitting property (a dopant material), and has a structure in which the substance having a high light-emitting property (a dopant material) is dispersed in the substance in which a light-emitting material is dispersed (a host material). Note that for the light-emitting layer 913, two or more kinds of host materials and a dopant material may be used, or two or more kinds of dopant materials and a host material may be used. Alternatively, two or more kinds of host materials and two or more kinds of dopant materials may be used.

In the case where the light-emitting element illustrated in FIG. 9B is formed, the deposition substrate described in Embodiment Mode 1 which has a material layer formed using a material for forming each layer in the EL layer 903 (the hole-injecting layer 911, the hole-transporting layer 912, the electron-transporting layer 914, and the electron-injecting layer 915) is prepared for each layer, and deposition of each layer is performed using a different deposition substrate by the method described in Embodiment Mode 1, whereby the EL layer 903 is formed over the first electrode 902 over the substrate 901. Then, the second electrode 904 is formed over the EL layer 903; thus, the light-emitting element illustrated in FIG. 9B can be obtained. Note that, although all the layers in the EL layer 903 can be formed by the method described in Embodiment Mode 1 in this case, only some of the layers in the EL layer 903 may be formed by the method described in Embodiment Mode 1.

For example, the hole-injecting layer 911 can be formed using molybdenum oxide, vanadium oxide, ruthenium oxide, tungsten oxide, manganese oxide, or the like. Alternatively, the hole-injecting layer 911 can be formed using a phthalocyanine-based compound such as phthalocyanine ($H_2Pc$) or copper phthalocyanine (CuPc), a high molecule such as poly (3,4-ethylenedioxythiophene)/poly(styrenesulfonic acid) (PEDOT/PSS), or the like.

As the hole-injecting layer 911, a layer which contains a substance having a high hole-transporting property and a substance having an electron-accepting property can be used. The layer which contains a substance having a high hole-transporting property and a substance having an electron-accepting property has high carrier density and an excellent hole-injecting property. The layer which contains a substance having a high hole-transporting property and a substance having an electron-accepting property is used as a hole-injecting layer which is in contact with an electrode which functions as an anode, whereby any of a variety of kinds of metals, alloys, electrically-conductive compounds, a mixture thereof, and the like can be used for the electrode regardless of the magnitude of work function of a material of the electrode which functions as an anode.

The layer which contains a substance having a high hole-transporting property and a substance having an electron-accepting property can be formed using, for example, a deposition substrate having a material layer in which a layer containing a substance having a high hole-transporting property and a layer containing a substance having an electron-accepting property are stacked.

As the substance having an electron-accepting property, which is used for the hole-injecting layer 911, 7,7,8,8-tetracyano-2,3,5,6-tetrafluoroquinodimethane (F4-TCNQ), chloranil, and the like can be given. In addition, a transition metal oxide can be given. Moreover, oxides of metals belonging to Group 4 to Group 8 can be given. Specifically, vanadium oxide, niobium oxide, tantalum oxide, chromium oxide, molybdenum oxide, tungsten oxide, manganese oxide, and rhenium oxide are preferable because of their high electron-accepting properties. Above all, molybdenum oxide is particularly preferable because it is stable even in the atmospheric air, has a low hygroscopic property, and is easy to be handled.

As the substance having a high hole-transporting property used for the hole-injecting layer 911, any of a variety of compounds such as an aromatic amine compound, a carbazole derivative, an aromatic hydrocarbon, and a high molecular compound (such as oligomer, dendrimer, and polymer) can be used. Note that it is preferable that the substance having a high hole-transporting property used for the hole-injecting layer be a substance having a hole mobility of greater than or equal to $10^{-6}$ cm$^2$/Vs. However, substances other than those may be used as long as the hole-transporting properties thereof are higher than the electron-transporting properties thereof. Specific examples of the substance having a high hole-transporting property, which can be used for the hole-injecting layer 911, are given below.

As the aromatic amine compound which can be used for the hole-injecting layer 911, for example, the following can be used: 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4,4',4"-tris(N,N-diphenylamino)triphenylamine (TDATA), 4,4',4"-tris[N-(3-methylphenyl)-N-phenylamino]triphenylamine (MTDATA), 4,4'-bis[N-(spiro-9,9'-bifluoren-2-yl)-N-phenylamino]biphenyl (BSPB), or the like. In addition, the following can be given: N,N'-bis(4-methylphenyl)(p-tolyl)-N,N-diphenyl-p-phenylenediamine (DTDPPA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino)biphenyl (DNTPD), 1,3,5-tris[N-(4-diphenylaminophenyl)-N-phenylamino]benzene (DPA3B), and the like.

As the carbazole derivative which can be used for the hole-injecting layer 911, the following can be specifically given: 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), and the like.

In addition, as the carbazole derivative which can be used for the hole-injecting layer 911, the following can be given: 4,4'-di(N-carbazolyl)biphenyl (CBP), 1,3,5-tris[4-(N-carbazolyl)phenyl]benzene (TCPB), 9-[4-(10-phenyl-9-anthryl)phenyl]-9H-carbazole (CzPA), 1,4-bis[4-(N-carbazolyl)phenyl]-2,3,5,6-tetraphenylbenzene, and the like.

As the aromatic hydrocarbon which can be used for the hole-injecting layer 911, the following can be given, for example: 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)anthracene (DNA), 9,10-diphenylanthracene (DPAnth), 2-tert-butylanthracene (t-BuAnth), 9,10-bis(4-methyl-1-naphthyl)anthracene (DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. In addition, pentacene, coronene, and the like can also be used. As described above, an aromatic hydrocarbon having a hole mobility of greater than or equal to $1 \times 10^{-6}$ cm$^2$/Vs and having 14 to 42 carbon atoms is preferably used.

The aromatic hydrocarbon which can be used for the hole-injecting layer 911 may have a vinyl skeleton. As the aromatic hydrocarbon which has a vinyl skeleton, for example, 4,4'-bis(2,2-diphenylvinyl)biphenyl (DPVBi), 9,10-bis[4-(2,2-diphenylvinyl)phenyl]anthracene (DPVPA), and the like can be given.

The hole-injecting layer 911 can be formed using a deposition substrate having a material layer in which a layer containing the above-described substance having a high hole-transporting property and a layer containing the above-described substance having an electron-accepting property are stacked. In the case of using metal oxide as the substance having an electron-accepting property, it is preferable that a layer containing metal oxide be formed after forming the layer containing a substance having a high hole-transporting property over the first substrate 901. This is because, in many cases, the evaporation temperature of metal oxide is higher than that of a substance having a high hole-transporting property. The deposition substrate with such a structure makes it possible to efficiently deposit a substance having a high hole-transporting property and metal oxide. In addition, local non-uniformity of the concentration in a deposited film can be suppressed. Moreover, there are few kinds of solvents which allow both a substance having a high hole-transporting property and metal oxide to be dissolved or dispersed therein, and a mixed solution is not easily formed. Therefore, it is difficult to directly form a mixed layer by a wet process. However, the use of the deposition method of the present invention makes it possible to easily form a mixed layer which contains a substance having a high hole-transporting property and metal oxide.

Moreover, the layer which contains a substance having a high hole-transporting property and a substance having an electron-accepting property has not only an excellent hole-injecting property but also an excellent hole-transporting property; thus, the above-described hole-injecting layer 911 may be used as a hole-transporting layer.

The hole-transporting layer 912 contains a substance having a high hole-transporting property. As the substance having a high hole-transporting property, for example, an aromatic amine compound such as 4,4'-bis[N-(1-naphthyl)-N-phenylamino]biphenyl (NPB or α-NPD), N,N'-bis(3-methylphenyl)-N,N-diphenyl-[1,1'-biphenyl]-4,4'-diamine (TPD), 4,4',4"-tris(N,N-diphenylamino)triphenylamine (TDATA), 4,4',4"-tris[N-(3-methylphenyl)-N-phenylamino] triphenylamine (MTDATA), or 4,4'-bis[N-(spiro-9,9'-bifluoren-2-yl)-N-phenylamino]biphenyl (BSPB), or the like can be used. The substances described here are mainly substances having a hole mobility of greater than or equal to $10^{-6}$ cm$^2$/Vs. However, substances other than those may be used as long as the hole-transporting properties thereof are higher than the electron-transporting properties thereof. Note that the layer which contains a substance having a high hole-transporting property is not limited to a single layer, but two or more layers each of which is formed using the above-described substance may be stacked.

The electron-transporting layer 914 contains a substance having a high electron-transporting property. As the substance having a high electron-transporting property, for example, a metal complex having a quinoline skeleton or a benzoquinoline skeleton, such as tris(8-quinolinolato)aluminum (Alq); tris(4-methyl-8-quinolinolato)aluminum (Almq$_3$); bis(10-hydroxybenzo[h]quinolinato)beryllium (BeBq$_2$), or bis(2-methyl-8-quinolinolato)(4-phenylphenolato)aluminum (BAlq) can be used. Alternatively, a metal complex having an oxazole-based ligand or a thiazole-based ligand, such as bis[2-(2-hydroxyphenyl)benzoxazolato]zinc (Zn(BOX)$_2$) or bis[2-(2-hydroxyphenyl)benzothiazolato] zinc (Zn(BTZ)$_2$) can be used. Further alternatively, besides the metal complexes, 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ01), bathophenanthroline (BPhen), bathocuproine (BCP), or the like can be used. The substances described here are mainly substances having an electron mobility of greater than or equal to $10^{-6}$ cm$^2$/Vs. Note that substances other than those may be used as long as the electron-transporting properties thereof are higher than the hole-transporting properties thereof. In addition, the electron-transporting layer is not limited to a single layer, but two or more layers each of which is formed using the above-described substance may be stacked.

As the electron-injecting layer 915, a compound of an alkali metal or an alkaline earth metal such as lithium fluoride (LiF), cesium fluoride (CsF), or calcium fluoride (CaF2) can be used. Alternatively, a layer in which a substance having an electron-transporting property is combined with an alkali metal or an alkaline earth metal can be used. For example, a layer made of Alq in which magnesium (Mg) is contained can be used. Note that it is preferable that the layer in which a substance having an electron-transporting property is combined with an alkali metal or an alkaline earth metal be used as the electron-injecting layer 915 because electrons are efficiently injected from the second electrode 904.

Note that there is no particular limitation on a stacked-layer structure of the EL layer 903. The EL layer 903 may be formed by an appropriate combination of a light-emitting layer with any of layers which contain a substance having a high electron-transporting property, a substance having a high hole-transporting property, a substance having a high electron-injecting property, a substance having a high hole-injecting property, a bipolar substance (a substance having a high electron-transporting property and a high hole-transporting property), and the like.

Light emission from the EL layer 903 is extracted to the outside through one or both of the first electrode 902 and the second electrode 904. Therefore, one or both of the first electrode 902 and the second electrode 904 is/are an electrode having a light-transmitting property. When only the first electrode 902 is an electrode having a light-transmitting property, light is extracted from the substrate 901 side through the first electrode 902. When only the second electrode 904 is an electrode having a light-transmitting property, light is extracted from a side opposite to the substrate 901 through the second electrode 904. When both the first electrode 902 and the second electrode 904 are electrodes having light-transmitting properties, light is extracted from both the substrate 901 side and the side opposite thereto through the first electrode 902 and the second electrode 904, respectively.

Note that, although FIGS. 9A and 9B illustrate the structure in which the first electrode 902 which functions as an anode is provided on the substrate 901 side, the second electrode 904 which functions as a cathode may be provided on the substrate 901 side.

The EL layer 903 is formed by the deposition method described in Embodiment Mode 1 or may be formed by a combination of the deposition method described in Embodiment Mode 1 with another deposition method. In addition, a different deposition method may be used for each layer. As a dry process, a vacuum evaporation method, an electron beam evaporation method, a sputtering method, and the like are given. As a wet process, an ink-jet method, a spin coating method, and the like are given.

In a light-emitting element according to this embodiment mode, an EL layer to which the present invention is applied can be formed. Accordingly, a highly accurate film can be formed efficiently. Therefore, not only can characteristics of the light-emitting element be improved, but also yield can be increased and cost can be reduced.

Embodiment Mode 5

In this embodiment mode, a light-emitting device which is formed using the light-emitting element described in Embodiment Mode 4 will be described.

First, a passive-matrix light-emitting device will be described with reference to FIGS. 10A to 10C and FIG. 11.

In a passive-matrix (also referred to as "simple-matrix") light-emitting device, a plurality of anodes arranged in stripes (in strip form) are provided to be perpendicular to a plurality of cathodes arranged in stripes, and a light-emitting layer is interposed at each intersection. Therefore, a pixel at an intersection portion of an anode which is selected (to which voltage is applied) and a cathode which is selected emits light.

Figure 10A:
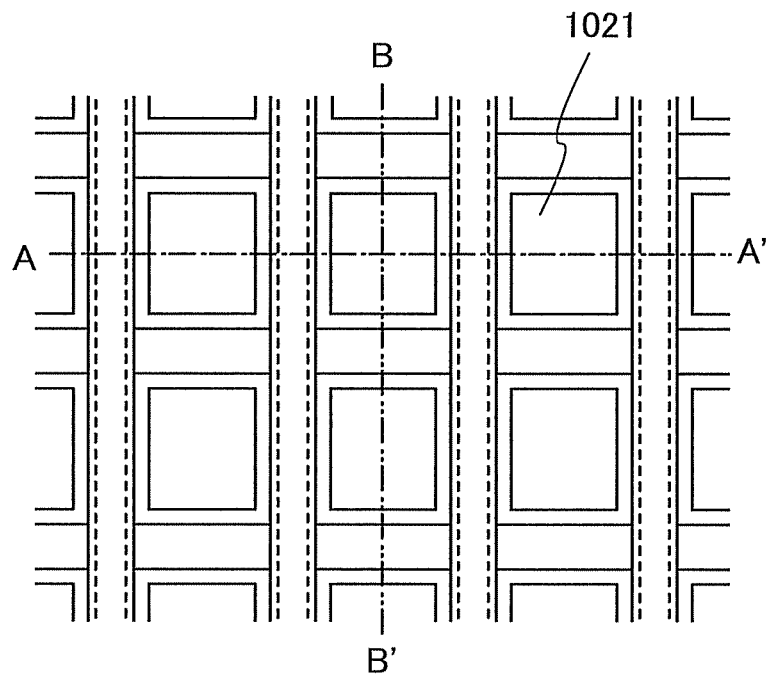
FIGS. 10A to 10C are views illustrating a passive matrix light-emitting device.
Figure 10C:
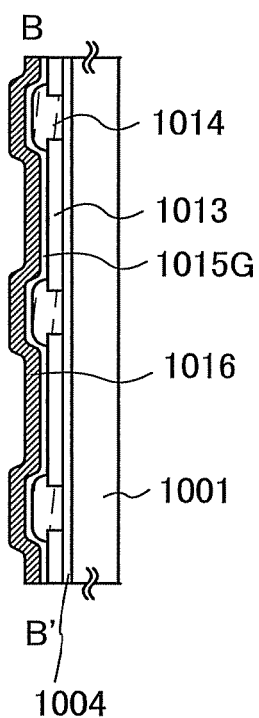
Figure 10B:
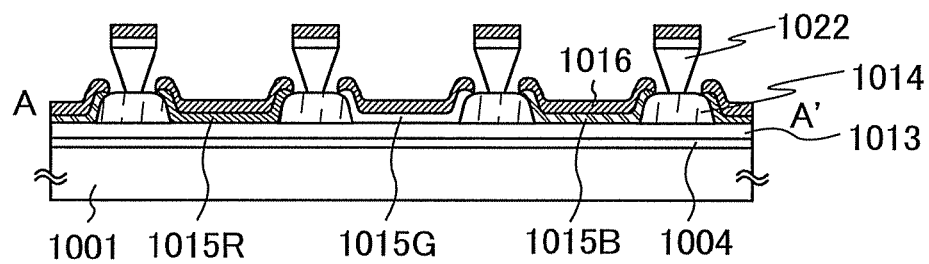

FIG. 10A is a top-plan view of a pixel portion before sealing. FIG. 10B is a cross-sectional view taken along a dashed line A-A' in FIG. 10A. FIG. 10C is a cross-sectional view taken along a dashed line B-B' in FIG. 10A.

Over a substrate 1001, an insulating layer 1004 is formed as a base insulating layer. Note that the base insulating layer is not necessarily formed if not necessary. Over the insulating layer 1004, a plurality of first electrodes 1013 are arranged in stripes at regular intervals. A partition wall 1014 having openings each corresponding to a pixel is provided over the first electrodes 1013. The partition wall 1014 having openings is formed using an insulating material (a photosensitive or a nonphotosensitive organic material (e.g., polyimide, acrylic, polyamide, polyimide amide, resist, or benzocyclobutene) or an SOG film (e.g., an SiOx film containing an alkyl group)). Note that the openings each corresponding to a pixel serve as light-emitting regions 1021.

Over the partition wall 1014 having openings, a plurality of inversely-tapered partition walls 1022 parallel to each other are provided to intersect with the first electrodes 1013. The inversely-tapered partition walls 1022 are formed by a photolithography method using a positive-type photosensitive resin of which a portion unexposed to light remains as a pattern, and by adjustment of the amount of light exposure or the length of development time so that a lower part of a pattern is etched more.

The total thickness of the partition wall 1014 having openings and the inversely-tapered partition wall 1022 is set to be larger than the total thickness of an EL layer and a second electrode 1016. Accordingly, an EL layer which is divided into plural regions, specifically, an EL layer (R) (1015R) formed using a material for red emission, an EL layer (G) (1015G) formed using a material for green emission, and an EL layer (B) (1015B) formed using a material for blue emission; and the second electrodes 1016 are formed. Note that the plurality of divided regions are electrically isolated from one another.

The second electrodes 1016 are electrodes in stripes, which are parallel to one another and extend along a direction intersecting with the first electrodes 1013. Note that a plurality of stacked-layers each including the EL layer and a part of conductive layer forming the second electrode 1016 are also formed over the inversely-tapered partition walls 1022; however, they are separated from the EL layer (R) (1015R), the EL layer (G) (1015G), the EL layer (B) (1015B), and the second electrodes 1016. Note that the EL layer in this embodiment mode is a layer including at least a light-emitting layer and may include a hole-injecting layer, a hole-transporting layer, an electron-transporting layer, an electron-injecting layer, or the like in addition to the light-emitting layer.

Here, an example is described in which the EL layer (R) (1015R), the EL layer (G) (1015G), and the EL layer (B) (1015B) are selectively formed to manufacture a light-emitting device which provides three kinds of light emission (red (R), green (G), blue (B)) and is capable of performing full color display. Note that the EL layer (R) (1015R), the EL layer (G) (1015G), and the EL layer (B) (1015B) are formed into stripes parallel to one another. These EL layers may be formed by the deposition methods described in Embodiment Modes 1 and 2.

Further, if necessary, the light-emitting device is sealed using a sealant such as a sealing can or a glass substrate for sealing. Here, a glass substrate is used as a sealing substrate, and a substrate and the sealing substrate are attached to each other with use of an adhesive such as a sealing material to seal a space surrounded by the adhesive such as a sealing material. The space which is hermetically sealed is filled with a filler or a dried inert gas. In addition, a desiccant or the like may be put between the substrate and the sealant so that reliability of the light-emitting device is increased. The desiccant removes a minute amount of moisture, whereby sufficient desiccation is performed. For the desiccant agent, a substance which adsorbs moisture by chemical adsorption, such as oxide of alkaline earth metal such as calcium oxide or barium oxide can be used. Note that a substance which adsorbs moisture by physical adsorption, such as zeolite or silica gel may be used alternatively.

Note that the desiccant is not necessarily provided if the sealant which covers and is contact with the light-emitting element is provided to sufficiently block the outside air.

Figure 11:
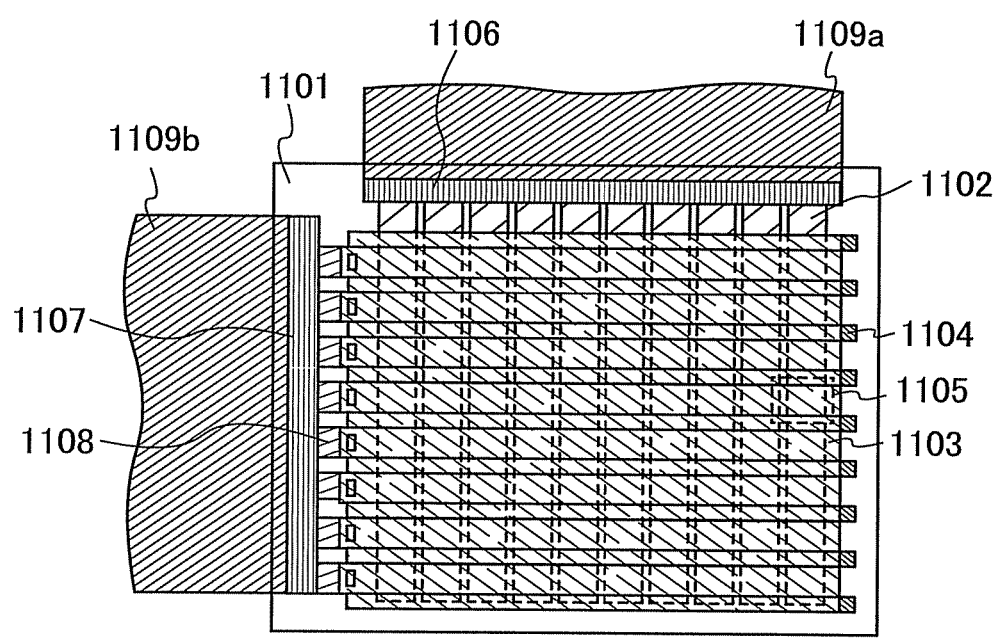
FIG. 11 is a view illustrating a passive matrix light-emitting device.

Next, FIG. 11 is a top view of the case where the passive-matrix light-emitting device illustrated in FIGS. 10A to 10C is mounted with an FPC or the like.

As illustrated in FIG. 11, in a pixel portion forming an image display, scanning lines and data lines are arranged to intersect with each other so that the scanning lines and the data lines are perpendicular to each other.

Here, the first electrodes 1013 in FIGS. 10A to 10C correspond to scanning lines 1103 in FIG. 11; the second electrodes 1016 in FIGS. 10A to 10C correspond to data lines 1102 in FIG. 11; and the inversely-tapered partition walls 1022 correspond to partition walls 1104. EL layers are interposed between the data lines 1102 and the scanning lines 1103, and an intersection portion indicated by a region 1105 corresponds to one pixel.

Note that the scanning lines 1103 are electrically connected at their ends to connecting wirings 1108, and the connecting wirings 1108 are connected to an FPC 1109b via an input terminal 1107. The data lines 1102 are connected to an FPC 1109a via an input terminal 1106.

If necessary, a polarizing plate, a circularly polarizing plate (including an elliptically polarizing plate in its category), a retardation plate (a quarter-wave plate or a half-wave plate), or an optical film such as a color filter may be provided as appropriate over a light-emitting surface. Further, a polarizing plate or a circularly polarizing plate may be provided with an anti-reflection film. For example, anti-glare treatment can be performed, by which reflected light can be diffused by projections and depressions of a surface, thereby reducing reflection.

Although FIG. 11 illustrates the example in which a driver circuit is not provided over the substrate, the present invention is not particularly limited to this example. An IC chip including a driver circuit may be mounted on the substrate.

In the case where an IC chip is mounted, a data line side IC and a scanning line side IC, in each of which a driver circuit for transmitting a signal to the pixel portion is formed, are mounted on the periphery of (outside of) the pixel portion by a COG method. The mounting may be performed using TCP or a wire bonding method other than the COG method. TCP is a method in which an IC is mounted onto a TAB tape, where a TAB tape is connected to a wiring on an element formation substrate and an IC is mounted onto the TAB tape. Each of the data line side IC and the scanning line side IC may be formed using a silicon substrate, or may be formed by formation of a driver circuit with a TFT over a glass substrate, a quartz substrate, or a plastic substrate. Although described here is an example in which a single IC is provided on one side, a plurality of divided ICs may be provided on one side.

Figure 12A:
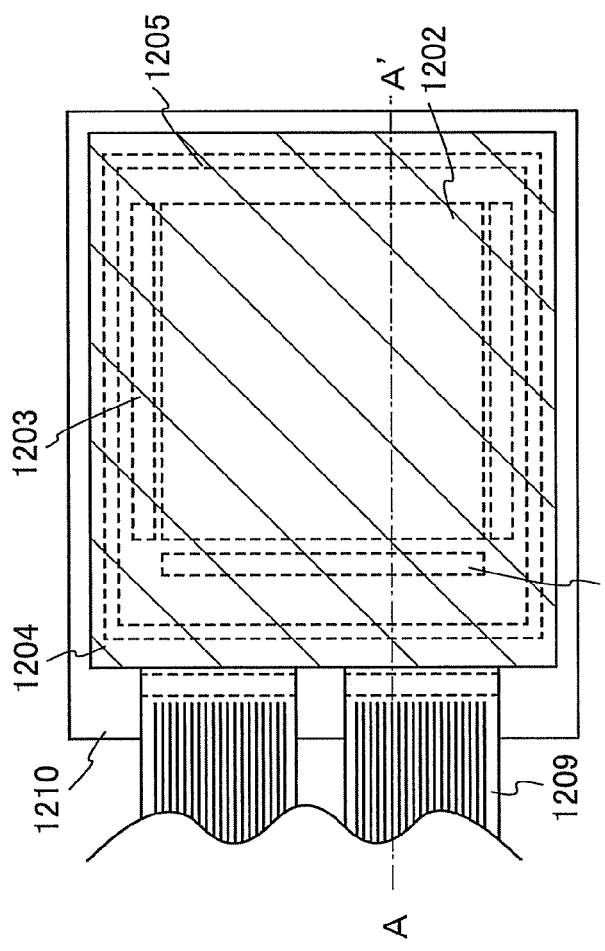
FIGS. 12A and 12B are views illustrating an active matrix light-emitting device.
Figure 12B:
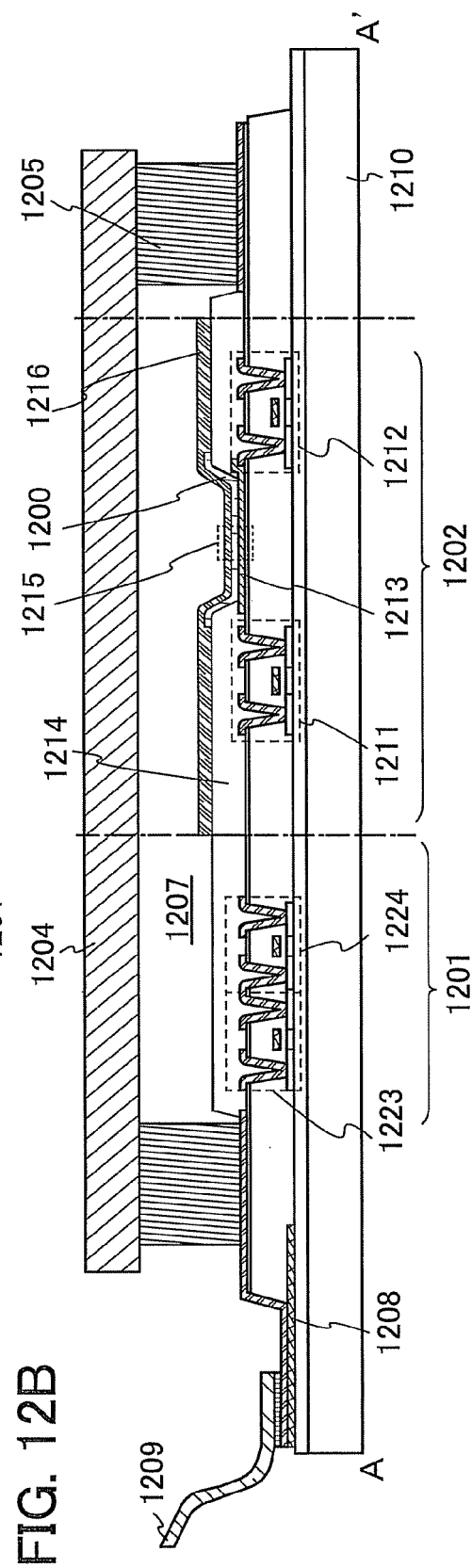

Next, an example of an active-matrix light-emitting device is described with reference to FIGS. 12A and 12B. Note that FIG. 12A is a top view illustrating a light-emitting device and FIG. 12B is a cross-sectional view taken along a chain line A-A' in FIG. 12A. The active matrix light-emitting device according to this embodiment mode includes a pixel portion 1202 provided over an element substrate 1210, a driver circuit portion (a source side driver circuit) 1201, and a driver circuit portion (a gate side driver circuit) 1203. The pixel portion 1202, the driver circuit portion 1201, and the driver circuit portion 1203 are sealed, with a sealing material 1205, between the element substrate 1210 and a sealing substrate 1204.

In addition, over the element substrate 1210, a lead wiring 1208 for connecting an external input terminal which transmits a signal (e.g., a video signal, a clock signal, a start signal, or a reset signal) or an electric potential to the driver circuit portion 1201 and the driver circuit portion 1203 is provided. Here, an example is described in which a flexible printed circuit (FPC) 1209 is provided as the external input terminal. Note that, although only the FPC is illustrated here, this FPC may be provided with a printed wiring board (PWB). The light-emitting device in this specification refers to not only a light-emitting device itself but also a light-emitting device provided with an FPC or a PWB.

Next, a cross-sectional structure thereof is described with reference to FIG. 12B. The driver circuit portions and the pixel portion are formed over the element substrate 1210; however, the pixel portion 1202 and the driver circuit portion 1201 which is the source-side driver circuit are illustrated in FIG. 12B.

An example is illustrated in which a CMOS circuit which is the combination of an n-channel TFT 1223 and a p-channel TFT 1224 is formed in the driver circuit portion 1201. Note that a circuit included in the driver circuit portion may be formed using various CMOS circuits, PMOS circuits, or NMOS circuits. Although a driver integrated type in which the driver circuit is formed over the substrate is described in this embodiment mode, the driver circuit may not necessarily be formed over the substrate, and the driver circuit can be formed outside, not over the substrate.

The pixel portion 1202 includes a plurality of pixels, each of which includes a switching TFT 1211, a current-controlling TFT 1212, and a first electrode 1213 which is electrically connected to a wiring (a source electrode or a drain electrode) of the current-controlling TFT 1212. Note that an insulator 1214 is formed so as to cover an end portion of the first electrode 1213. In this embodiment mode, the insulator 1214 is formed using a positive photosensitive acrylic resin.

The insulator 1214 is preferably formed so as to have a curved surface with curvature at an upper end portion or a lower end portion thereof in order to obtain favorable coverage by a film which is to be stacked over the insulator 1214. For example, in the case of using a positive photosensitive acrylic resin as a material for the insulator 1214, the insulator 1214 is preferably formed so as to have a curved surface with a curvature radius (0.2 µm to 3 µm) at the upper end portion thereof. Either a negative photosensitive material which becomes insoluble in an etchant by light irradiation or a positive photosensitive material which becomes soluble in an etchant by light irradiation can be used for the insulator 1214. As the insulator 1214, without limitation to an organic compound, either an organic compound or an inorganic compound such as silicon oxide or silicon oxynitride can be used.

An EL layer 1200 and a second electrode 1216 are stacked over the first electrode 1213. Note that when an ITO film is used as the first electrode 1213, and a stacked film of a titanium nitride film and a film containing aluminum as its main component or a stacked film of a titanium nitride film, a film containing aluminum as its main component, and a titanium nitride film is used as a wiring of the current-controlling TFT 1212 which is connected to the first electrode 1213, resistance of the wiring is low and favorable ohmic contact with the ITO film can be obtained. Note that, although not illustrated here, the second electrode 1216 is electrically connected to the FPC 1209 which is an external input terminal.

In the EL layer 1200, at least the light-emitting layer is provided, and in addition to the light-emitting layer, a hole-injecting layer, a hole-transporting layer, an electron-transporting layer, or an electron-injecting layer is provided as appropriate. The first electrode 1213, the EL layer 1200, and the second electrode 1216 are stacked, whereby a light-emitting element 1215 is formed.

In addition, although the cross-sectional view of FIG. 12B illustrates only one light-emitting element 1215, a plurality of light-emitting elements are arranged in matrix in the pixel portion 1202. Light-emitting elements which provide three kinds of light emissions (R, G, and B) are selectively formed in the pixel portion 1202, whereby a light-emitting device which is capable of full color display can be manufactured. Alternatively, a light-emitting device which is capable of full color display may be manufactured by a combination with color filters.

Furthermore, the sealing substrate 1204 and the element substrate 1210 are attached to each other with the sealing material 1205, whereby the light-emitting element 1215 is provided in a space 1207 surrounded by the element substrate 1210, the sealing substrate 1204, and the sealing material 1205. Note that there is also a case where the space 1207 is filled with the sealing material 1205 as well as an inert gas (such as nitrogen or argon).

Note that an epoxy resin is preferably used for the sealing material 1205. Further, it is preferable that the material transmits as little moisture or oxygen as possible. As the sealing substrate 1204, a plastic substrate formed using FRP (fiber-glass-reinforced plastics), PVF (polyvinyl fluoride), a polyester film, polyester, acrylic, or the like can be used instead of a glass substrate or a quartz substrate.

As described above, the light-emitting device can be obtained by application of the present invention. Since TFTs are manufactured in an active matrix light-emitting device, manufacturing cost per light-emitting device tends to be high; however, applying the present invention makes it possible to drastically reduce loss of materials at the time of formation of light-emitting elements. Thus, manufacturing cost can be reduced.

Application of the present invention makes it possible to easily form an EL layer included in a light-emitting element and also to easily manufacture a light-emitting device including the light-emitting element. In addition, a film which is flat and has no unevenness and a minute pattern can be formed; thus, a high-definition light-emitting device can be obtained.

Note that a structure described in this embodiment mode can be combined with a structure in any of Embodiment Modes 1 to 4 as appropriate.

Embodiment Mode 6

In this embodiment mode, a variety of electronic devices each of which is completed using a light-emitting device manufactured by application of the present invention will be described with reference to FIGS. 13A to 13E.

As examples of electronic devices to which the light-emitting device according to the present invention is applied, there are televisions, cameras such as video cameras or digital cameras, goggle type displays (head-mounted displays), navigation systems, audio reproduction devices (e.g., car audio systems and audio systems), laptop computers, game machines, portable information terminals (e.g., mobile computers, cellular phones, portable game machines, and e-book readers), image reproduction devices in which a recording medium is provided (devices which are capable of reproducing recording media such as digital versatile discs (DVDs) and equipped with a display device which can display the image), lighting equipment, and the like. Specific examples of these electronic devices are illustrated in FIGS. 13A to 13E.

Figure 13A:
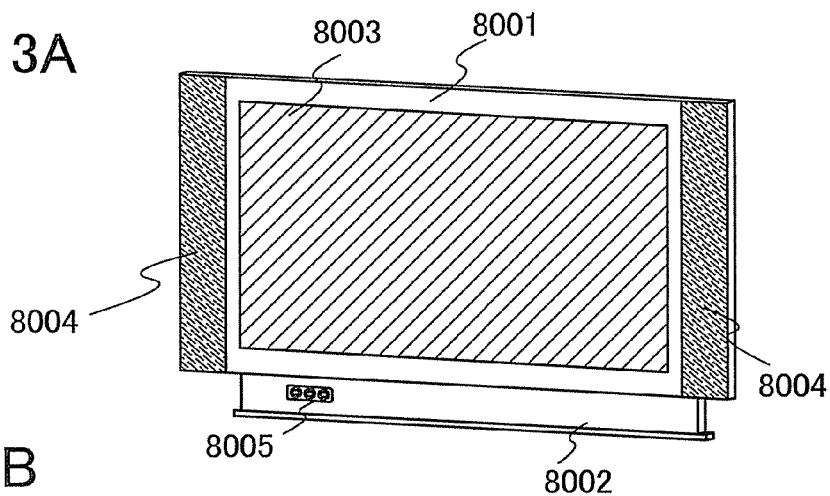
FIGS. 13A to 13E are diagrams illustrating electronic devices.

FIG. 13A illustrates a display device, which includes a housing 8001, a supporting base 8002, a display portion 8003, a speaker portion 8004, video input terminals 8005, and the like. The display device is manufactured using a light-emitting device, which is formed according to the present invention, in the display portion 8003. Note that the display device includes all devices for displaying information in its category, for example, devices for personal computers, for receiving TV broadcasting, and for displaying an advertisement. Application of the present invention makes it possible to achieve increase in use efficiency of a material and increase in manufacturing efficiency mainly in a deposition process of a light-emitting device. Accordingly, manufacturing cost can be reduced and productivity can be improved in manufacturing a display device; thus, an inexpensive display device can be provided.

Figure 13B:
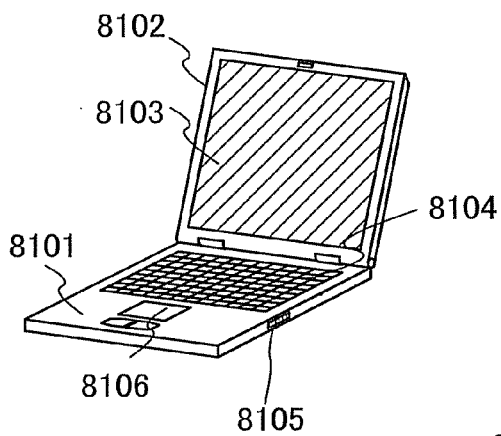

FIG. 13B illustrates a computer, which includes a main body 8101, a housing 8102, a display portion 8103, a keyboard 8104, an external connecting port 8105, a pointing device 8106, and the like. The computer is manufactured using a light-emitting device, which is formed according to the present invention, in the display portion 8103. Application of the present invention makes it possible to achieve increase in use efficiency of a material and increase in manufacturing efficiency mainly in a deposition process of a light-emitting device. Accordingly, manufacturing cost can be reduced and productivity can be improved in manufacturing a computer; thus, an inexpensive computer can be provided.

Figure 13C:
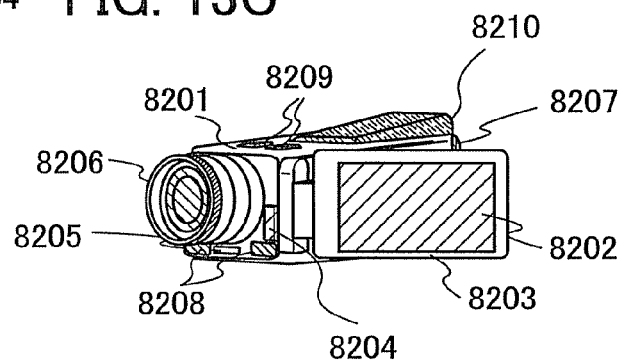

FIG. 13C illustrates a video camera, which includes a main body 8201, a display portion 8202, a housing 8203, an external connection port 8204, a remote control receiving portion 8205, an image receiving portion 8206, a battery 8207, an audio input portion 8208, operation keys 8209, an eyepiece portion 8210, and the like. The video camera is manufactured using a light-emitting device, which is formed according to the present invention, in the display portion 8202. Application of the present invention makes it possible to achieve increase in material use efficiency and increase in manufacturing efficiency mainly in a deposition process of a light-emitting device. Accordingly, manufacturing cost can be reduced and productivity can be improved in manufacturing a video camera; thus, an inexpensive video camera can be provided.

Figure 13D:
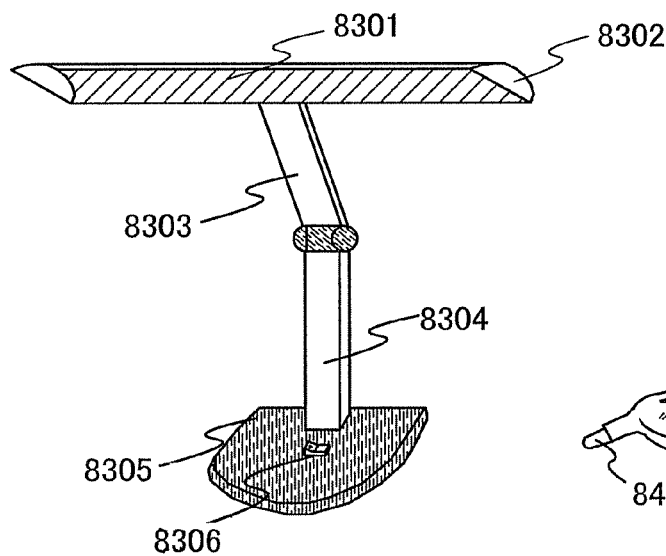

FIG. 13D illustrates desk lighting equipment, which includes a lighting portion 8301, a shade 8302, an adjustable arm 8303, a support 8304, a base 8305, and a power supply 8306. The desk lighting equipment is manufactured using a light-emitting device, which is formed according to the present invention, in the lighting portion 8301. Application of the present invention makes it possible to achieve increase in material use efficiency and increase in manufacturing efficiency mainly in a deposition process of a light-emitting device. Accordingly, manufacturing cost can be reduced and productivity can be improved in manufacturing desk lighting equipment; thus, an inexpensive desk lighting equipment can be provided.

Figure 13E:
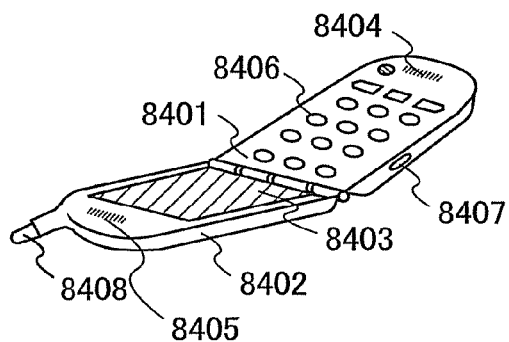

FIG. 13E illustrates a cellular phone, which includes a main body 8401, a housing 8402, a display portion 8403, an audio input portion 8404, an audio output portion 8405, operation keys 8406, an external connection port 8407, an antenna 8408, and the like. The cellular phone is manufactured using a light-emitting device, which is formed according to the present invention, in the display portion 8403. Application of the present invention makes it possible to achieve increase in material use efficiency and increase in manufacturing efficiency mainly in a deposition process of a light-emitting device. Accordingly, manufacturing cost can be reduced and productivity can be improved in manufacturing a cellular phone; thus, an inexpensive cellular phone can be provided.

Figure 14A:
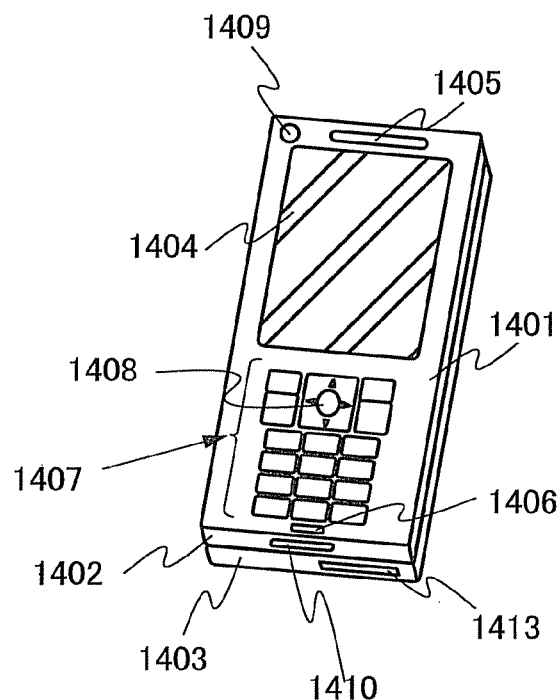
FIGS. 14A to 14C are diagram illustrating an electronic device.
Figure 14B:
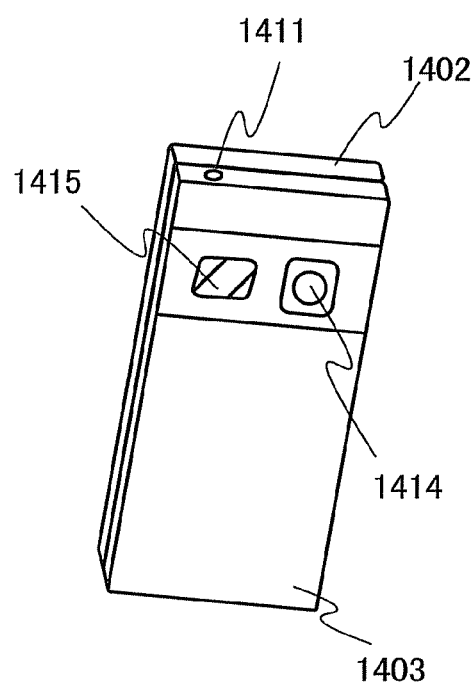
Figure 14C:
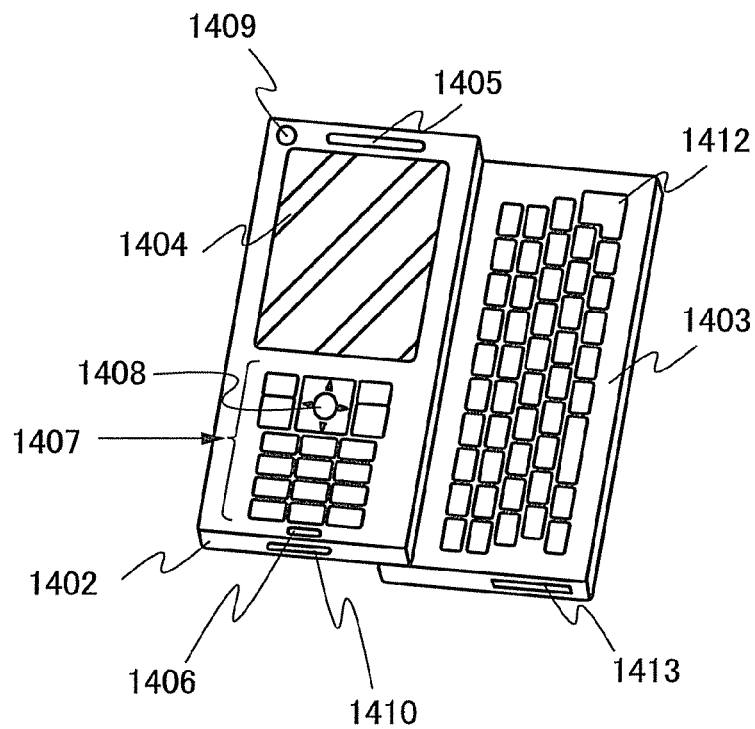

FIGS. 14A to 14C also illustrate a cellular phone. FIG. 14A is a front view, FIG. 14B is a rear view, and FIG. 14C is a development view. A main body 1401 has both functions of a cellular phone and a portable information terminal, and incorporates a computer; thus, the cellular phone is a so-called smartphone which is capable of a variety of data processing in addition to voice calls.

The main body 1401 has two housing: a housing 1402 and a housing 1403. The housing 1402 includes a display portion 1404, a speaker 1405, a microphone 1306, operation keys 1407, a pointing device 1408, a camera lens 1409, an external connection terminal 1410, an earphone terminal 1411, and the like, while the housing 1403 includes a keyboard 1412, an external memory slot 1413, a camera lens 1414, a light 1415, and the like. In addition, an antenna is incorporated in the housing 1402.

In addition to the above-described structure, a wireless IC ship, a small-size memory device, or the like may be incorporated therein.

In the display portion 1404, the light-emitting device described in the above embodiment mode can be incorporated, and a display direction changes as appropriate depending on a use mode. Since the camera lens 1409 is provided in the same plane as the display portion 1404, the mobile phone can be used as a videophone. Further, a still image and a moving image can be taken with the camera lens 1414 and the light 1415 using the display portion 1404 as a viewfinder. The speaker 1405 and the microphone 1406 can be used for video calls, recording and playing sound, and the like without being limited to voice calls.

The operation keys 1407 are capable of being used for incoming and outgoing calls, simple input of information such as e-mail, scroll of a screen, cursor motion, and the like. Furthermore, the housings 1402 and 1403 which overlap with each other (FIG. 14A) slide and can be developed as illustrated in FIG. 14C, so that the cellular phone can be used as a portable information terminal. In this case, smooth operation is possible with use of the keyboard 1412 and the pointing device 1408. The external connection terminal 1410 can be connected to an AC adaptor and various types of cables such as a USB cable, so that charging and data communication with a personal computer or the like are possible. Furthermore, a large amount of data can be stored and moved with a recording medium inserted into the external memory slot 1413.

Moreover, the cellular phone may be equipped with an infrared communication function, a television receiving function, and the like, in addition to the above-described functions Note that the above-described cellular phone is manufactured using a light-emitting device, which is formed according to the present invention, in the display portion 1404. Application of the present invention makes it possible to achieve increase in material use efficiency and increase in manufacturing efficiency mainly in a deposition process of a light-emitting device. Accordingly, manufacturing cost can be reduced and productivity can be improved in manufacturing a cellular phone; thus, an inexpensive cellular phone can be provided.

As described above, electronic devices or lighting equipment can be obtained by application of the light-emitting device according to the present invention. The application range of the light-emitting device according to the present invention is so wide that the light-emitting device can be applied to electronic devices in a variety of fields.

Note that a structure described in this embodiment mode can be combined with a structure in any of Embodiment Modes 1 to 5 as appropriate.

Embodiment 1

In this embodiment, a case where a deposition substrate is irradiated with various types of laser light to perform deposition over a deposition target substrate will be described.

<Manufacture of Deposition Substrate A>

Figure 17A:
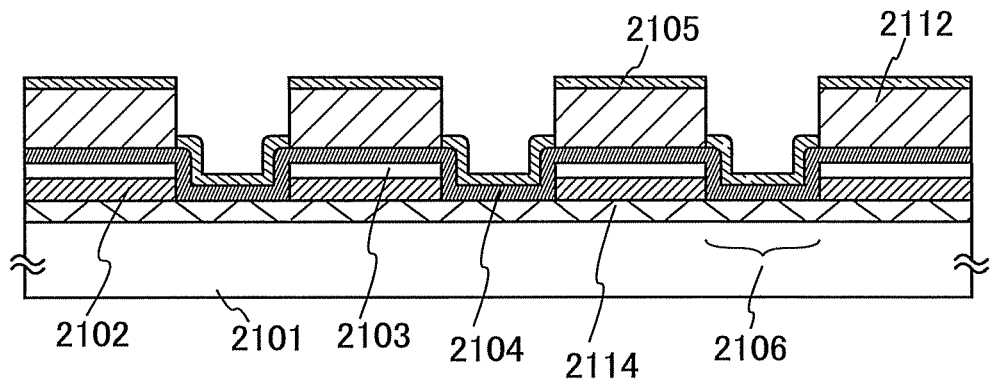
FIGS. 17A to 17C are views illustrating Embodiment.

FIG. 17A illustrates a structure of a deposition substrate A. First, a silicon oxynitride film was formed, as a base film 2114, to have a thickness of 100 nm over a glass substrate 2101 (thickness: 0.7 mm). Note that the silicon oxynitride film is a film in which the amount of oxygen is higher than that of nitrogen.

Aluminum (Al) was formed, as a reflective layer 2102, to have a thickness of 300 nm over the base film 2114. Then, silicon oxide was formed, as a heat-insulating layer 2103, to have a thickness of 100 nm over the reflective layer 2102. After that, an opening 2106 was formed in the heat-insulating layer 2103 and the reflective layer 2102 by etching. As illustrated in FIG. 17C, the size of the opening 2106 was set 21.5 µm×72 µm. Then, titanium (Ti) was formed, as a light-absorbing layer 2104, to have a thickness of 200 nm over the entire surface. Furthermore, silicon oxide was formed, as a second heat-insulating layer 2112, to have a thickness of 600 nm in a region corresponding to the reflective layer 2102 (a region which is not over the opening 2106 of the reflective layer 2102). After that, tris(8-quinolinolato)aluminum(III) (Alq) was formed, as a material layer 2105, to have a thickness of 50 nm over the heat-insulating layer 2112 and the light-absorbing layer 2104. Accordingly, the deposition substrate A was manufactured.

<Manufacture of Deposition Substrate B>

Figure 17B:
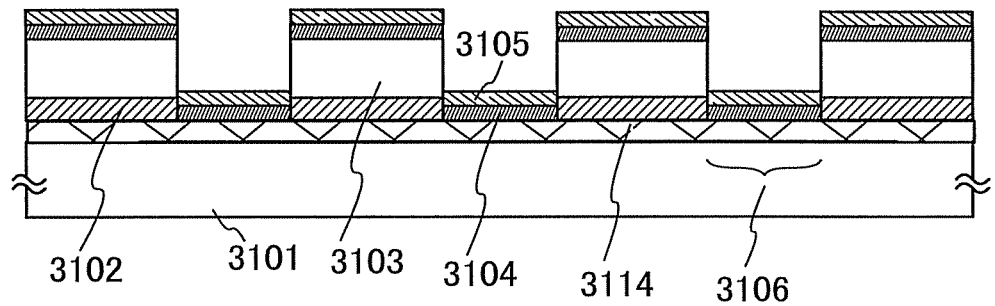
Figure 17C:
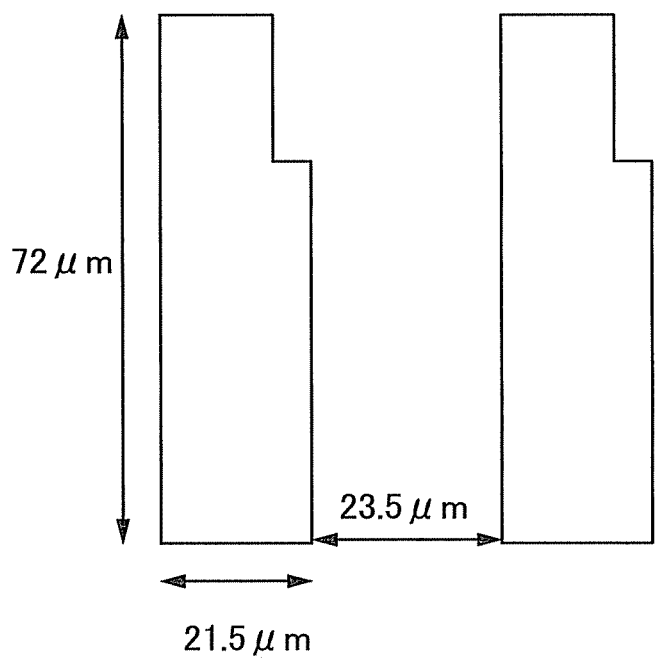
Figure 19:
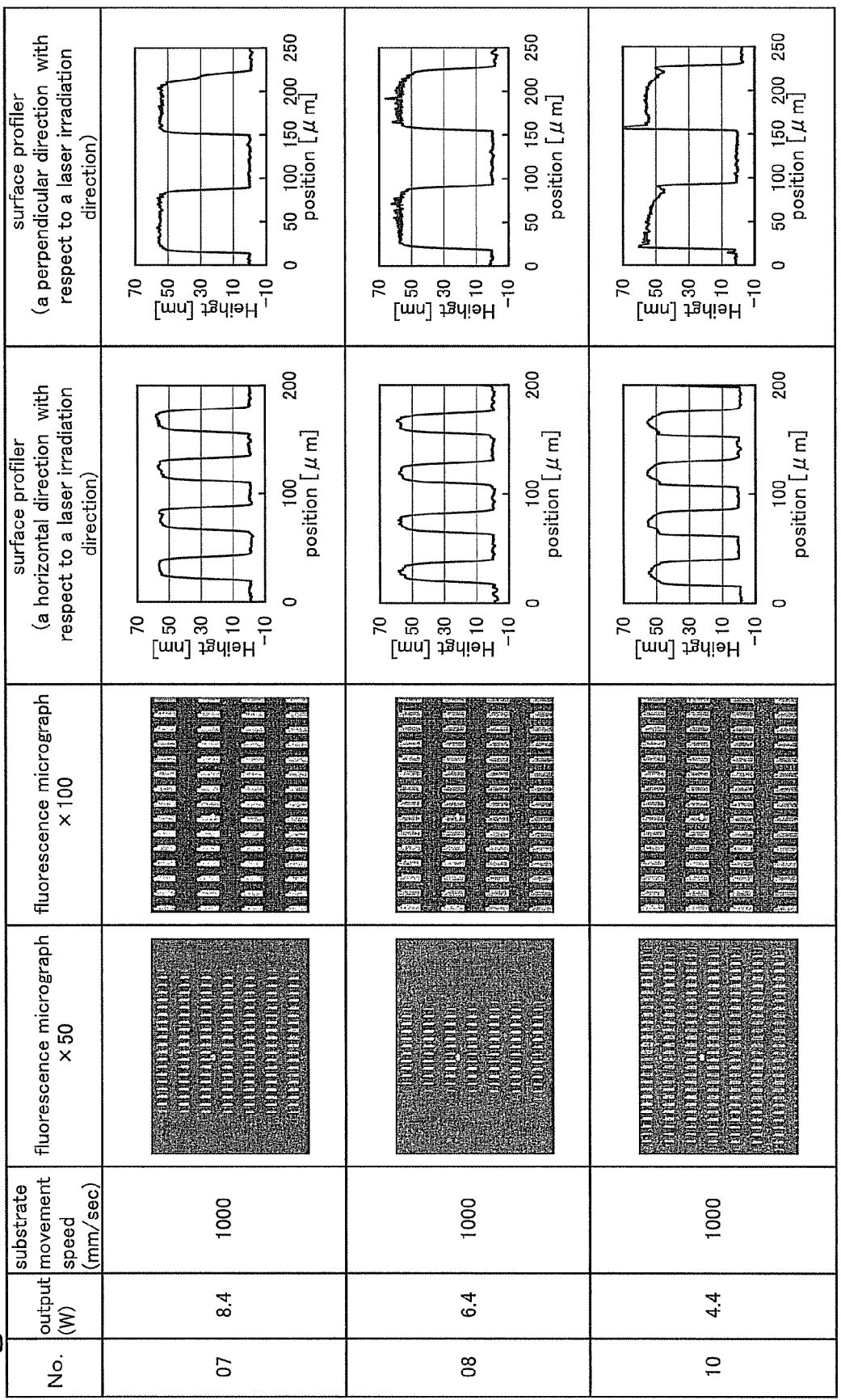
FIG. 19 is a view showing measurement results of Embodiment.
Figure 21:
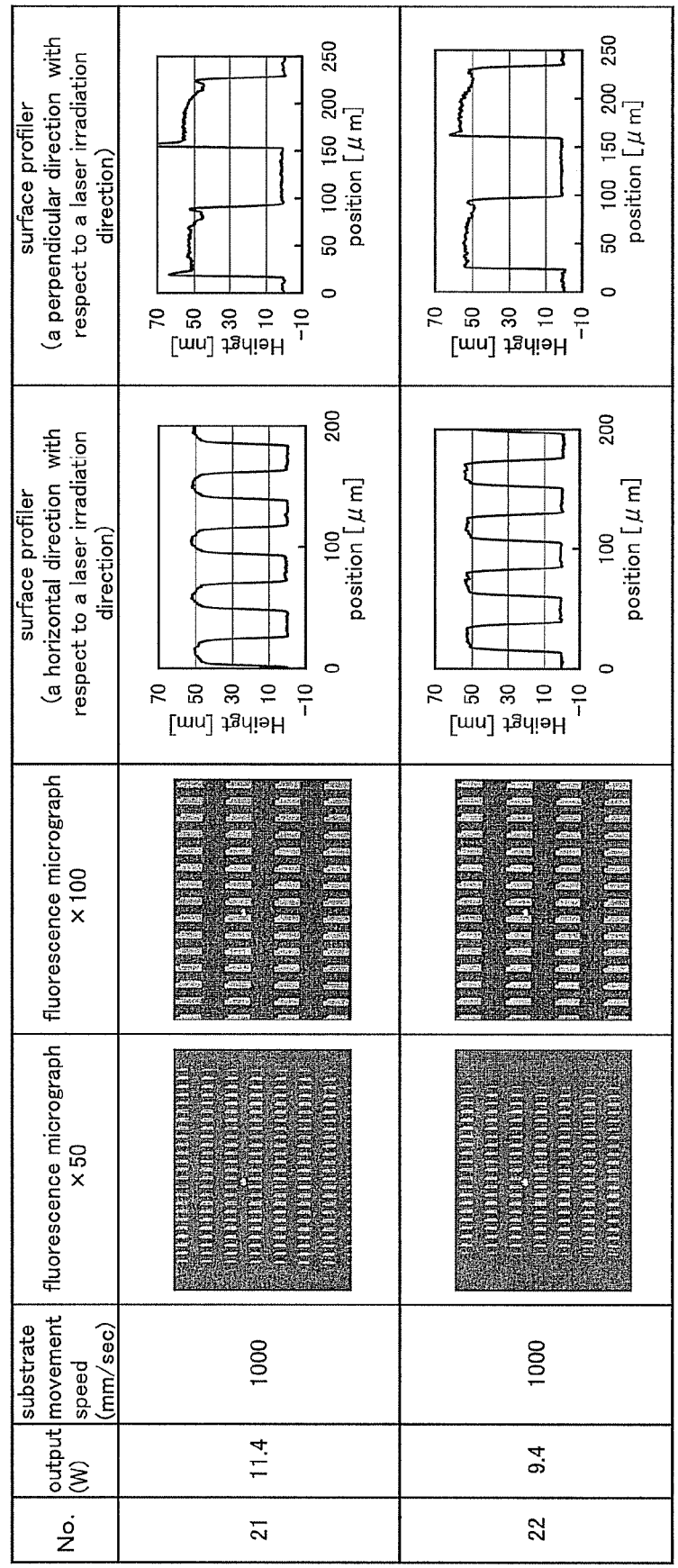
FIG. 21 is a view showing measurement results of Embodiment.
Figure 22:
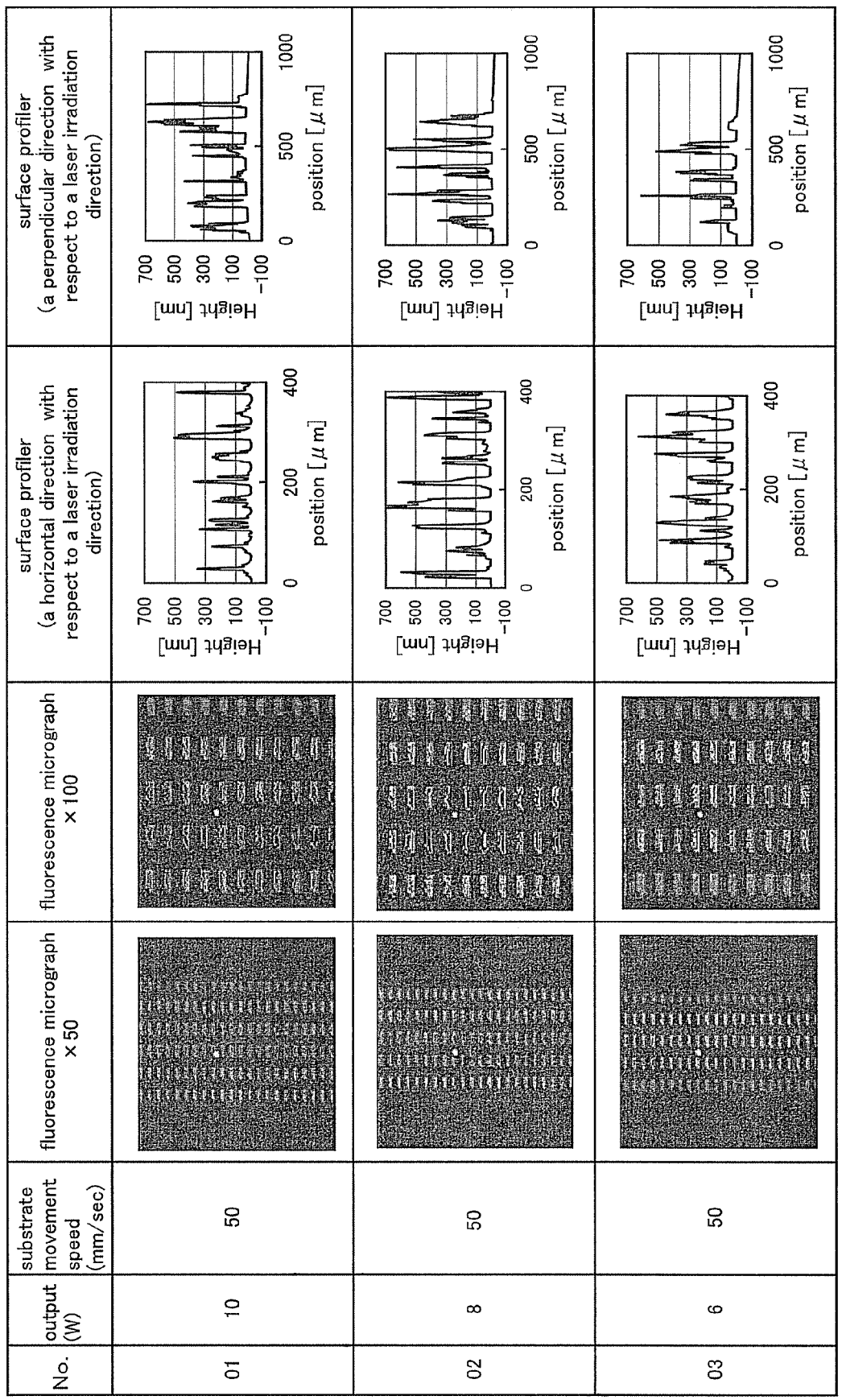
FIG. 22 is a view showing measurement results of Embodiment.
Figure 23:
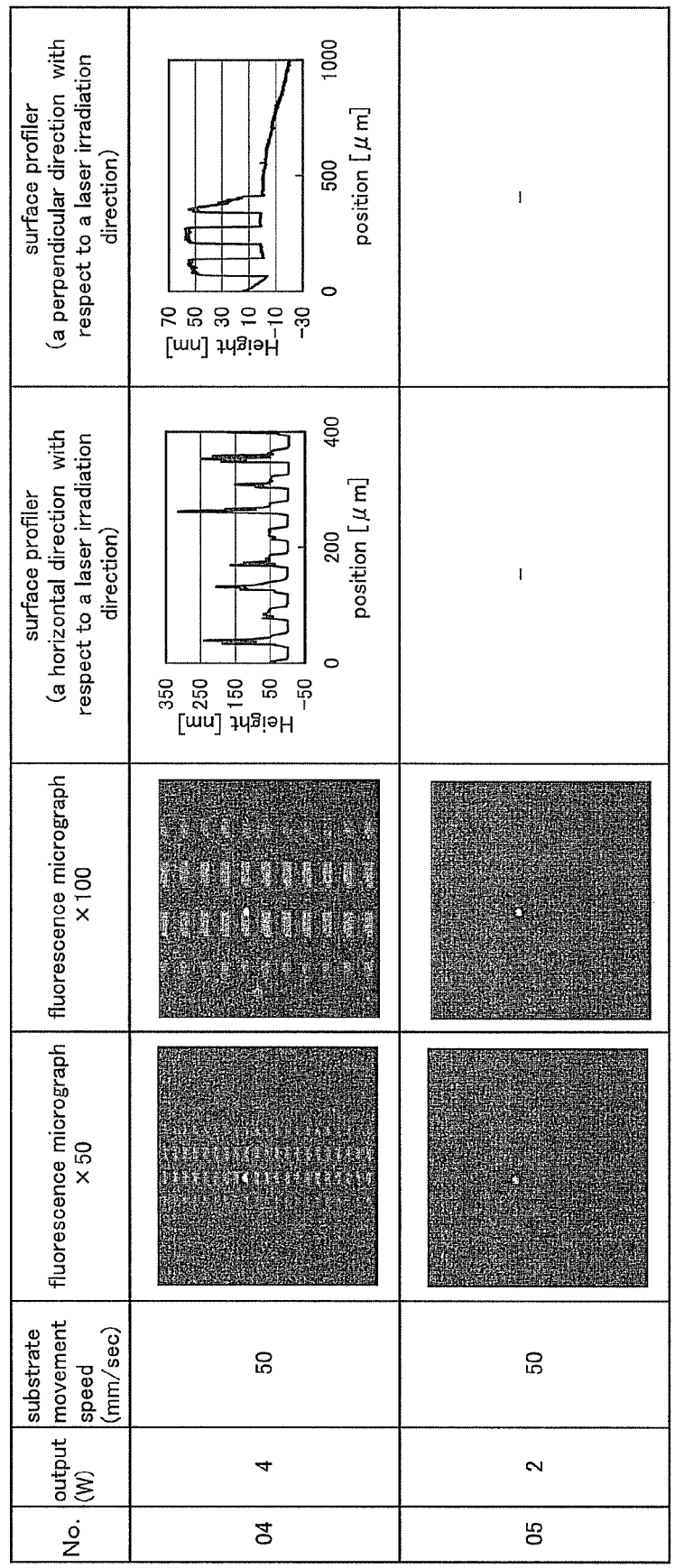
FIG. 23 is a view showing measurement results of Embodiment.
Figure 24:
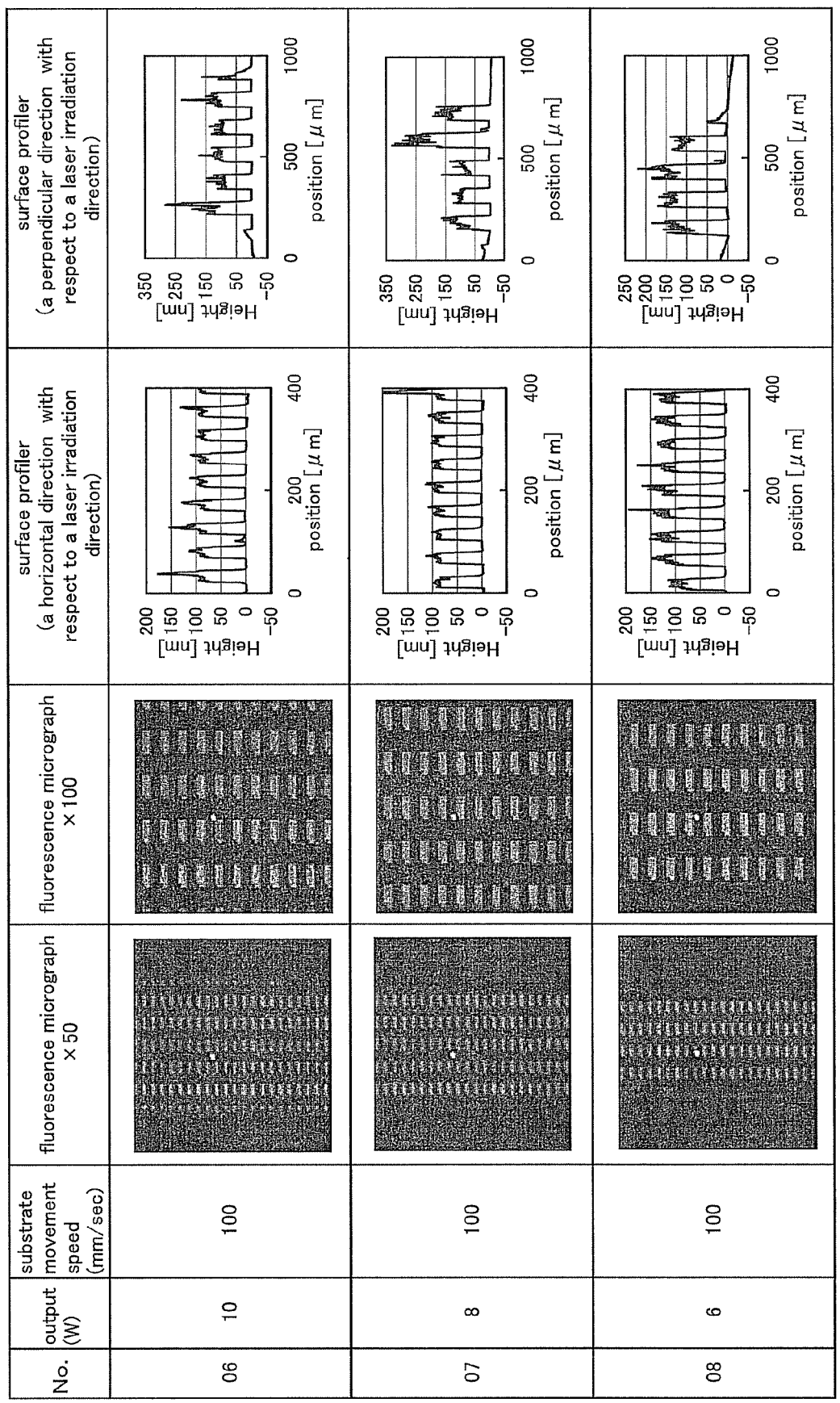
FIG. 24 is a view showing measurement results of Embodiment.
Figure 25:
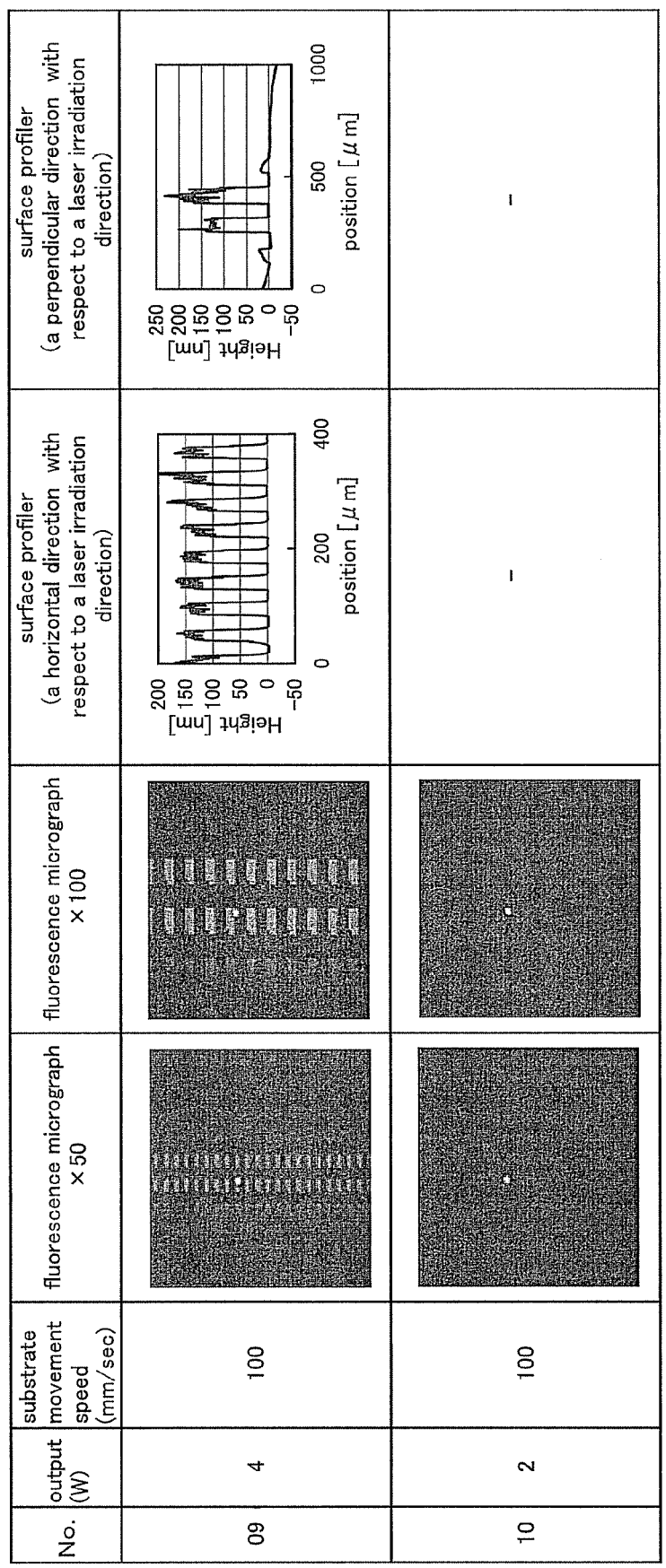
FIG. 25 is a view showing measurement results of Embodiment.
Figure 26:
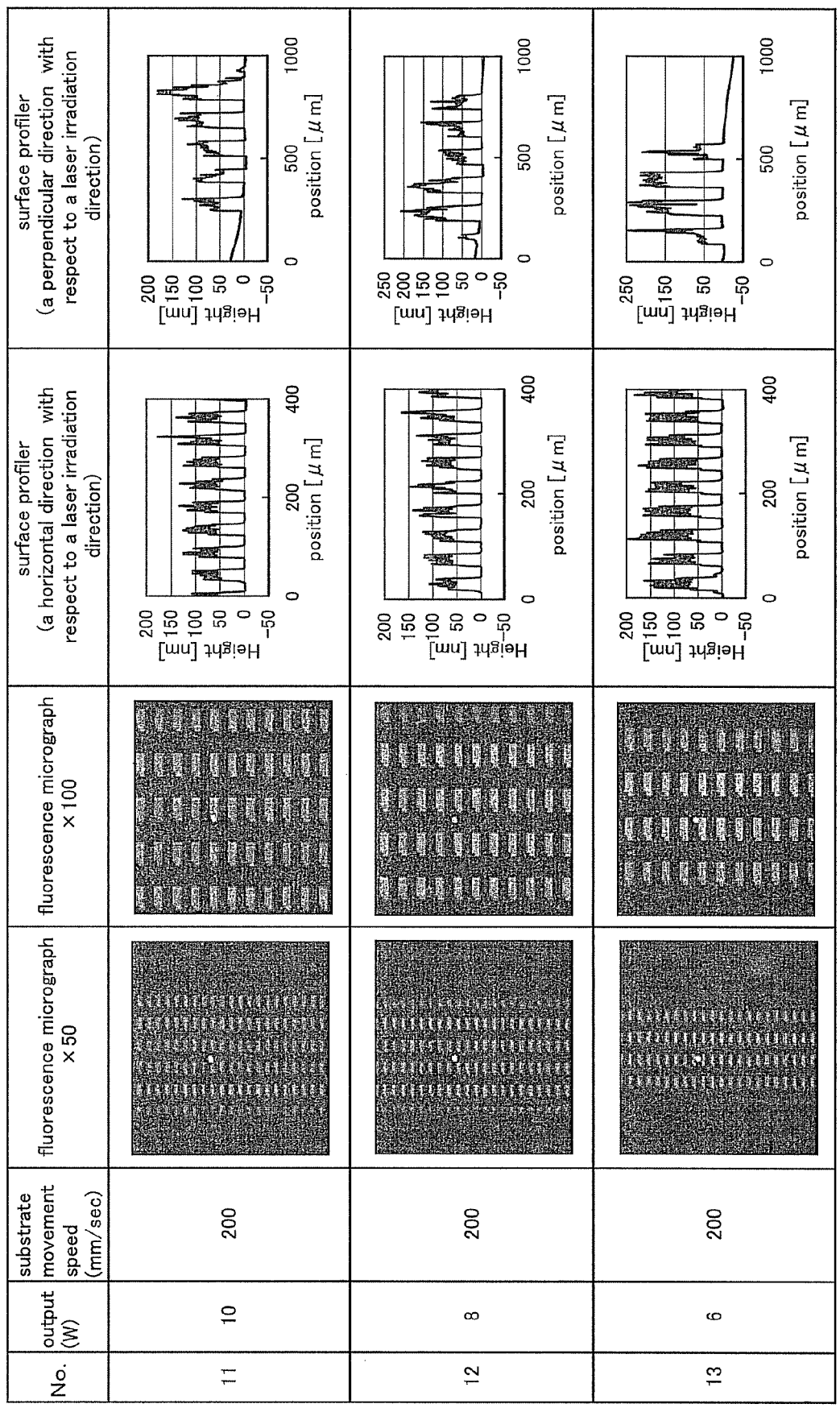
FIG. 26 is a view showing measurement results of Embodiment.
Figure 27:
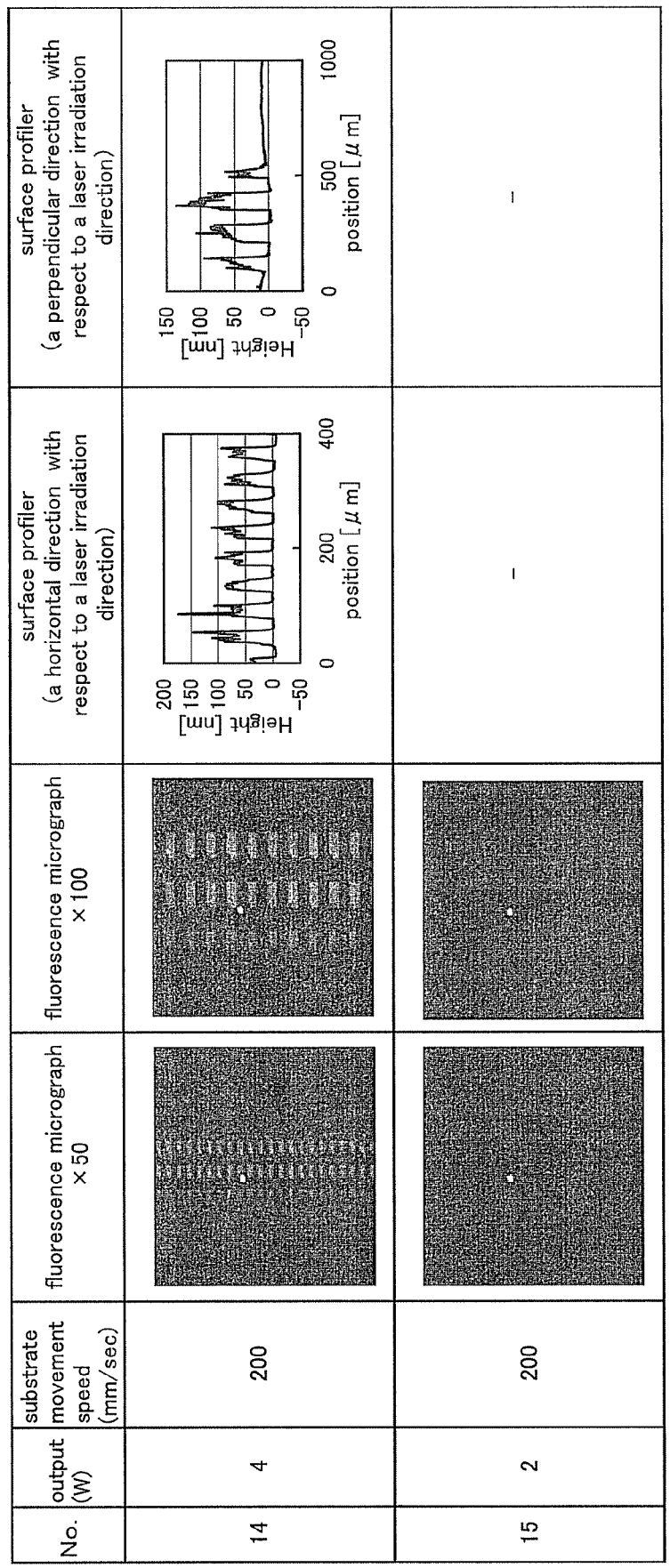
FIG. 27 is a view showing measurement results of Embodiment.

FIG. 17B illustrates a structure of a deposition substrate B. First, silicon oxynitride was formed, as a base film 3114, to have a thickness of 100 nm over a glass substrate 3101 (thickness: 0.7 mm).

Aluminum (Al) was formed, as a reflective layer 3102, to have a thickness of 300 nm over the base film 3114. Then, silicon oxide was formed, as a heat-insulating layer 3103, to have a thickness of 600 nm over the reflective layer 3102. After that, an opening 3106 was formed in the heat-insulating layer 3103 and the reflective layer 3102 by etching. As illustrated in FIG. 17C, the size of the opening 3106 was set 21.5 µm×72 µm. Then, titanium (Ti) was formed, as a light-absorbing layer 3104, to have a thickness of 200 nm. After that, tris(8-quinolinolato)aluminum(III) (Alq) was formed, as a material layer 3105, to have a thickness of 50 nm over the light-absorbing layer 3104. Accordingly, the deposition substrate B was manufactured.

A surface of the manufactured deposition substrate over which the material layer was formed and a deposition target surface of a deposition target substrate (thickness: 0.7 mm) which is a deposition target substrate were made to face each other, and subjected to vacuum sealing using a sealing material at a degree of vacuum of 1 Pa.

Then, laser light irradiation was performed from the glass substrate side, which is a deposition substrate. As the irradiation laser light, a continuous-wave (CW) oscillation laser, a pulse laser of low repetition rate, and a pulse laser of high repetition rate were used. The wavelengths of these lasers were all 532 nm. The characteristics of the lasers used for irradiation are shown in Table 1.

TABLE 1

| | Type of laser | | |
|---|---|---|---|
| | Continuous-wave laser | Pulse laser of low repetition rate | Pulse laser of high repetition rate |
| Wavelength | 532 nm | 532 nm | 532 nm |
| Repetition rate | — | 100000 [Hz] | 80000000 [Hz] |
| Pulse width | — | 70 [nsec] | 20-30 [psec] |
| Size of laser spot | 45 [µm] × 900 [µm] | 20 [µm] × 700 [µm] | 10 [µm] × 1000 [µm] |

In addition, in each measurement, after the deposition substrate was irradiated with the laser light, the deposition target substrate was observed with a fluorescence microscope (SU48901, manufactured by Ryokosha Co., Ltd.). Moreover, the surface of the deposition target substrate was observed with a surface profiler (DEKTAK V200Si, manufactured by Ulvac, Inc.). The results are shown in FIG. 18 to FIG. 29. Specifically, the results from irradiation of the deposition substrate A with a pulse laser of high repetition rate are shown in FIG. 18 to FIG. 21. Further, the results from irradiation of the deposition substrate A with a pulse laser of low repetition rate are shown in FIG. 22 to FIG. 27. Further, the results from irradiation of the deposition substrate B with a continuous-wave laser are shown in FIG. 28 and FIG. 29.

As shown in FIG. 22 to FIG. 27, it is found that, in the case of the irradiation with the pulse laser of low repetition rate, the thickness of a film deposited over the deposition target substrate is thicker than that of the material layer. This means that not the material layer but the material layer and the light-absorbing layer were deposited. However, when the laser output is reduced, the material is not heated and not deposited. In addition, it is also found that the thickness of the deposited film is not uniform.

Further, as shown in FIG. 28 and FIG. 29, in the case of the irradiation with the continuous-wave laser, a film with a favorable pattern could not obtained; for example a film was formed over the entire surface of the deposition target substrate. Moreover, even in the case where the pattern was obtained, deformation of the pattern occurred.

On the other hand, as can be seen from FIG. 18 to FIG. 21, in the case of the irradiation with the pulse laser of high repetition rate, relatively favorable deposition could be performed even when the laser output and the substrate movement speed were changed. That is, a margin at the time of deposition is wide and the pulse laser of high repetition rate is suitable for mass production.

Figure 30:
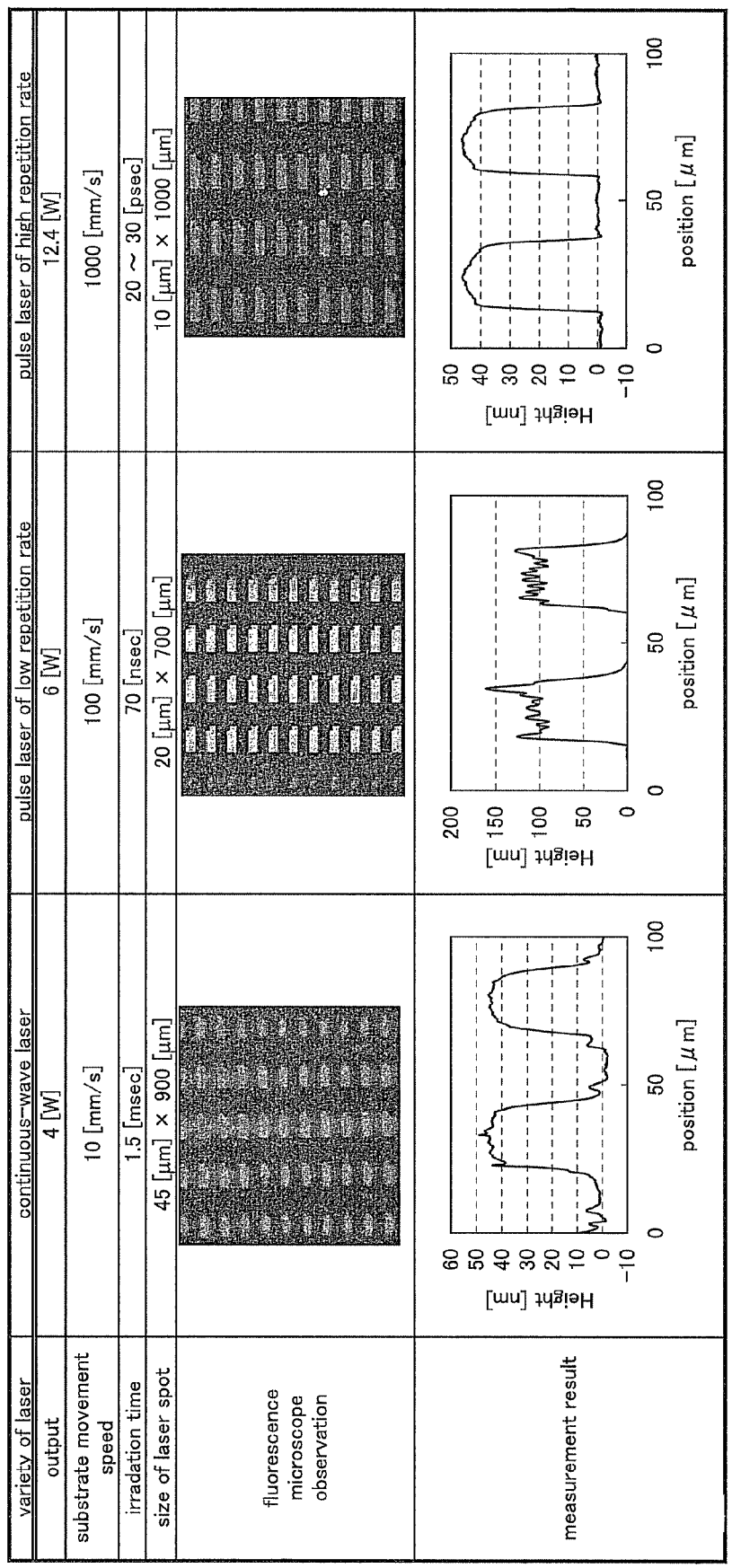
FIG. 30 is a view showing measurement results of Embodiment.

FIG. 30 shows the conditions and measurement results when the favorable films were obtained with use of the continuous-wave laser, the pulse laser of low repetition rate, and the pulse laser of high repetition rate. Note that the favorable film was obtained under wide range of conditions in the case of using the pulse laser of high repetition rate. Thus, as an example, the case of an output of 12.4 W and a substrate movement speed of 1000 mm/s is shown.

As can be seen from FIG. 30, in the case of using the pulse laser of low repetition rate, a film with a thickness of greater than or equal to 50 nm, which is the thickness of the material layer, is deposited over the deposition target substrate. It is thought that this is because Ti, which is the light-absorbing layer, is also deposited. Further, in the case of using the pulse laser of low repetition rate, a stripe pattern due to the pulse laser is observed, and the deposited film has unevenness and poor planarity. It is thought that this occurred because, in the case of the pulse laser of low repetition rate, a time interval between pulses is large and the energy of laser light of one pulse is high.

In the case of using the continuous-wave laser, the film was deposited over a region of the deposition target substrate, which is slightly larger than the opening of the reflective layer. In other words, deformation of a deposition pattern occurred. It is though that when the continuous-wave laser was used, the time for which the deposition substrate was irradiated with the laser light was long; thus, heat was diffused to a region other than a desired region, and the deformation occurred.

In the case of using the pulse laser of high repetition rate, deformation was suppressed and a favorable deposition pattern was obtained. Thus, when laser light whose repetition rate is greater than or equal to 10 MHz and pulse width is greater than or equal to 100 fs and less than or equal to 10 ns is used as the pulse laser of high repetition rate, a film can be deposited into a desired shape with high accuracy.

Further, a higher output can be obtained in the case of using the pulse laser of high repetition rate than in the case of using the continuous-wave laser. Thus, an area to be processed per unit time can be increased, and thus time taken for deposition (takt time) can be shortened. Accordingly, the pulse laser of high repetition rate enables increase in productivity and is suitable for mass production.

<Calculation>

Figure 31:
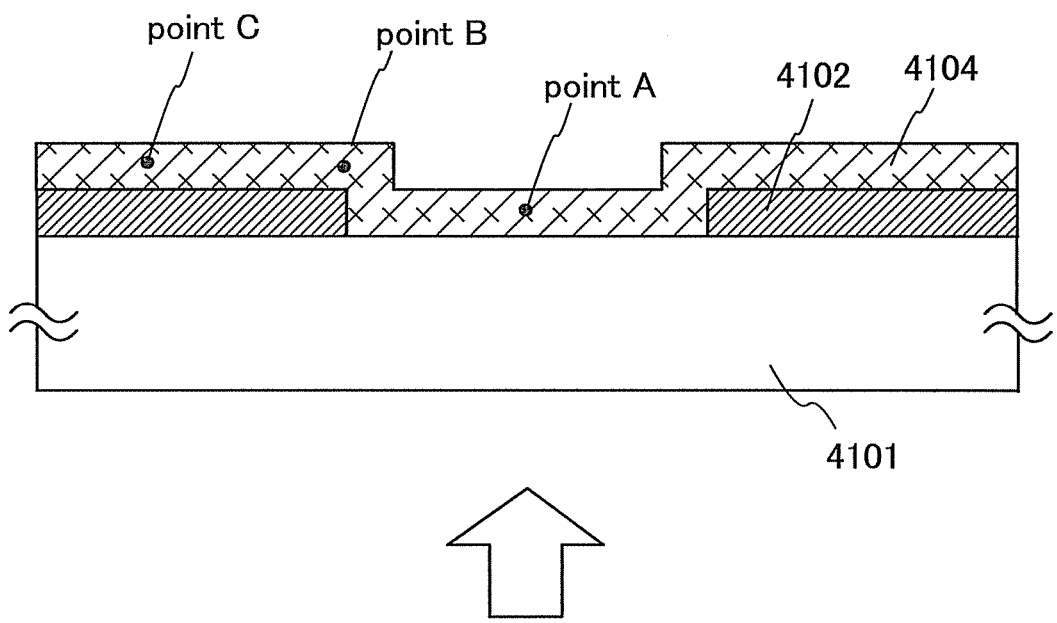
FIG. 31 is a view showing a calculation model of Embodiment.

Moreover, calculation was performed on thermal conduction under the laser irradiation conditions shown in FIG. 30. The calculation conditions are as follows:
Calculation tool: ANSYS
Mesh to be used: triangular linear element free mesh
Minimum mesh length: 0.08 μm
Nonlinear analysis (Newton's method) was used because thermal conduction depends on temperature.
Tolerance for nonlinear convergence: L2 norm, less than or equal to $1.0\ e^{-4}$
Time interval in nonstationary analysis:
CW laser: 0.5 μs
Pulse laser: 1.5 ns at the time of pulse irradiation, 0.25 μs at the time of non pulse irradiation
Mega laser: 5 ps at the time of pulse irradiation, 25 ns at the time of non pulse irradiation A two-dimensional model in which over a glass substrate 4101 (0.7 mm), aluminum (Al) was stacked, as a reflective layer 4102, to have a thickness of 200 nm and titanium (Ti) was stacked, as a light-absorbing layer 4104, to have a thickness of 200 nm was employed as a calculation model. FIG. 31 illustrates the calculation model. In addition, Table 2 shows characteristics of each laser for consideration of calorific value. Thermal conversion in the light-absorbing layer was calculated by conversion of laser energy into a calorific value by use of the values shown in Table 2.

TABLE 2

|  | Continuous-wave laser | Pulse laser of low repetition rate | Pulse laser of high repetition rate |
| --- | --- | --- | --- |
| Intensity [W] | 4.0 | 6.0 | 12.4 |
| Substrate speed [m/s] | $1.0 \times 10^{-2}$ | $1.0 \times 10^{-1}$ | 1.0 |
| Irradiation area [m²] | $4.1 \times 10^{-8}$ | $1.4 \times 10^{-8}$ | $1.0 \times 10^{-8}$ |
| Irradiation width (Irradiation direction) [m] | $4.5 \times 10^{-5}$ | $2.0 \times 10^{-5}$ | $1.0 \times 10^{-5}$ |
| Unit area intensity [W/m²] | $9.88 \times 10^{7}$ | $4.27 \times 10^{8}$ | $1.24 \times 10^{9}$ |
| Irradiation (passing) time [s] | $4.5 \times 10^{-3}$ | $2.0 \times 10^{-4}$ | $1.0 \times 10^{-5}$ |
| The number of irradiation during passing | — | 20 | 800 |
| Irradiation energy during passing [J/m²] | $4.44 \times 10^{5}$ | $8.57 \times 10^{4}$ | $1.24 \times 10^{4}$ |
| Repetition Rate [Hz] | — | $1.0 \times 10^{5}$ | $8.0 \times 10^{7}$ |
| Pulse irradiation time [s] | — | $7.0 \times 10^{-8}$ | $2.0 \times 10^{-11}$ |
| 1 pulse intensity [W/m²] | — | $6.12 \times 10^{10}$ | $7.75 \times 10^{11}$ |
| 1 pulse energy [J/m²] | — | $4.39 \times 10^{3}$ | $1.55 \times 10^{1}$ |

In the case where a thin film formed from the glass (thickness: 0.7 mm) and Ti (thickness: 200 nm) was irradiated with a laser beam having a wavelength of 532 nm, a result that 64.96% of the laser energy was absorbed was obtained by a MATRIX method which is one of optical calculation methods. If all of the absorbed laser energy is converted into a calorific value, the following expression is obtained:

Calorific value per unit time=(laser energy per unit time)×0.6496

The calorific value was distributed uniformly in the volume over a region of titanium generating heat by laser irradiation. Table 3 shows the parameters used for the calculation. The conditions shown in Table 2 were used. The initial temperature was 27° C., which was uniform, and the boundary conditions were all insulation conditions. For calculation convergence, the lowest point of the glass substrate was fixed to 27° C.

TABLE 3

| Al | | | | | |
| --- | --- | --- | --- | --- | --- |
| Temperature [° C.] | 25.15 | 127 | 227 | 327 | 527 |
| Specific heat [J/gK] | 0.5227 | 0.5542 | 0.5733 | 0.5904 | 0.632 |
| Temperature [° C.] | 27 | 127 | 427 | | |
| Thermal conductivity [J/smK] | 21.9 | 20.4 | 19.4 | | |
| Temperature [° C.] | 27 | 2000 | | | |
| Density [g/m³] | 4.51E+06 | 4.51E+06 | | | |

| Ti (TiN) | | | | | | |
| --- | --- | --- | --- | --- | --- | --- |
| Temperature [° C.] | 25.15 | 127 | 227 | 327 | 527 | 727 |
| Specific heat [J/gK] | 0.5993 | 0.7081 | 0.7606 | 0.7875 | 0.8182 | 0.8429 |
| Temperature [° C.] | 25 | 127 | 200 | 650 | 1000 | |

TABLE 3-continued

| | | | | | | |
|---|---|---|---|---|---|---|
| Thermal conductivity [J/smK] | 8.84 | 28.83 | 16.72 | 11.29 | 8.36 | |
| Temperature [° C.] | 27 | 2000 | | | | |
| Density [g/m³] | 5.43E+06 | 5.43E+06 | | | | |

| SiO₂ | | | | | | | |
|---|---|---|---|---|---|---|---|
| Temperature [° C.] | 25 | 100 | 200 | 300 | 400 | 500 | 600 |
| Specific heat [J/gK] | 0.769 | 0.86 | 0.96 | 1.03 | 1.08 | 1.11 | 1.12 |
| Temperature [° C.] | 25 | 300 | 600 | | | | |
| Thermal conductivity [J/smK] | 1.06 | 1.28 | 1.45 | | | | |
| Temperature [° C.] | 25 | 100 | 200 | 300 | 400 | 500 | 600 |
| Density [g/m³] | 2.49E+06 | 2.49E+06 | 2.49E+06 | 2.48E+06 | 2.48E+06 | 2.48E+06 | 2.48E+06 |

<Calculation Results>

Figure 32:
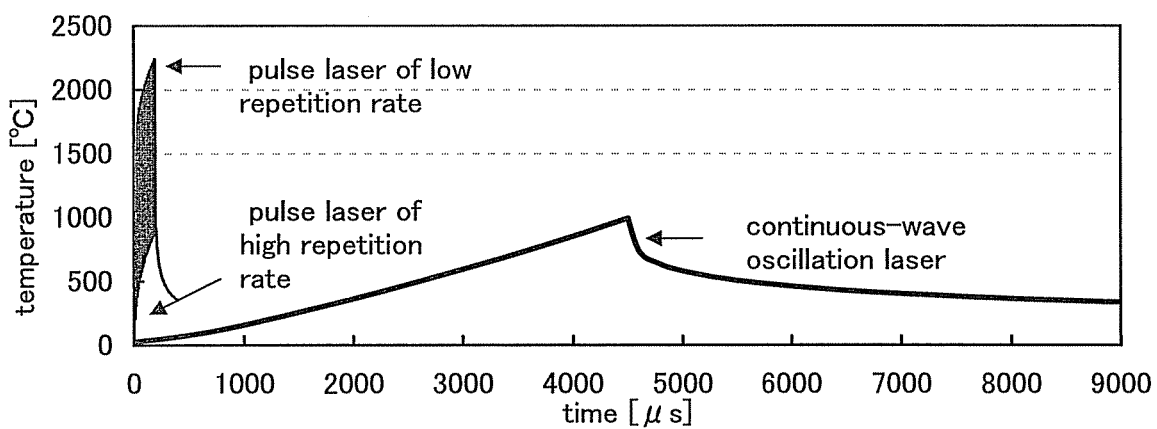
FIG. 32 is a view showing calculation results of Embodiment.
Figure 33:
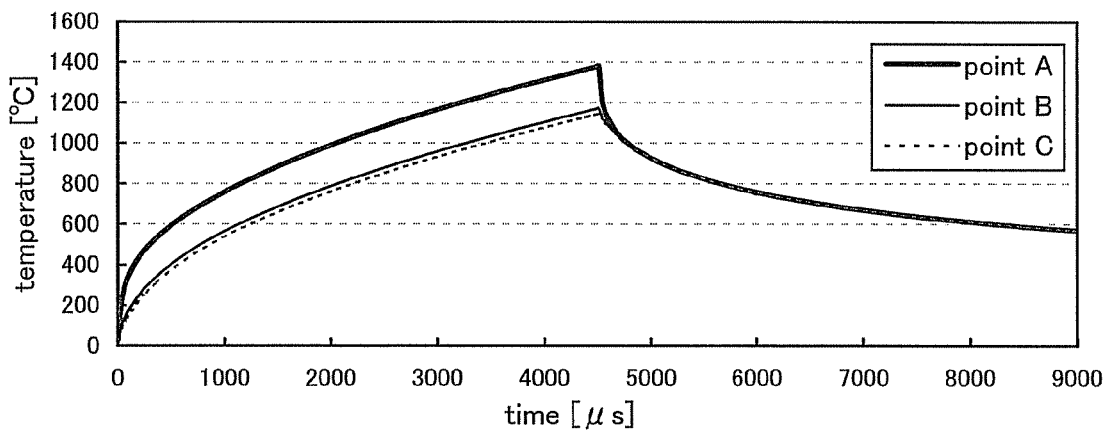
FIG. 33 is a view showing calculation results of Embodiment.
Figure 34:
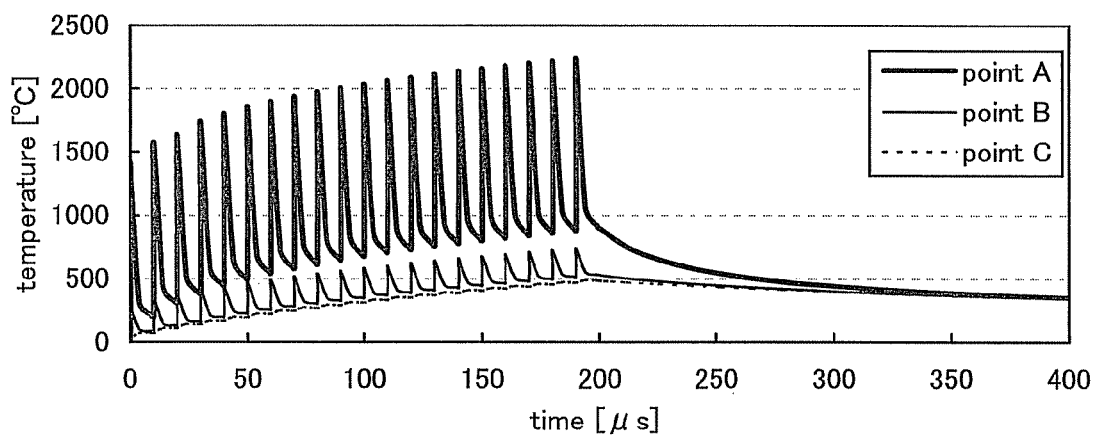
FIG. 34 is a view showing calculation results of Embodiment.
Figure 35:
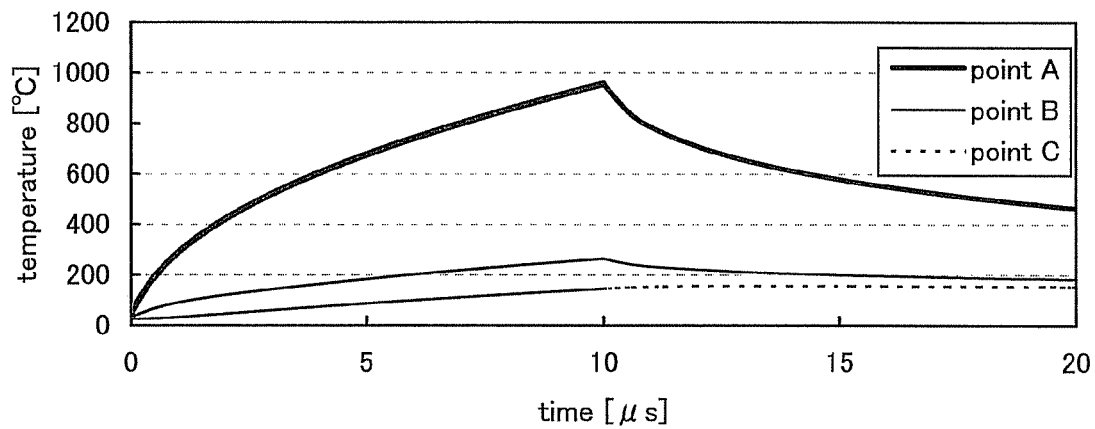
FIG. 35 is a view showing calculation results of Embodiment.

Time until a laser beam finished passing on the above-described model (irradiation time) and the temperature during cooling after that was calculated. Three points A, B, and C were used as temperature reference points. Calculation results are shown in FIG. 32 to FIG. 35. FIG. 33 shows the calculation results in the case of irradiation with the continuous-wave laser for 4500 μs. FIG. 34 shows the calculation results in the case of irradiation with the pulse laser of low repetition rate for 200 μs. FIG. 35 shows calculation results in the case of irradiation with the pulse laser of high repetition rate for 10 μs. FIG. 32 is a graph in which three graphs of FIG. 33 to FIG. 35 are included, temperatures and time scale are compared, and points A showing temperature-time transition of FIG. 33 to FIG. 35 are shown. Note that in FIG. 32, continuous-wave laser is shown as heavy line, pulse laser of low repetition rate is shown as thin line and pulse laser of high repetition rate is shown as dotted line. The computation time is twice as long as the laser passing time.

Considering thermal conduction, it can be considered that a big difference between point A and either point B or point C is better in order to improve accuracy of pattern formation. From the results shown in FIG. 33, FIG. 34, and FIG. 35, the pulse laser of high repetition rate meets the condition. This is apparent from the experimental results.

Figure 36:
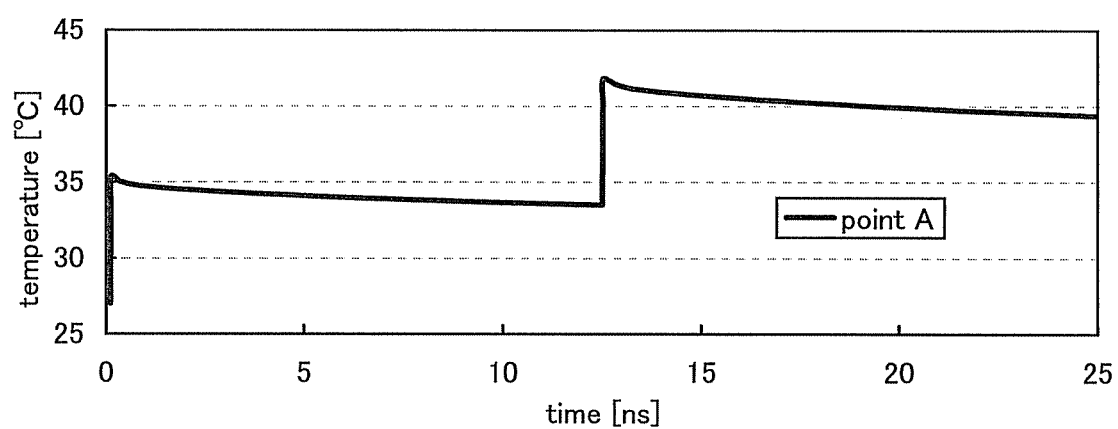
FIG. 36 is a view showing calculation results of Embodiment.

Further, in the case where the pulse laser of low repetition rate and the pulse laser of high repetition rate are compared, it is found that the temperature of titanium at a portion where heat is generated is gradually increased because they are pulse lasers (FIG. 36 shows an enlarged part of FIG. 35).

The difference in characteristics between these two lasers is described below. According to Table 1, 20 irradiation times were needed until the pulse laser of low repetition rate finished passing, while 800 irradiation times were needed until the pulse laser of high repetition rate finished passing. In addition, energy given by one pulse of the pulse laser of low repetition rate was 4390 [J/m²], while that of the pulse laser of high repetition rate was 15.5 [J/m²]. This means that the pulse laser of high repetition rate gives low energy little by little, while the pulse laser of low repetition rate gives high energy collectively. Thus, increase in temperature per pulse is higher and pulse interval is longer in the case of the pulse laser of low repetition rate than in the case of the pulse laser of high repetition rate; accordingly, the result of the pulse laser of low repetition rate in which the amplitude of the temperature change is large is obtained (FIG. 34).

For this reason, it can be considered that poor flatness in the case of the irradiation with the pulse laser of low repetition rate results from the rapid temperature change. Further, the rapid increase in temperature could narrow the margin in a deposition process, and the experimental result shows that it is difficult to process without evaporating titanium which is the light-absorbing layer.

Next, considering the continuous-wave laser and the pulse laser of high repetition rate, as for the experiment shown in FIG. 30 or the like, the result in which a film tends to be deposited over the entire surface in the case of using the continuous-wave laser is obtained. It is considered that this is because the difference in temperature between point A and point B is small, which is shown by the result obtained by the calculator, and a material layer which is in contact with point B is also deposited. That is, it is expected that a region larger than a desired shape is deposited and accuracy of pattern formation is poor.

Accordingly, it is found that the use of the pulse laser of high repetition rate males it possible to deposit a film over only a desired region at high accuracy.

This application is based on Japanese Patent Application serial No. 2008-024606 filed with Japan Patent Office on Feb. 4, 2008, the entire contents of which are hereby incorporated by reference.

The invention claimed is:

1. A deposition method comprising the steps of:
    forming a reflective layer having an opening over a surface of a first substrate;
    forming a light-absorbing layer over the surface of the first substrate;
    forming a material layer in contact with the light-absorbing layer over the surface of the first substrate after forming the light-absorbing layer;
    disposing the surface of the first substrate and a surface of a second substrate so as to face each other; and
    depositing a part of the material layer over the surface of the second substrate by irradiating a portion of the light-absorbing layer with laser light from the other surface side of the first substrate through the opening of the reflective layer,
    wherein the laser light has a repetition rate of greater than or equal to 10 MHz and pulse width of greater than or equal to 100 fs and less than or equal to 10 ns, and
    wherein a width of the opening is smaller than a width of the light-absorbing layer irradiated with the laser light.

2. The deposition method according to claim 1, wherein the reflective layer has a reflectance of greater than or equal to 85% with respect to the laser light.

3. The deposition method according to claim 1, wherein the reflective layer comprises any of aluminum, silver, gold, platinum, copper, indium tin oxide, an alloy including aluminum, and an alloy including silver.

4. The deposition method according to claim 1, wherein the light-absorbing layer has a reflectance of less than or equal to 70% with respect to the laser light.

5. The deposition method according to claim 1, wherein a thickness of the light-absorbing layer is greater than or equal to 10 nm and less than or equal to 600 nm.

6. The deposition method according to claim 1, wherein the light-absorbing layer comprises any of metal nitride, metal, and carbon.

7. The deposition method according to claim 1, wherein the light-absorbing layer is formed into an island shape at a position overlapping with the opening of the reflective layer.

8. The deposition method according to claim 1, wherein the light-absorbing layer is formed in stripes at a position overlapping with the opening of the reflective layer.

9. The deposition method according to claim 1, wherein the material layer is formed by a wet process.

10. The deposition method according to claim 1, wherein the material layer comprises an organic compound.

11. The deposition method according to claim 1, wherein the laser light is shaped into linear laser light.

12. A method for manufacturing a light-emitting device using the deposition method according to claim 1,
wherein a part of the material layer is deposited over a first electrode formed over the surface of the second substrate.

13. The method for manufacturing a light-emitting device according to claim 12, wherein the material layer comprises one or both of a light-emitting material and a carrier-transporting material.

14. A deposition method comprising the steps of:
forming a reflective layer having an opening over a surface of a first substrate;
forming a heat-insulating layer having a light-transmitting property in contact with the reflective layer over the surface of the first substrate;
forming a light-absorbing layer in contact with the heat-insulating layer over the surface of the first substrate;
forming a material layer in contact with the light-absorbing layer over the surface of the first substrate after forming the light-absorbing layer;
disposing the surface of the first substrate and a surface of a second substrate so as to face each other; and
depositing a part of the material layer over the surface of the second substrate by irradiating a portion of the light-absorbing layer with laser light from the other surface side of the first substrate through the opening of the reflective layer,
wherein the laser light has a repetition rate of greater than or equal to 10 MHz and pulse width of greater than or equal to 100 fs and less than or equal to 10 ns, and
wherein a width of the opening is smaller than a width of the light-absorbing layer irradiated with the laser light.

15. The deposition method according to claim 14, wherein the heat-insulating layer has a transmittance of greater than or equal to 60% with respect to the laser light, and a thermal conductivity of a material used for the heat-insulating layer is lower than that of a material used for the reflective layer and the light-absorbing layer.

16. The deposition method according to claim 14, wherein the heat-insulating layer comprises any of titanium oxide, silicon oxide, silicon nitride oxide, zirconium oxide, and silicon carbide.

17. The deposition method according to claim 14, wherein a thickness of the heat-insulating layer is greater than or equal to 10 nm and less than or equal to 2 μm.

18. The deposition method according to claim 14, wherein the reflective layer has a reflectance of greater than or equal to 85% with respect to the laser light.

19. The deposition method according to claim 14, wherein the reflective layer comprises any of aluminum, silver, gold, platinum, copper, indium tin oxide, an alloy including aluminum, and an alloy including silver.

20. The deposition method according to claim 14, wherein the light-absorbing layer has a reflectance of less than or equal to 70% with respect to the laser light.

21. The deposition method according to claim 14, wherein a thickness of the light-absorbing layer is greater than or equal to 10 nm and less than or equal to 600 nm.

22. The deposition method according to claim 14, wherein the light-absorbing layer comprises any of metal nitride, metal, and carbon.

23. The deposition method according to claim 14, wherein the light-absorbing layer is formed into an island shape at a position overlapping with the opening of the reflective layer.

24. The deposition method according to claim 14, wherein the light-absorbing layer is formed in stripes at a position overlapping with the opening of the reflective layer.

25. The deposition method according to claim 14, wherein the material layer is formed by a wet process.

26. The deposition method according to claim 14, wherein the material layer comprises an organic compound.

27. The deposition method according to claim 14, wherein the laser light is shaped into linear laser light.

28. A method for manufacturing a light-emitting device using the deposition method according to claim 14,
wherein a part of the material layer is deposited over a first electrode formed over the surface of the second substrate.

29. The method for manufacturing a light-emitting device according to claim 28, wherein the material layer comprises one or both of a light-emitting material and a carrier-transporting material.

30. A deposition method comprising the steps of:
forming a reflective layer having a plurality of openings over a surface of a first substrate;
forming a heat-insulating layer having a light-transmitting property in contact with the reflective layer over the surface of the first substrate;
forming a light-absorbing layer in contact with the heat-insulating layer over the surface of the first substrate;
forming a material layer in contact with the light-absorbing layer over the surface of the first substrate after forming the light-absorbing layer;
disposing the surface of the first substrate and a surface of a second substrate so as to face each other; and
depositing a part of the material layer over the surface of the second substrate by irradiating a portion of the light-absorbing layer with laser light from the other surface side of the first substrate through one of the openings of the reflective layer, so that a plurality of laser spots are arranged in a zigzag manner on an irradiation surface,
wherein the laser light has a repetition rate of greater than or equal to 10 MHz and pulse width of greater than or equal to 100 fs and less than or equal to 10 ns,
wherein the laser light is scanned in a direction perpendicular to a direction in which the laser spots are arranged in a zigzag manner,
wherein the light-absorbing layer has irradiated regions which correspond to each of the openings; and
wherein individual widths of the openings are smaller than individual widths of the irradiated regions.

31. The deposition method according to claim 30, wherein the heat-insulating layer has a transmittance of greater than or equal to 60% with respect to the laser light, and a thermal conductivity of a material used for the heat-insulating layer is lower than that of a material used for the reflective layer and the light-absorbing layer.

32. The deposition method according to claim 30, wherein the heat-insulating layer comprises any of titanium oxide, silicon oxide, silicon nitride oxide, zirconium oxide, and silicon carbide.

33. The deposition method according to claim 30, wherein a thickness of the heat-insulating layer is greater than or equal to 10 nm and less than or equal to 2 µm.

34. The deposition method according to claim 30, wherein the reflective layer has a reflectance of greater than or equal to 85% with respect to the laser light.

35. The deposition method according to claim 30, wherein the reflective layer comprises any of aluminum, silver, gold, platinum, copper, indium tin oxide, an alloy including aluminum, and an alloy including silver.

36. The deposition method according to claim 30, wherein the light-absorbing layer has a reflectance of less than or equal to 70% with respect to the laser light.

37. The deposition method according to claim 30, wherein a thickness of the light-absorbing layer is greater than or equal to 10 nm and less than or equal to 600 nm.

38. The deposition method according to claim 30, wherein the light-absorbing layer comprises any of metal nitride, metal, and carbon.

39. The deposition method according to claim 30, wherein the light-absorbing layer is formed into an island shape at a position overlapping with one of the openings of the reflective layer.

40. The deposition method according to claim 30, wherein the light-absorbing layer is formed in stripes at a position overlapping with one of the openings of the reflective layer.

41. The deposition method according to claim 30, wherein the material layer is formed by a wet process.

42. The deposition method according to claim 30, wherein the material layer comprises an organic compound.

43. The deposition method according to claim 30, wherein the laser light is shaped into linear laser light.

44. A method for manufacturing a light-emitting device using the deposition method according to claim 30,
wherein a part of the material layer is deposited over a first electrode formed over the surface of the second substrate.

45. The method for manufacturing a light-emitting device according to claim 44, wherein the material layer comprises one or both of a light-emitting material and a carrier-transporting material.

* * * * *

UNITED STATES PATENT AND TRADEMARK OFFICE
CERTIFICATE OF CORRECTION

| | |
|---|---|
| PATENT NO. | : 8,821,963 B2 |
| APPLICATION NO. | : 12/362105 |
| DATED | : September 2, 2014 |
| INVENTOR(S) | : Koichiro Tanaka et al. |

Page 1 of 1

It is certified that error appears in the above-identified patent and that said Letters Patent is hereby corrected as shown below:

In the Specification:

Column 4, Line 65; Change "10 μm" to --10 nm--.

Column 8, Line 8; Change "100 mm," to --100 nm,--.

Column 8, Line 59; Change "absorbance" to --absorptance--.

Column 19, Lines 51 to 52; Change "(talct time)" to --(takt time)--.

Column 24, Line 24; Change "thereof, and" to --thereof; and--.

Column 25, Line 9; Change "([2-(" to --[2-(--.

Column 25, Line 12; Change "Ir(Ppy)$_3$" to --Ir(ppy)$_3$--.

Column 28, Line 6; Change "N,N-diphenyl" to --N,N'-diphenyl--.

Column 29, Line 22; Change "N,N-diphenyl" to --N,N'-diphenyl--.

Column 42, Line 27; Change "males" to --makes--.

Signed and Sealed this
Seventeenth Day of February, 2015

Michelle K. Lee
*Deputy Director of the United States Patent and Trademark Office*